United States Patent [19]

Goegelein et al.

[11] Patent Number: 4,551,837

[45] Date of Patent: Nov. 5, 1985

[54] HIGH SPEED OPERATIONAL RECURRING SIGNATURE EVALUATOR FOR DIGITAL EQUIPMENT TESTER

[75] Inventors: Gerald W. Goegelein, Phoenix; Paul H. Longmore, Chandler; Stan E. Fisher, Phoenix, all of Ariz.

[73] Assignee: International Telephone & Telegraph Corp., New York, N.Y.

[21] Appl. No.: 478,820

[22] Filed: Mar. 25, 1983

[51] Int. Cl.[4] ............................................. G01R 31/28
[52] U.S. Cl. .................... 371/25; 324/73 R; 371/20
[58] Field of Search ................. 371/25, 20, 15; 324/73 R, 73 AT

[56] References Cited

U.S. PATENT DOCUMENTS

| | | | |
|---|---|---|---|
| 4,125,763 | 11/1978 | Drabing et al. | 371/25 X |
| 4,183,459 | 1/1980 | Donn et al. | 371/20 |
| 4,194,113 | 3/1980 | Fulks et al. | 371/20 |
| 4,285,059 | 8/1981 | Burlage et al. | 371/25 |

OTHER PUBLICATIONS

Gordon & Nadig, Hexadecimal Signatures Identify Troublespots in Microprocessor Systems, Electronics, Mar. 3, 1977, pp. 89–96.

Nadig, Testing a Microprocessor Product Using a Signature Analysis, 1978, Semiconductor Test Conference, Cherry Hill, N.J. (31 Oct.–5 Nov. 1978) pp. 159–169.

Rhodes-Burke, Retrofitting for Signature Analysis Simplified, Hewlett-Packard Journal, vol. 33, No. 1, Jan. 1982, pp. 9–16.

Primary Examiner—Charles E. Atkinson
Attorney, Agent, or Firm—T. L. Peterson; E. C. Jason

[57] ABSTRACT

The high speed operational recurring signature evaluation provides digital sub-systems including a data compressor and a controller. These subsystems are employed with a portable service processor (PSP) which is a standard piece of test equipment in this art. The controller interfaces with the host logic tester (PSP) to provide the repetitious detail and complex digital control requirements for programming the data compressor in response to digital instructions received from the logic tester. A unique serial data pattern corresponding to a proper signature from a node under test generated in real time at the relatively high operating speed of the board under test is generated by the data compressor.

22 Claims, 33 Drawing Figures

FIG. 2 DATA COMPRESSOR 10

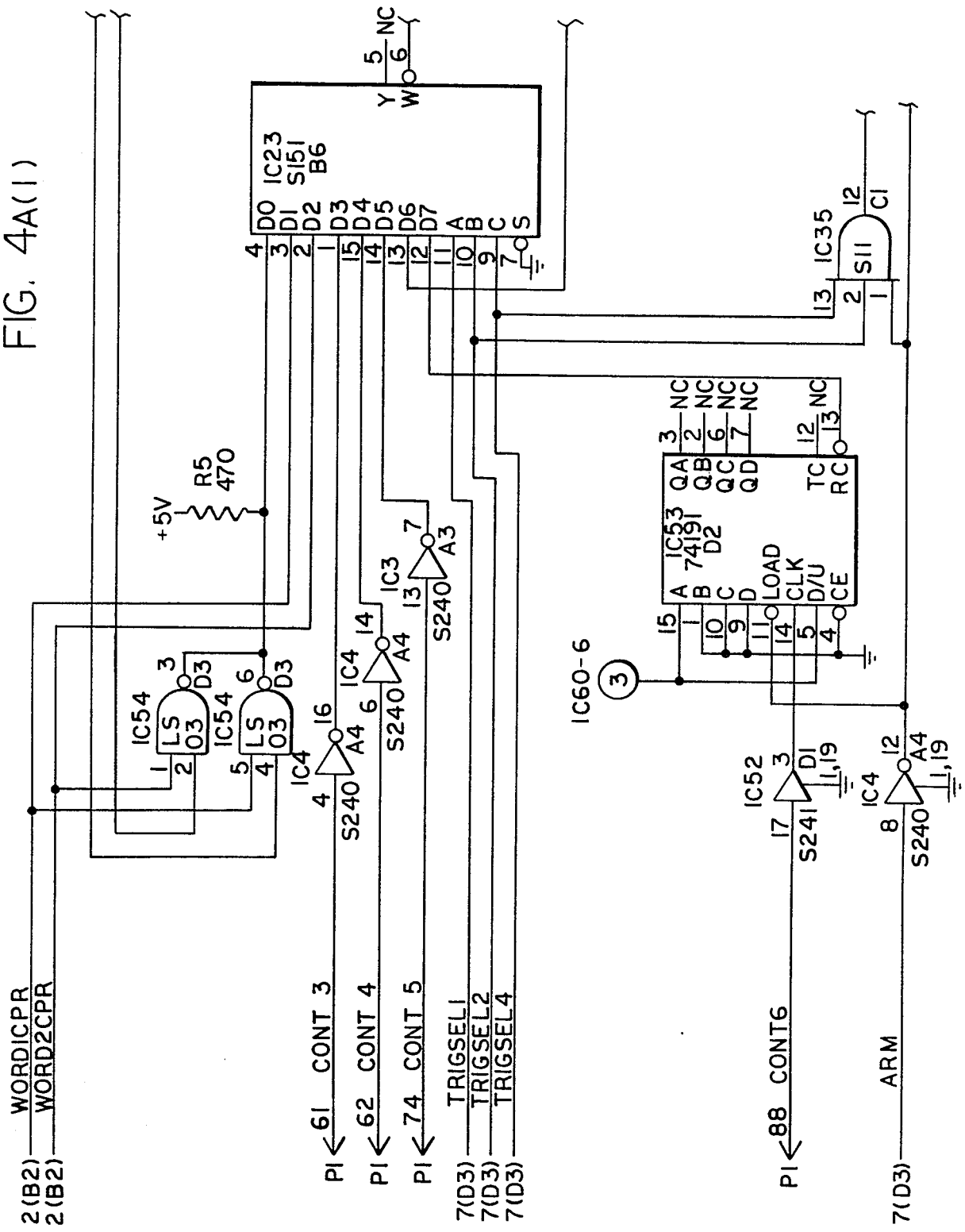

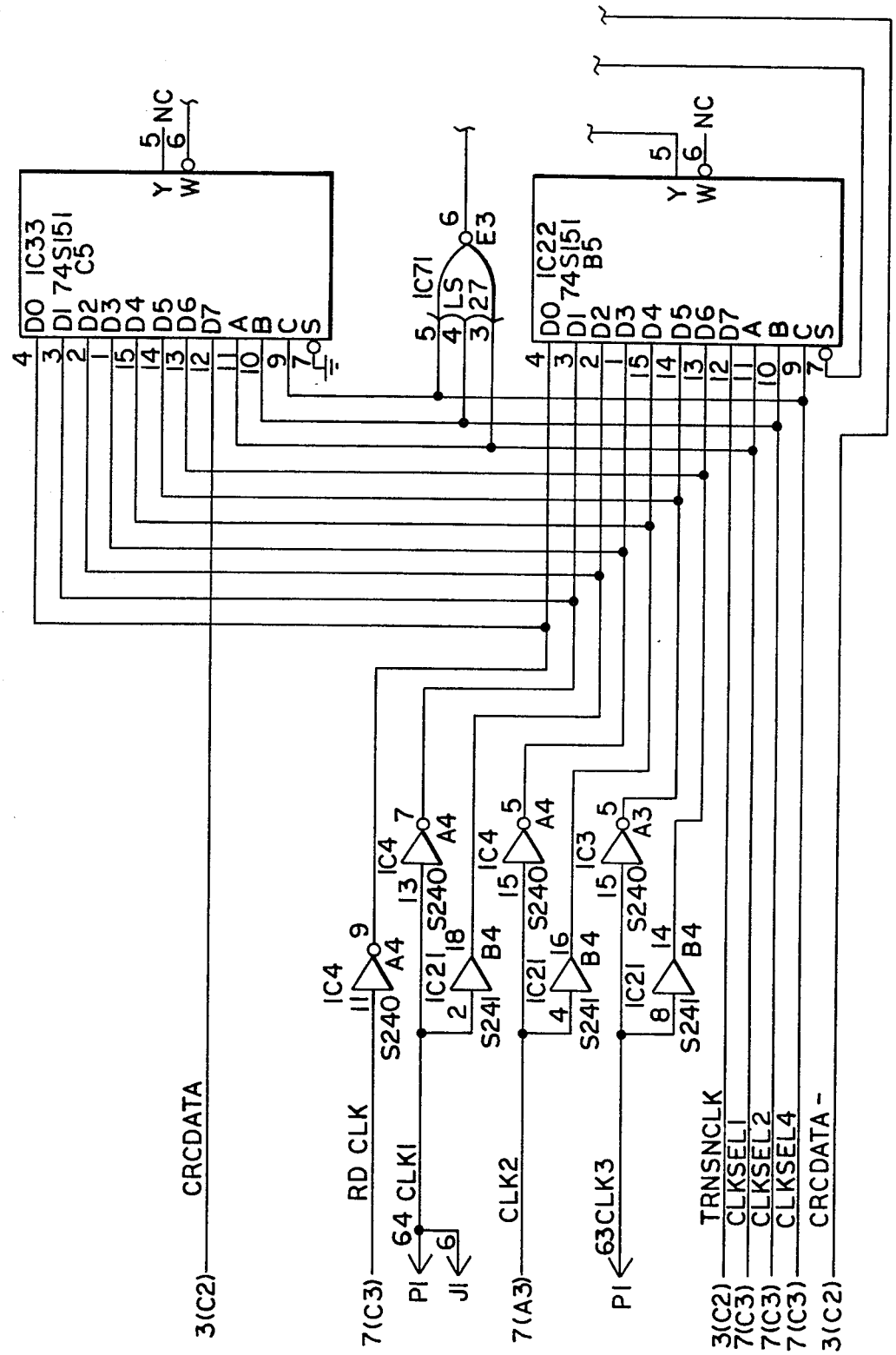
FIG. 4A(2)

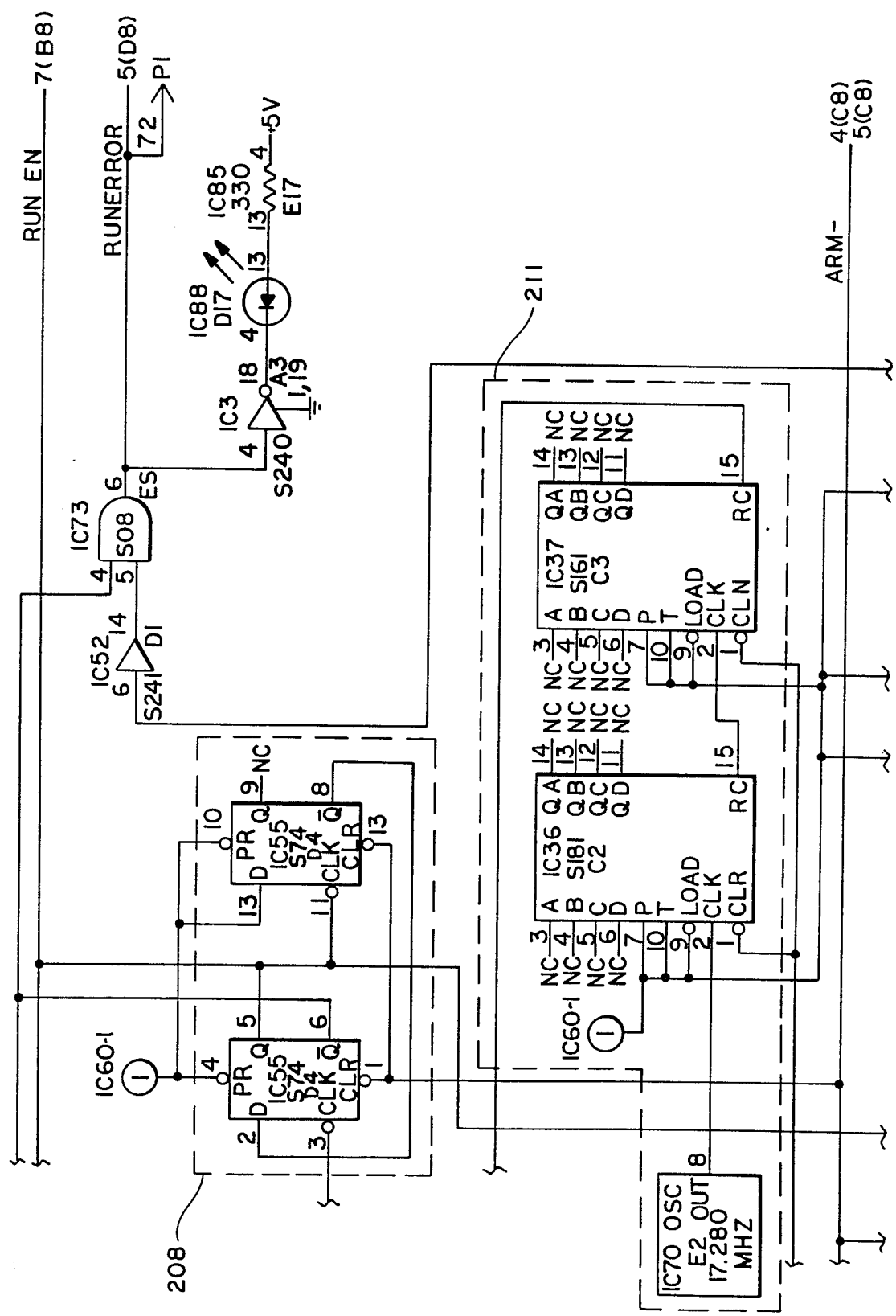
FIG. 4B(1)

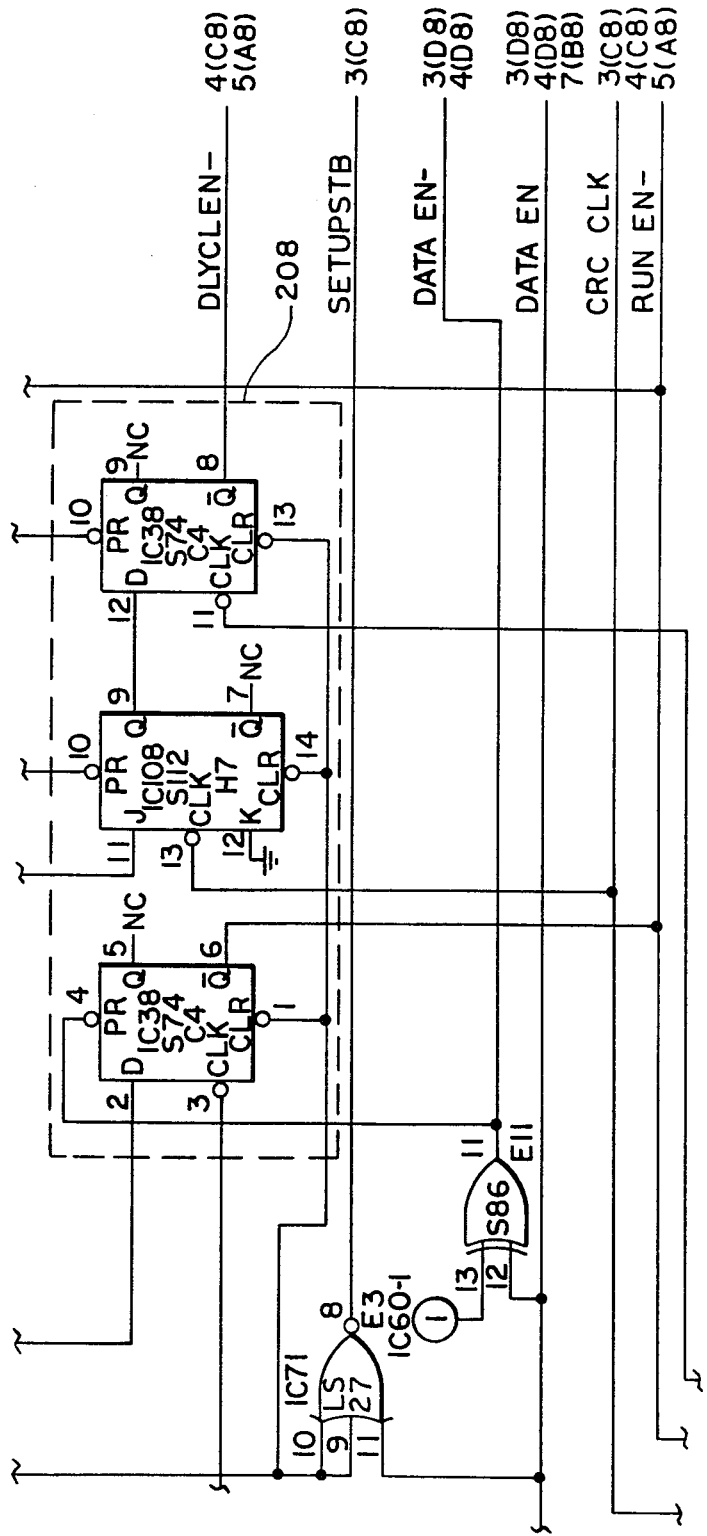
FIG. 4B(2)

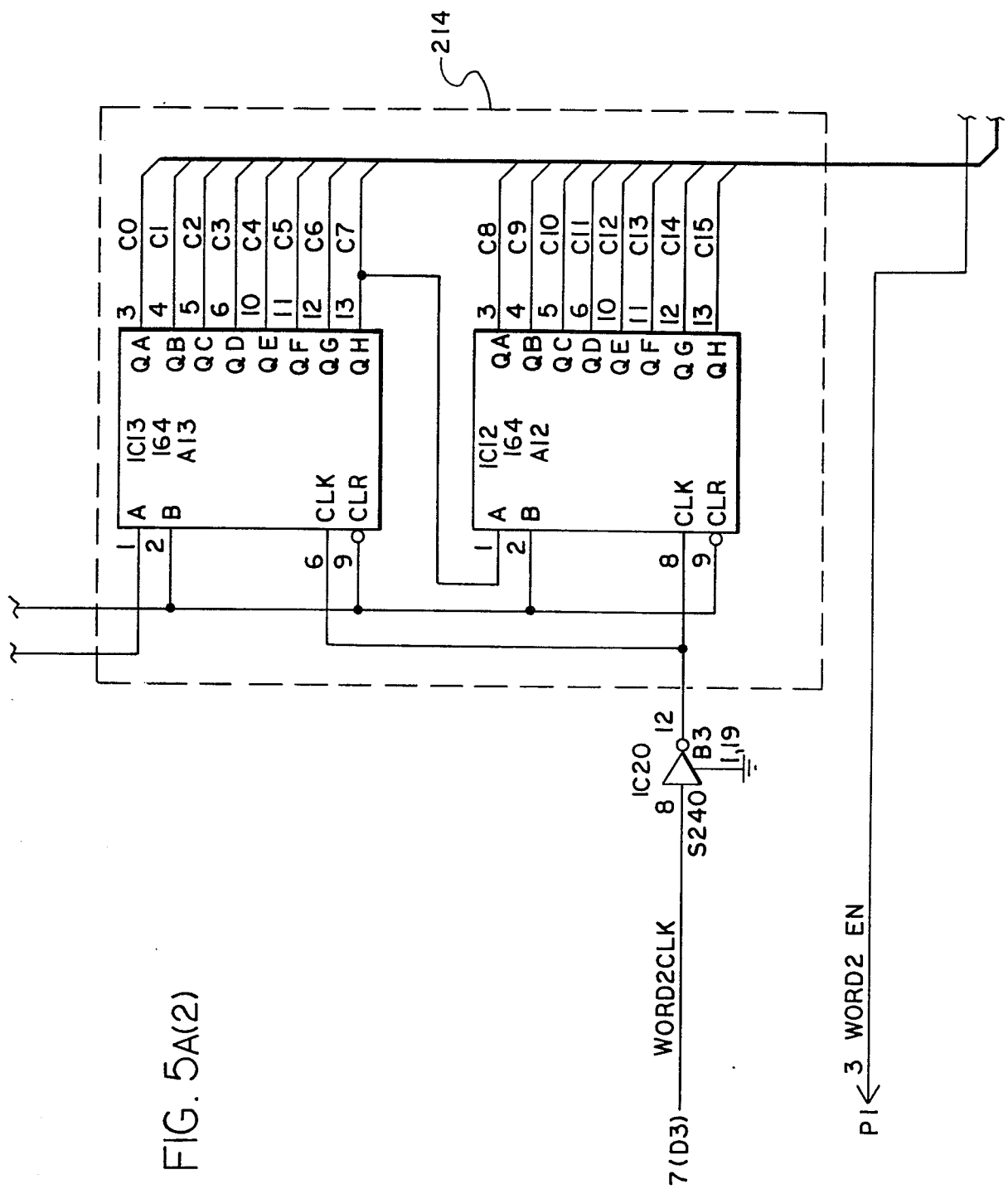
FIG. 5A(2)

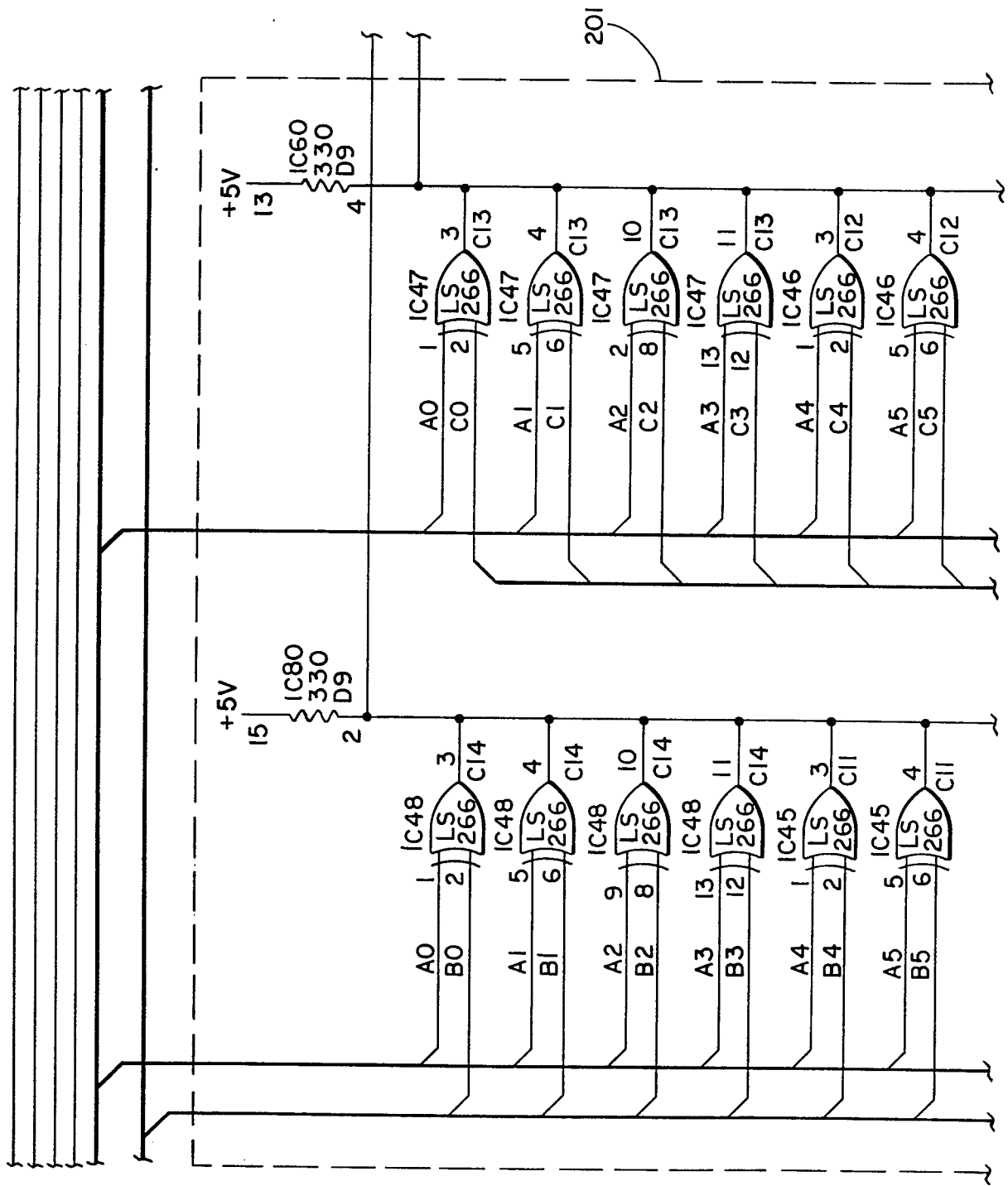
FIG. 5B(1)

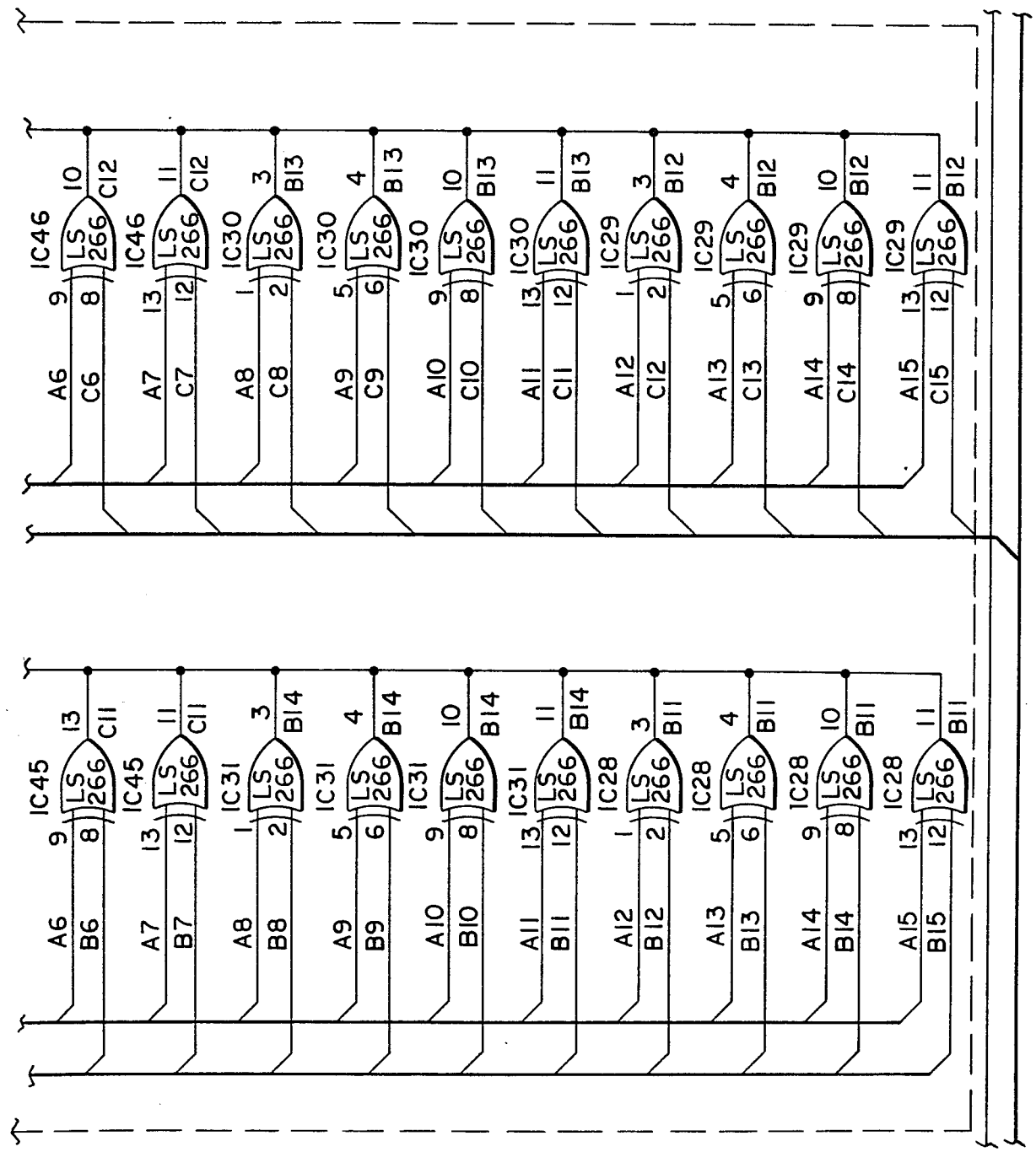
FIG. 5B(2)

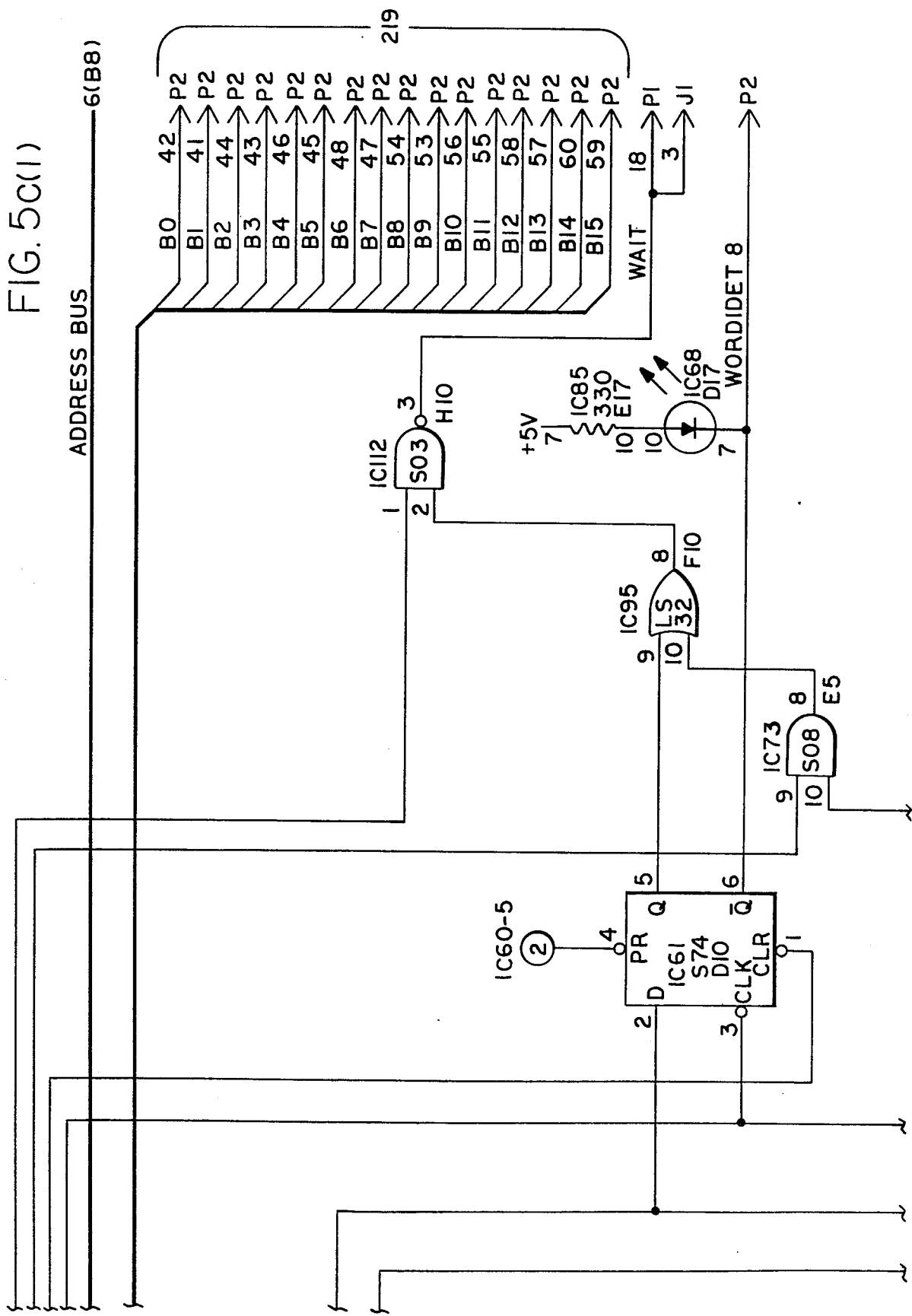
FIG. 5C(1)

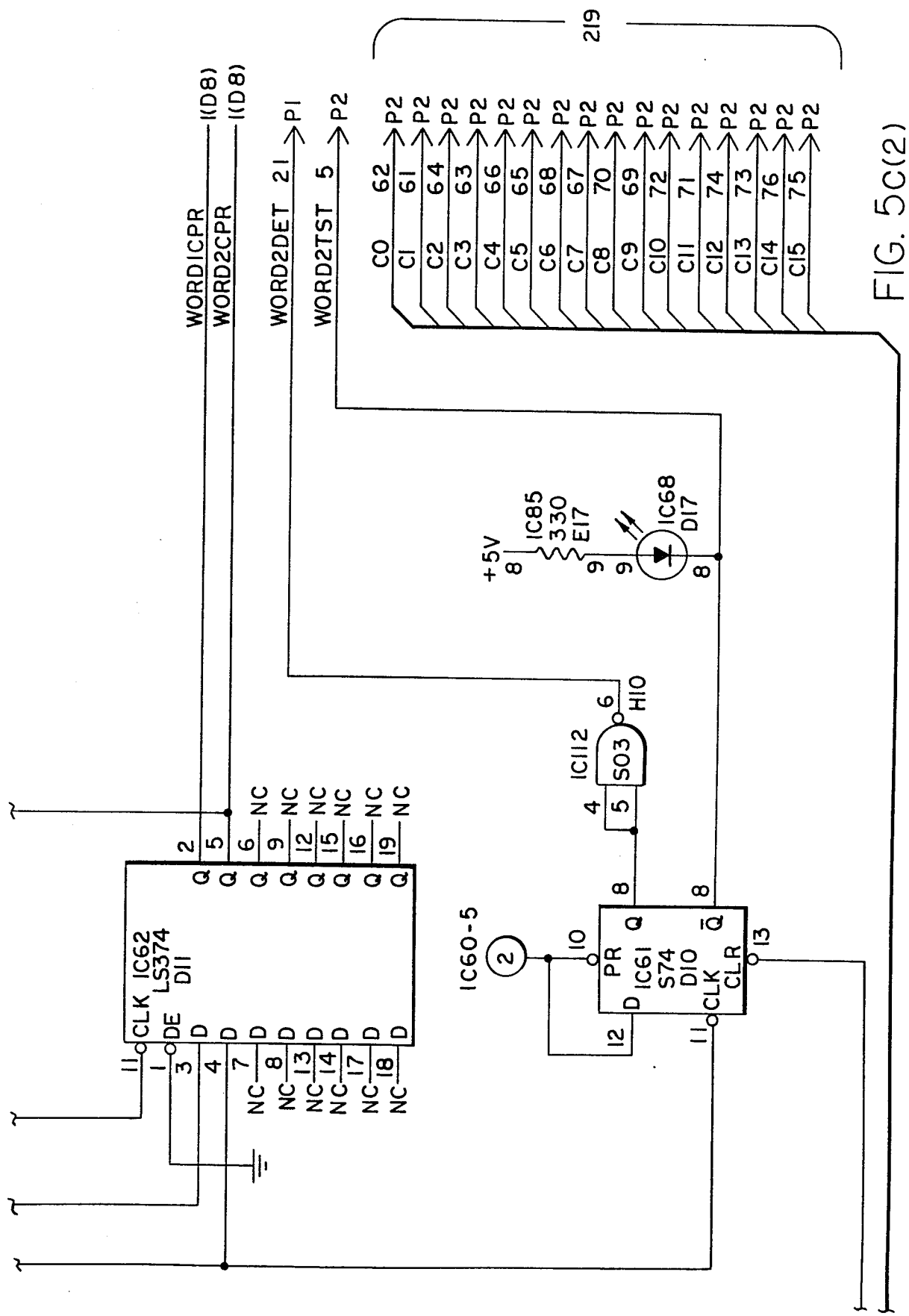
FIG. 5C(2)

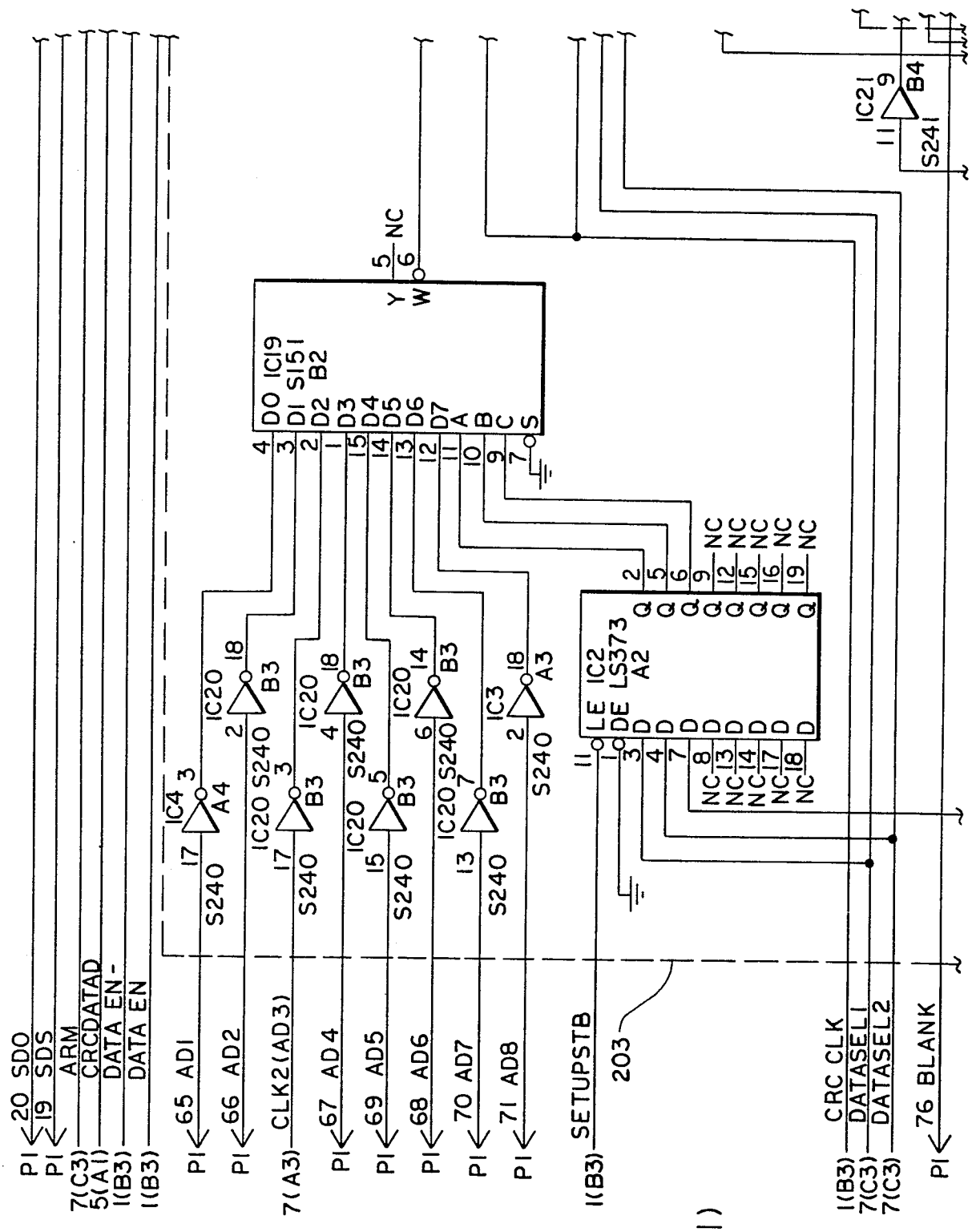
FIG.6A(1)

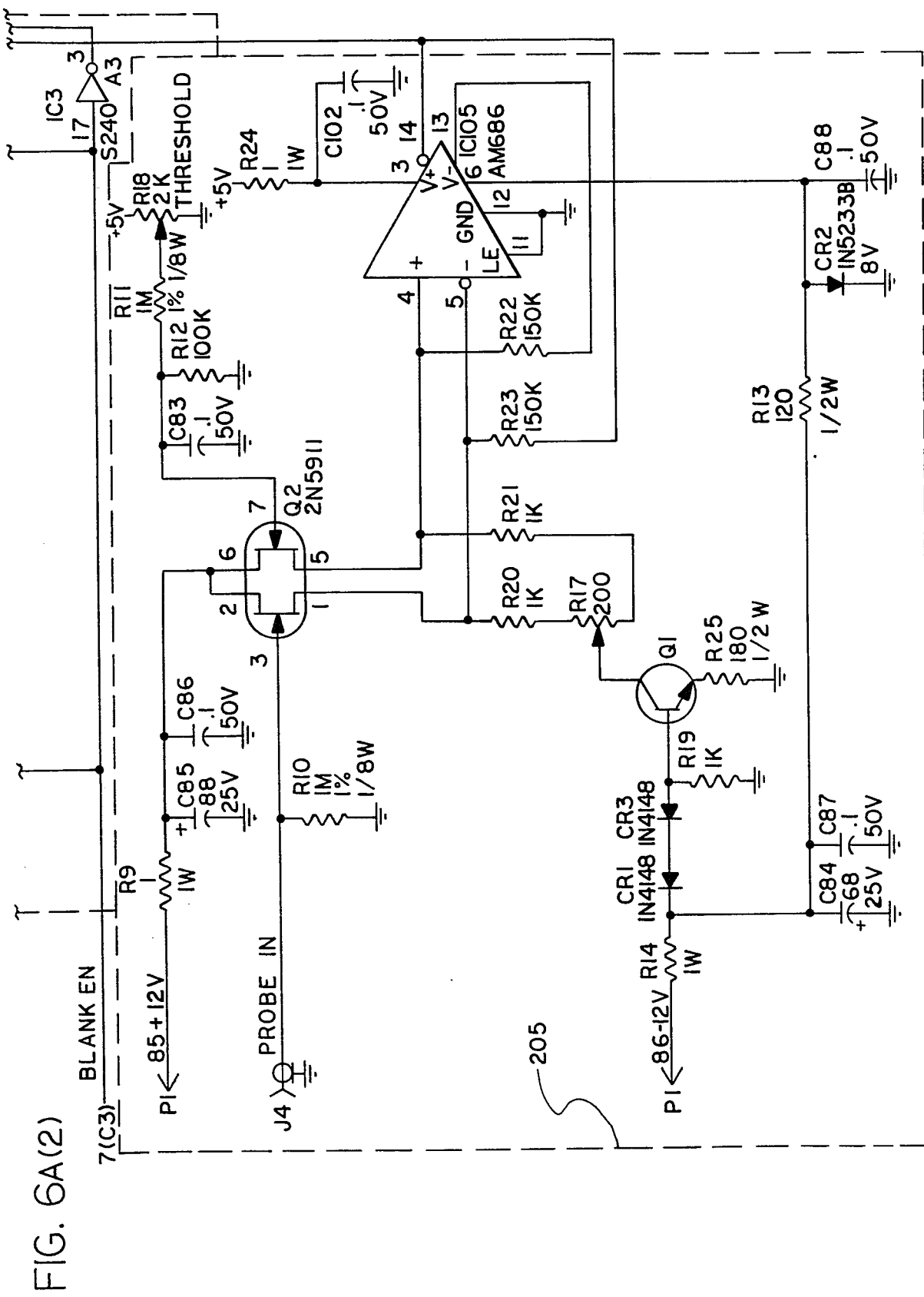
FIG. 6A(2)

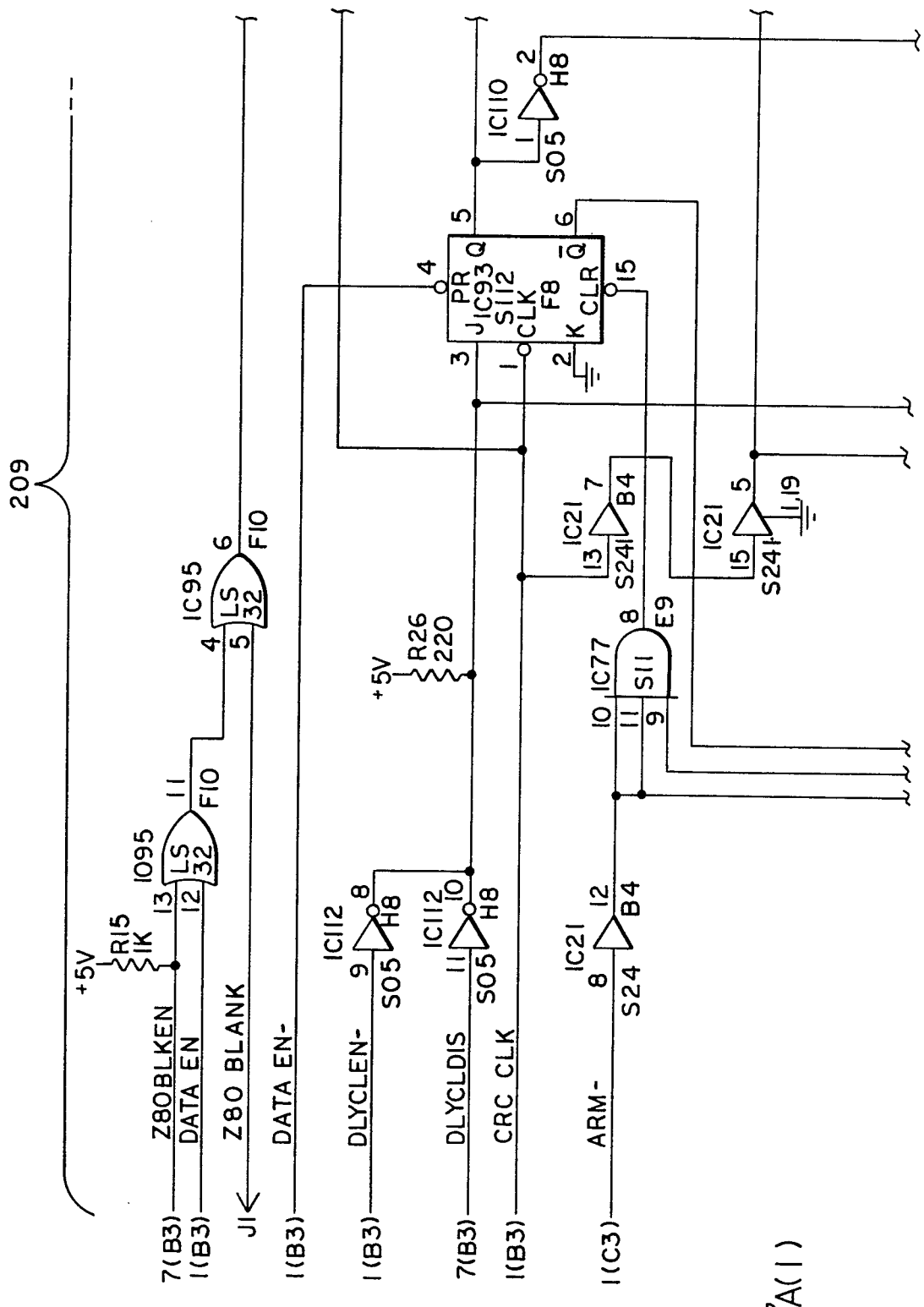
FIG. 7A(1)

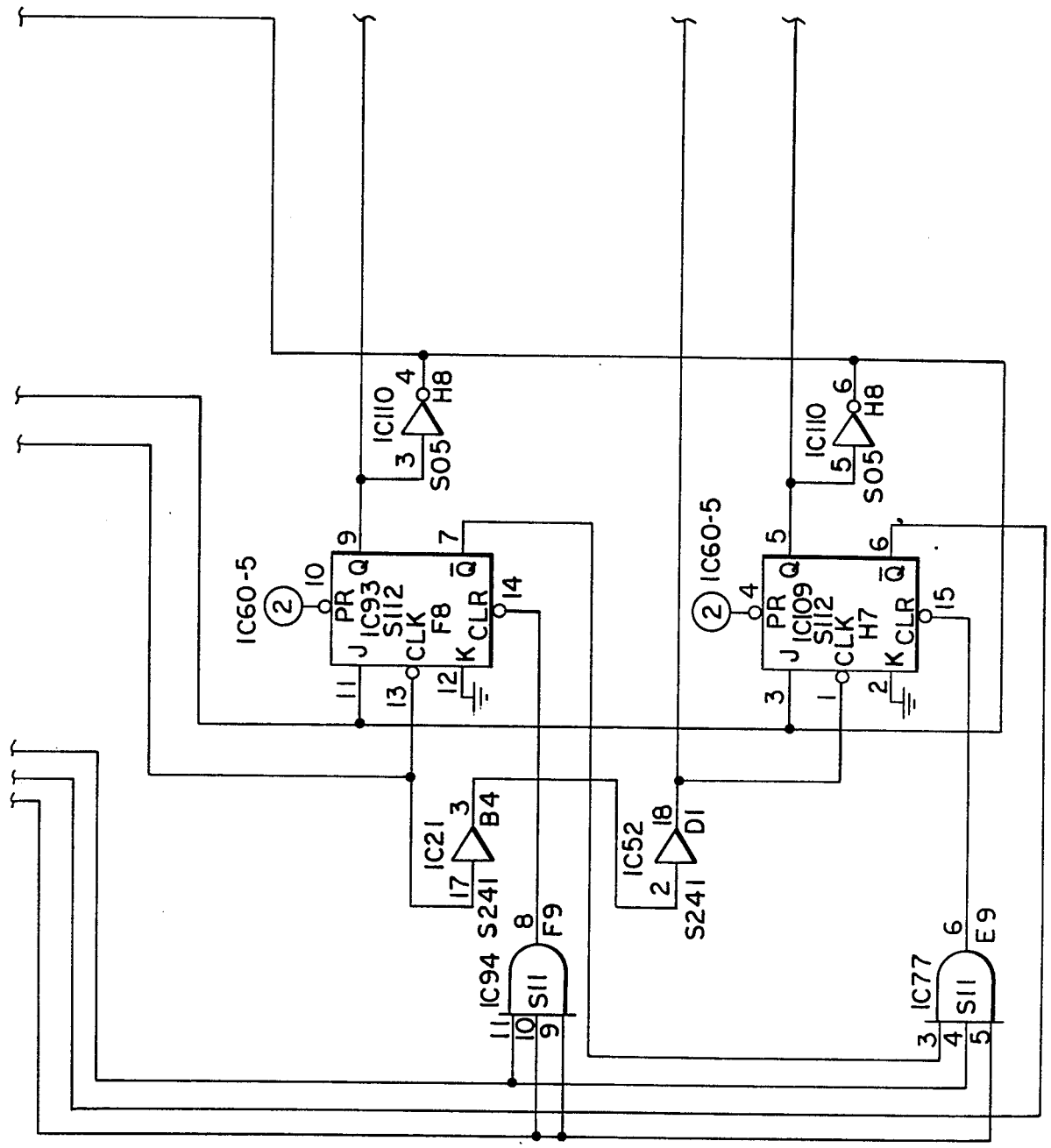
FIG. 7A(2)

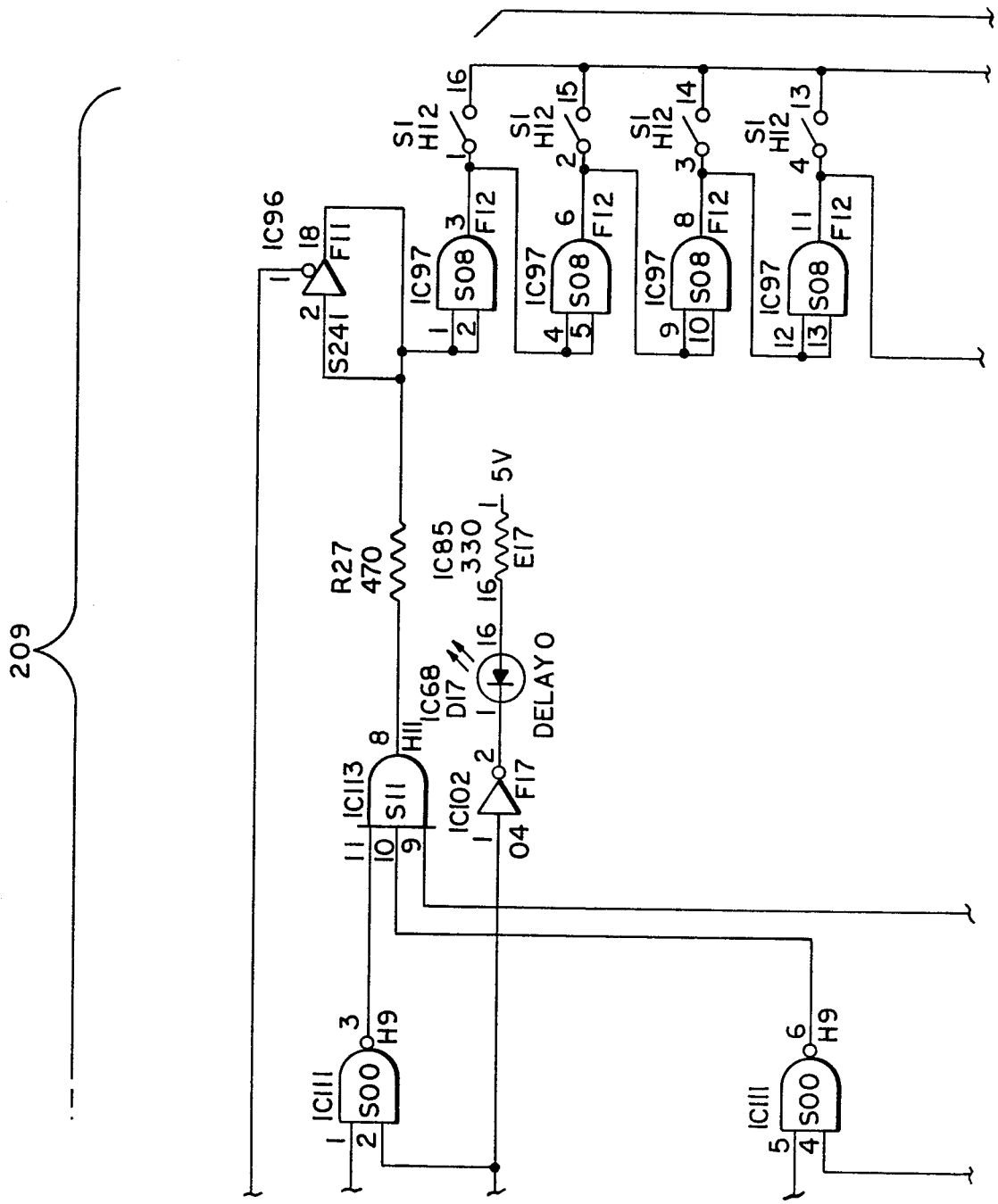
FIG. 7B(1)

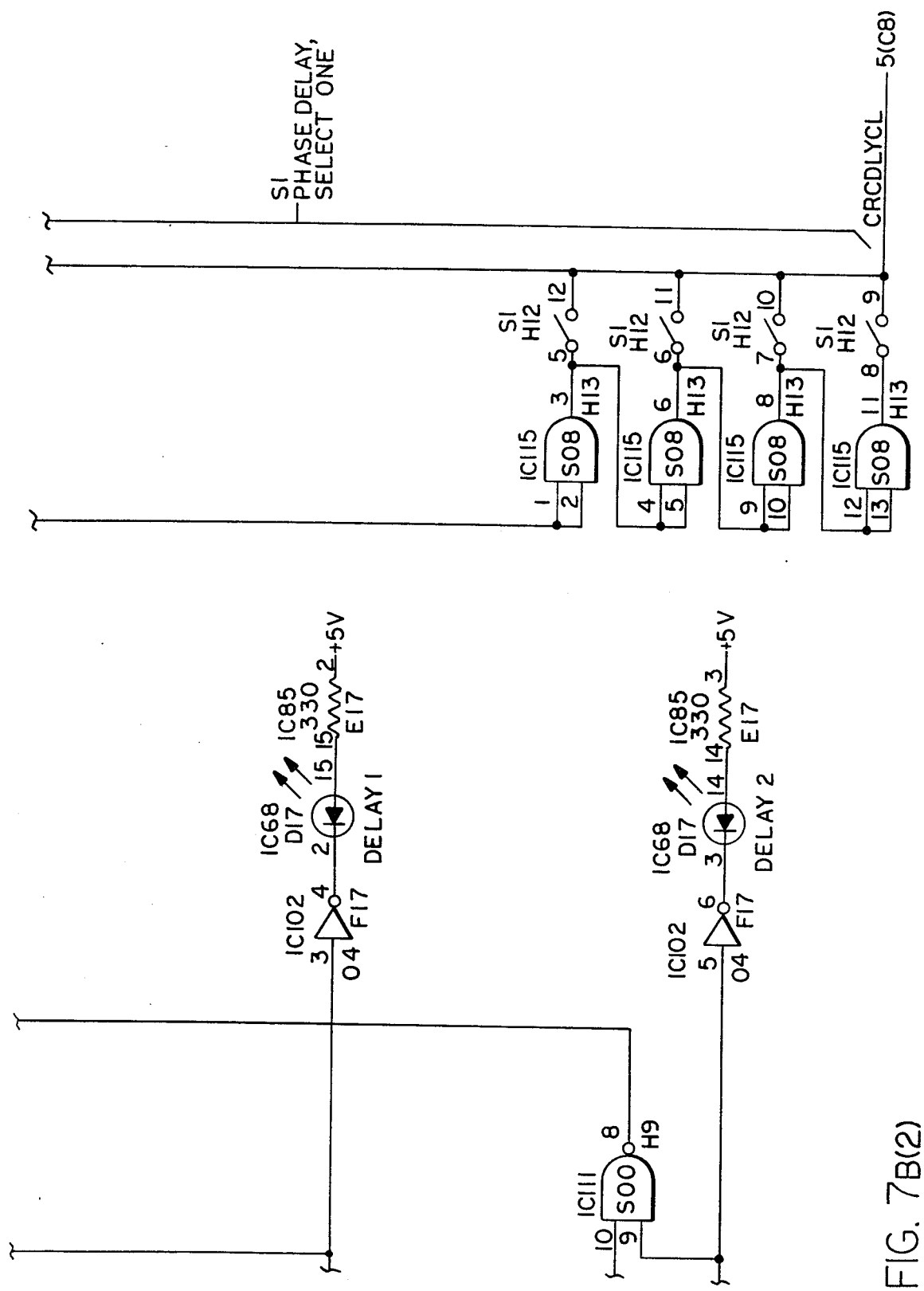
FIG. 7B(2)

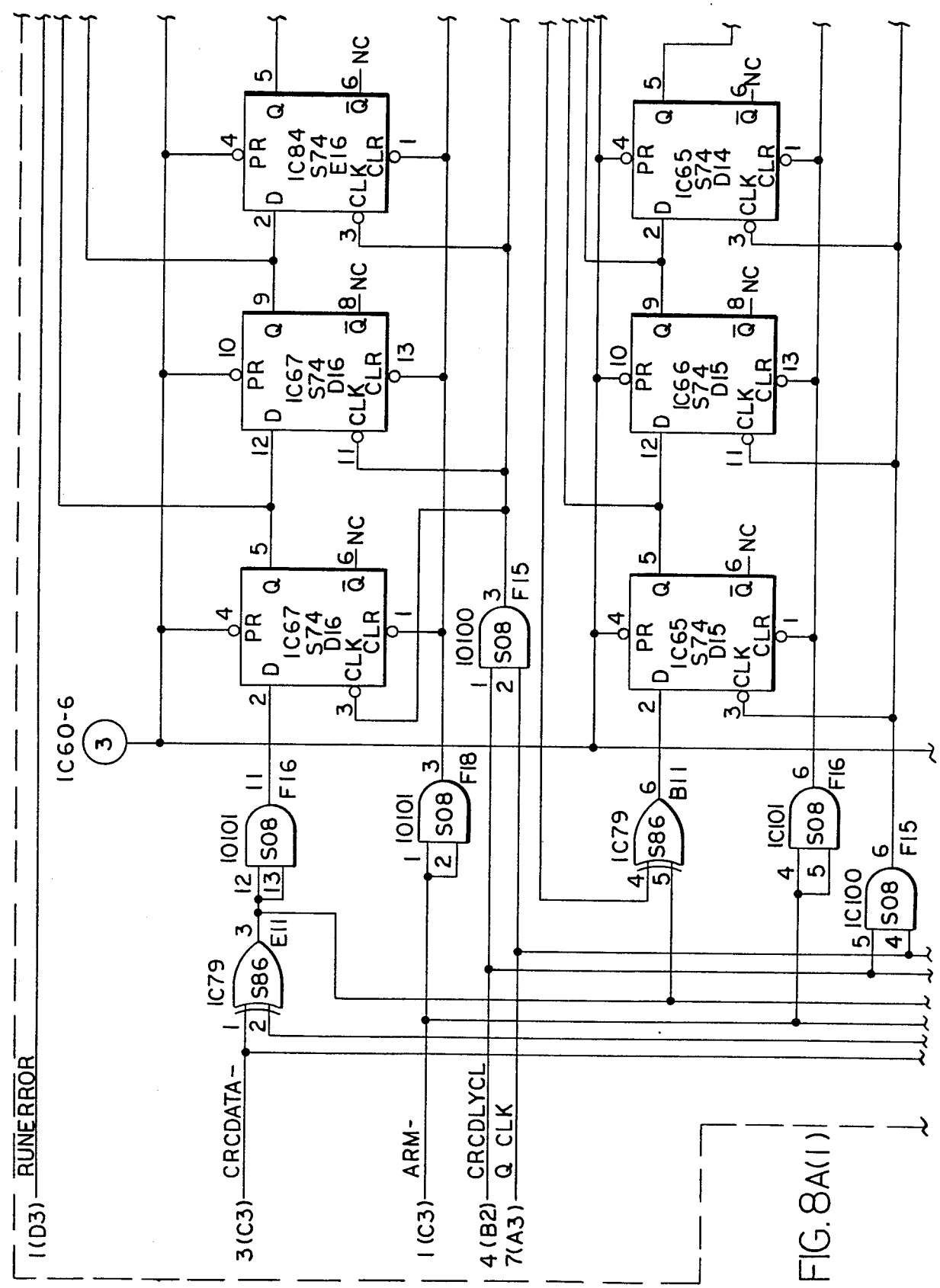
FIG. 8A(1)

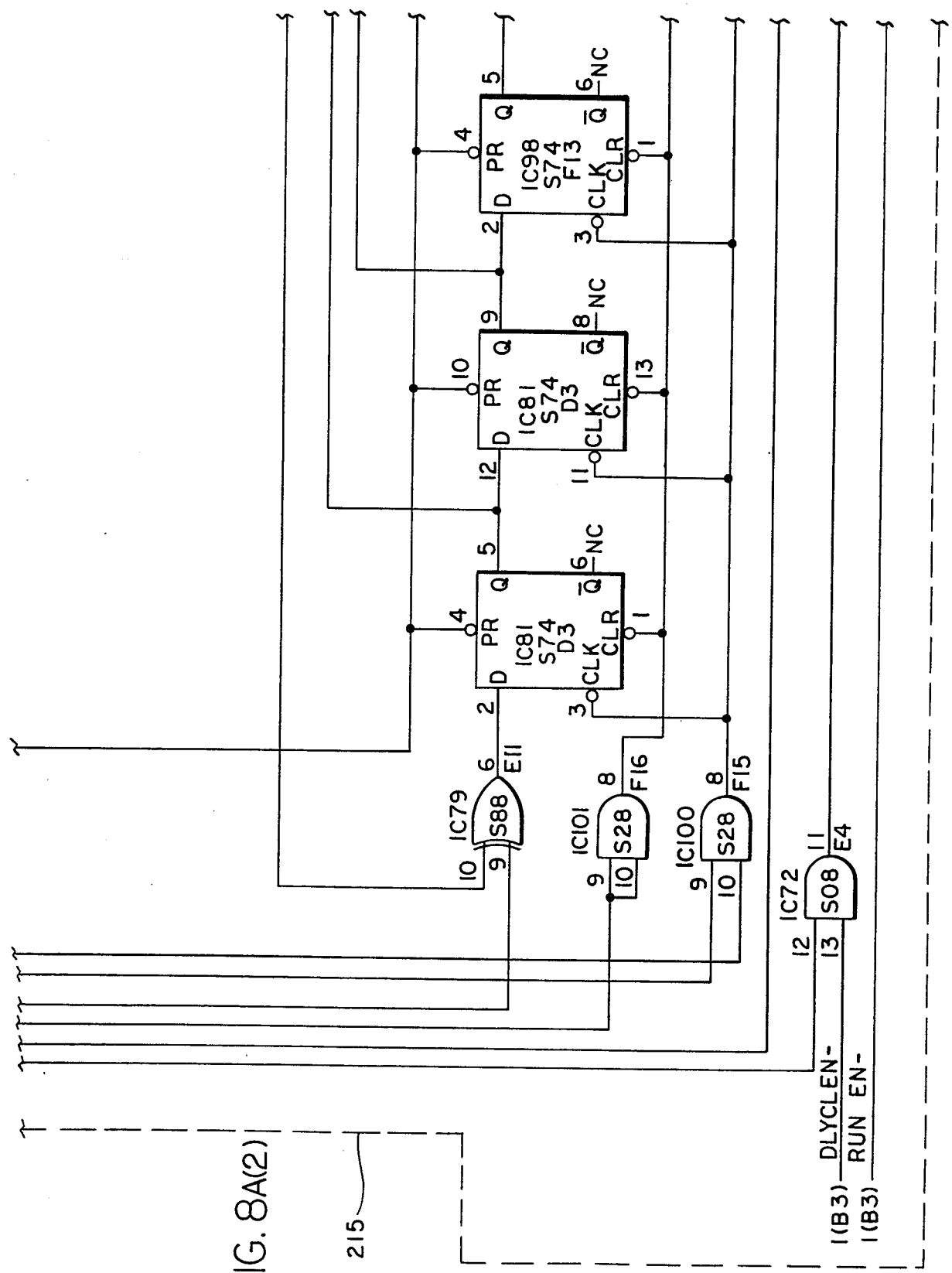
FIG. 8A(2)

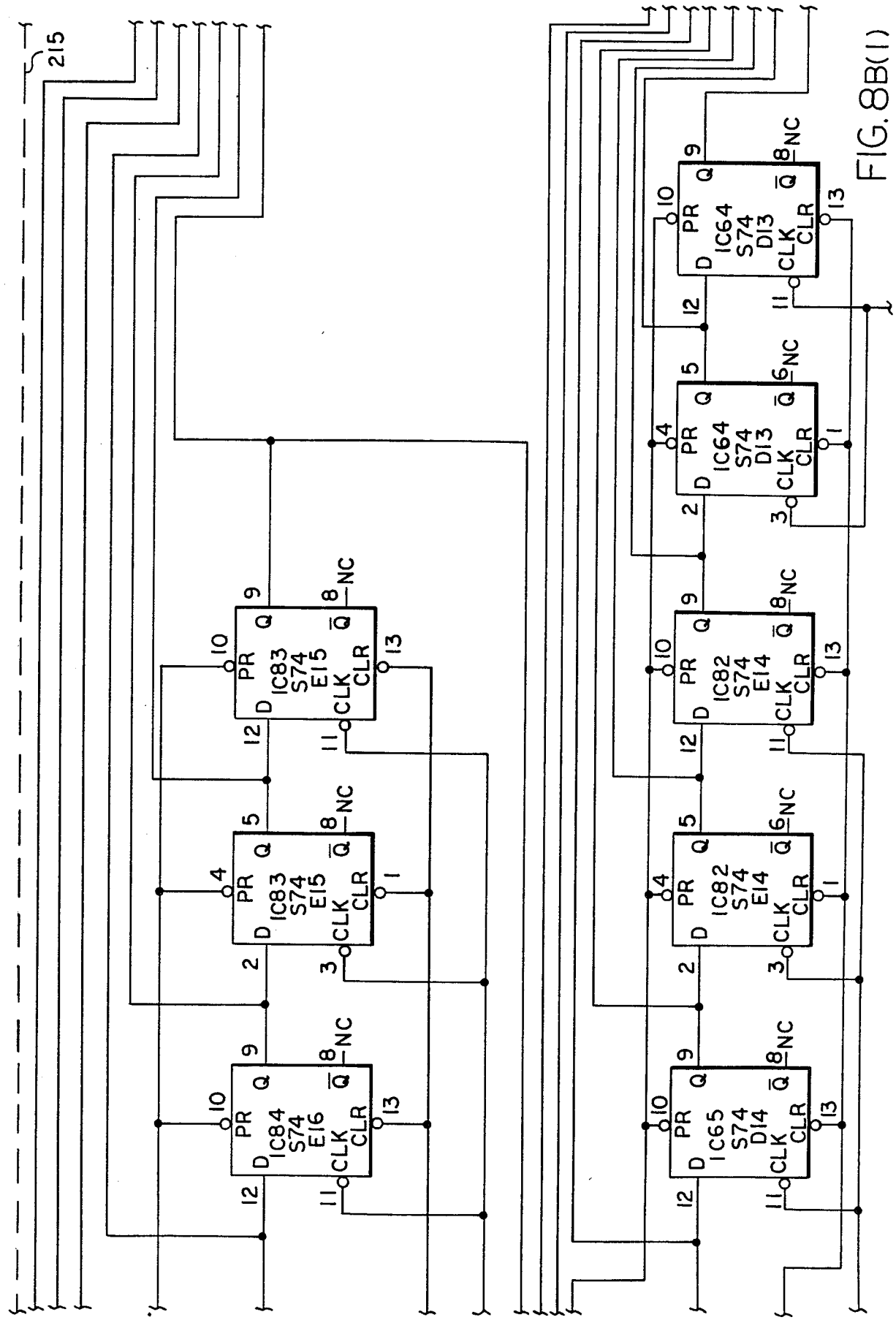
FIG. 8B(1)

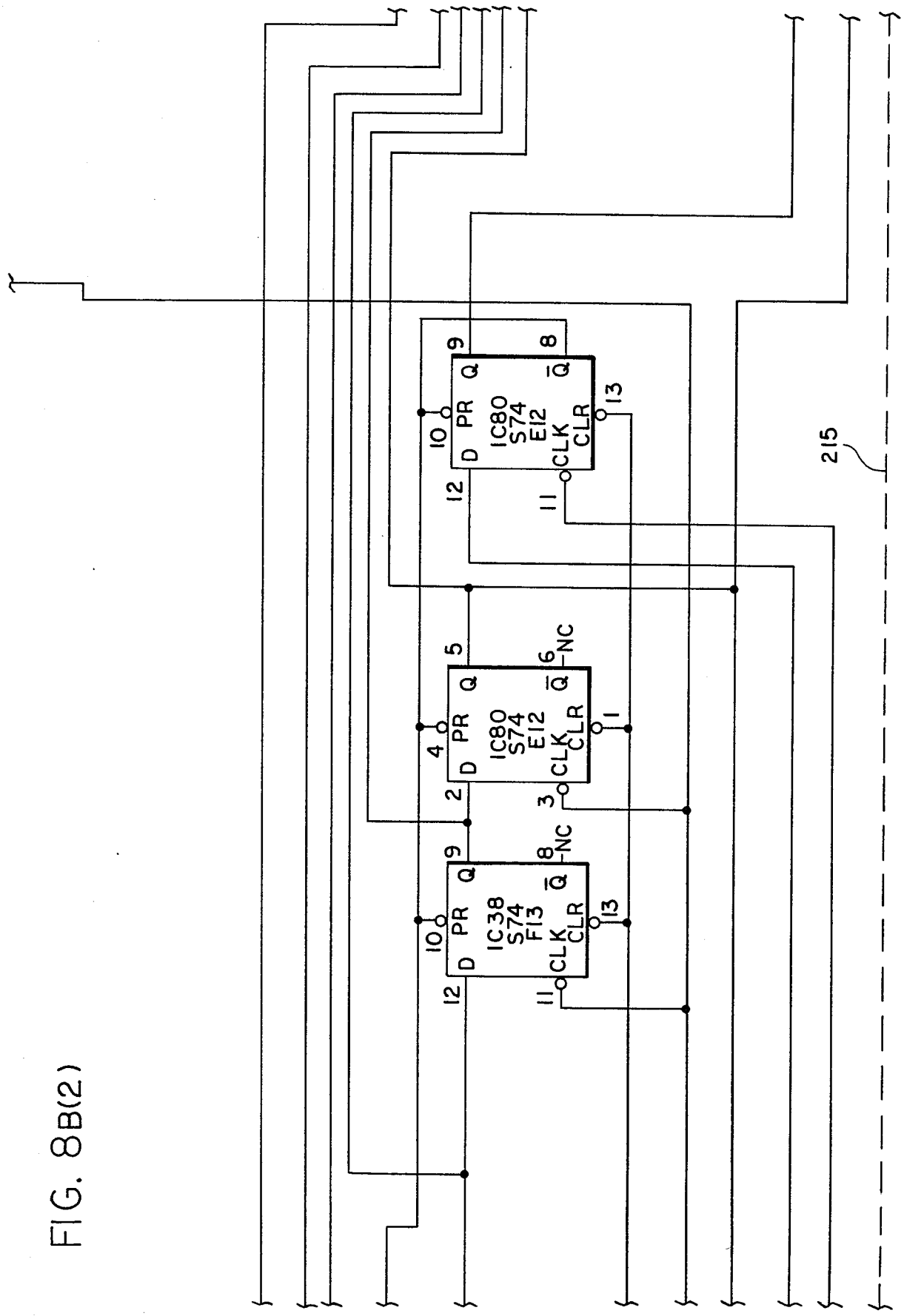
FIG. 8B(2)

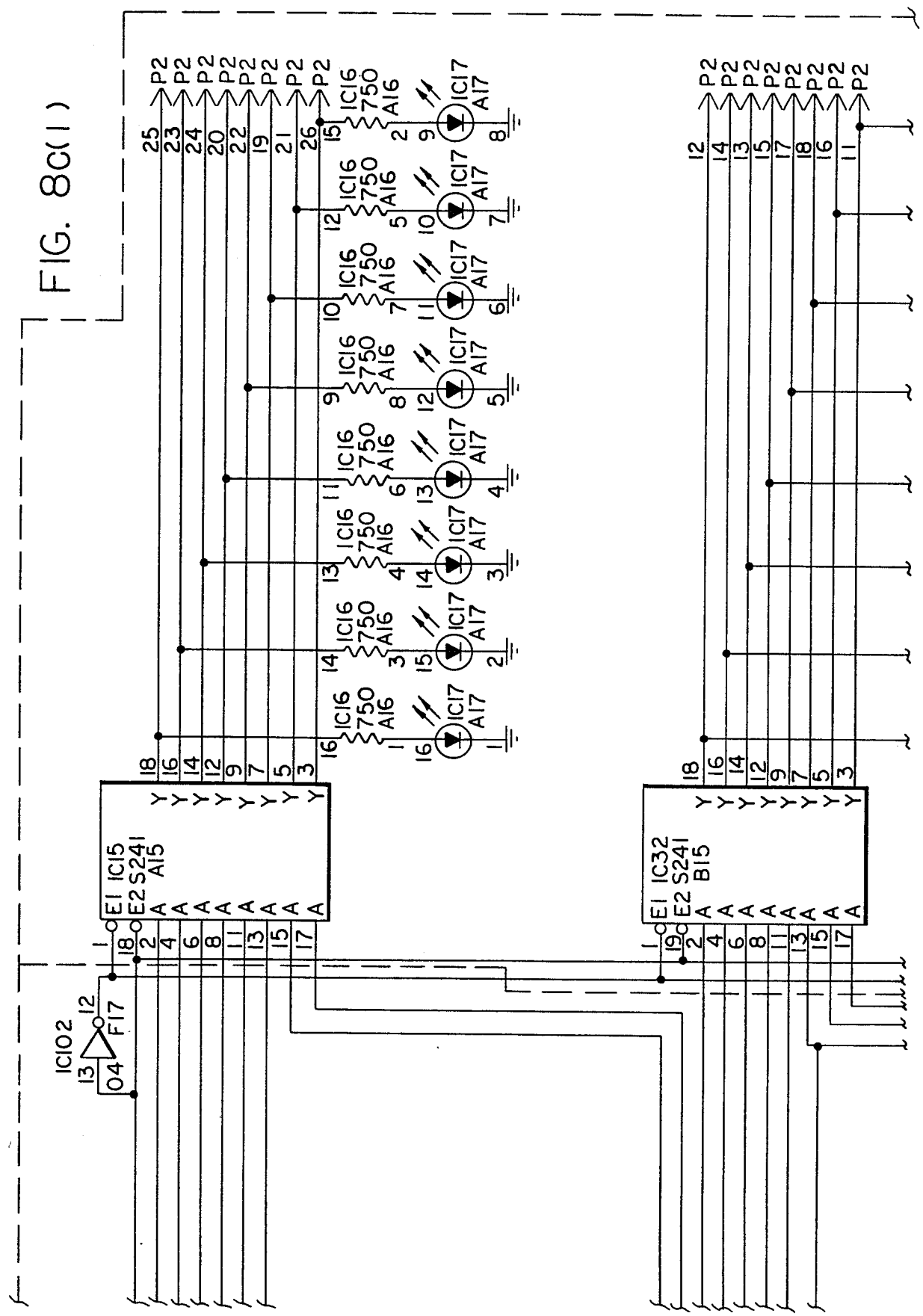

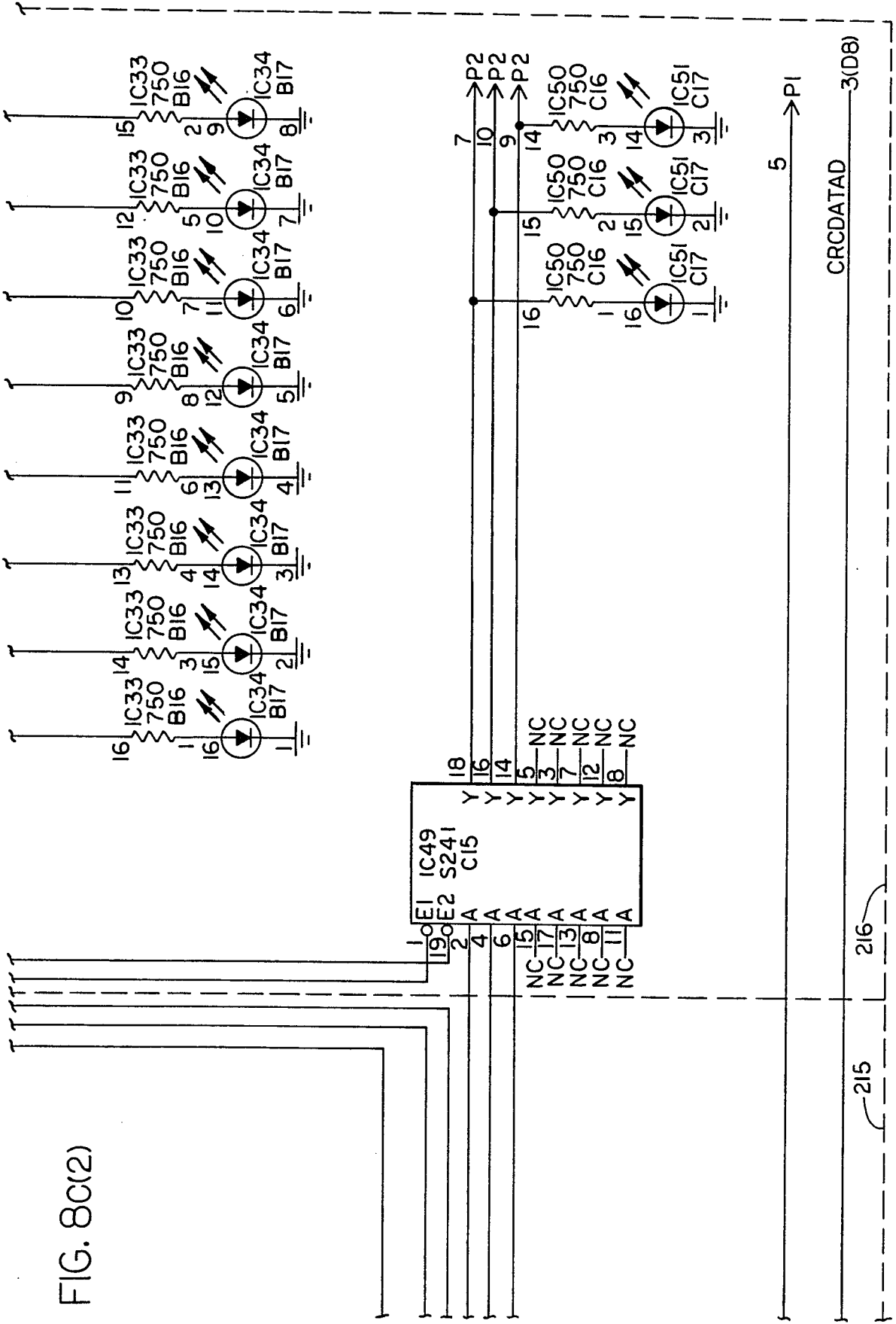
FIG. 8c(2)

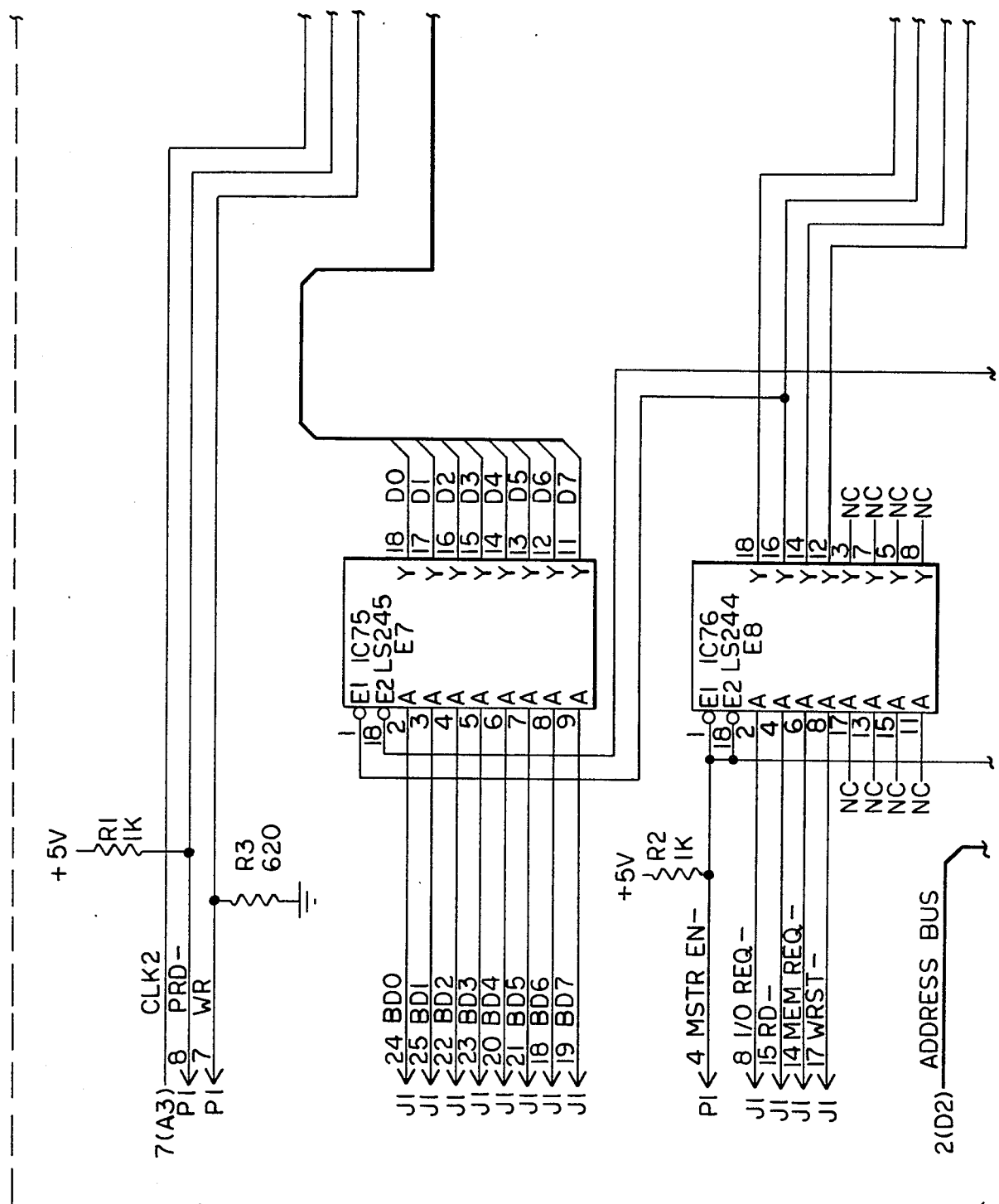
FIG. 9A(1)

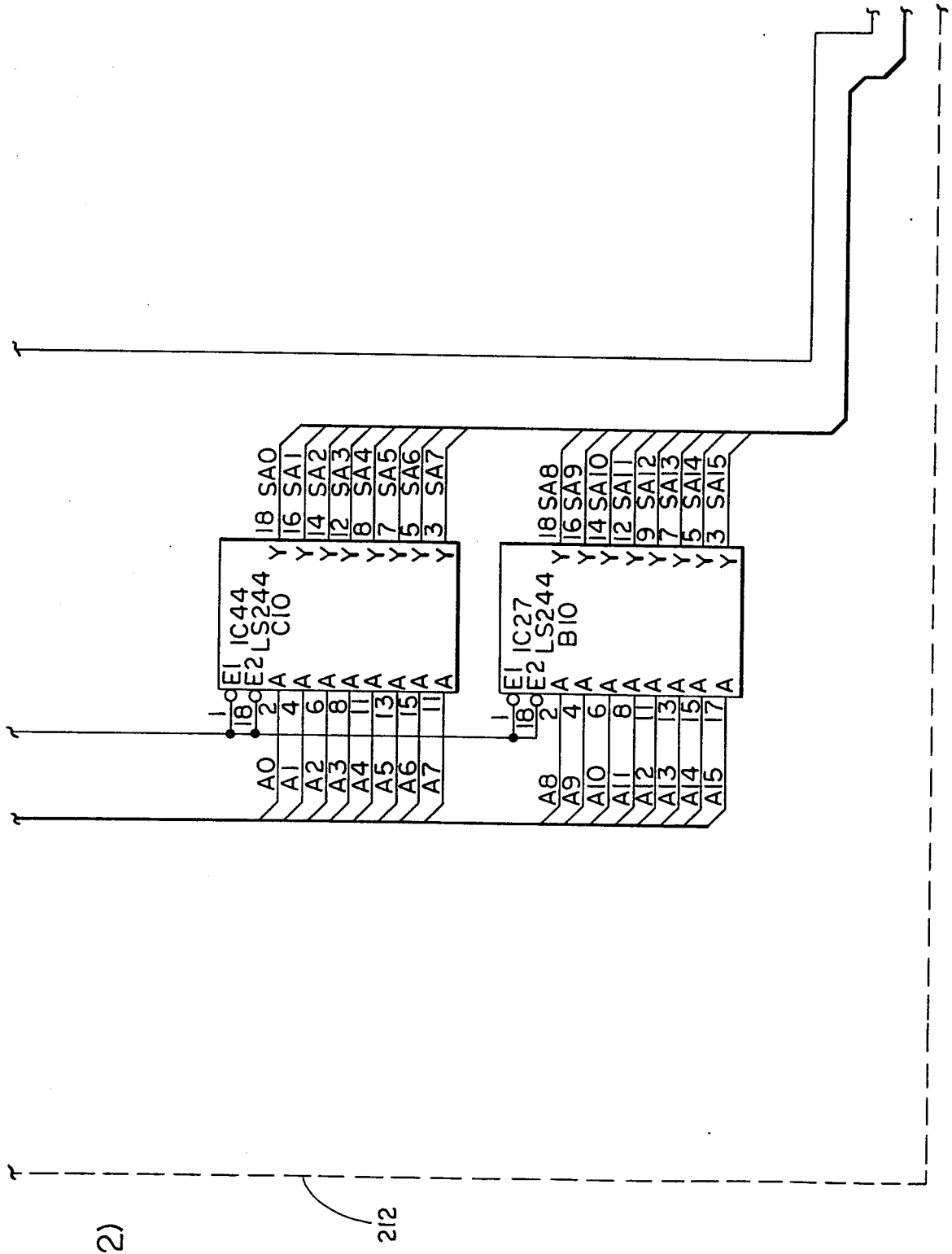
FIG. 9A(2)

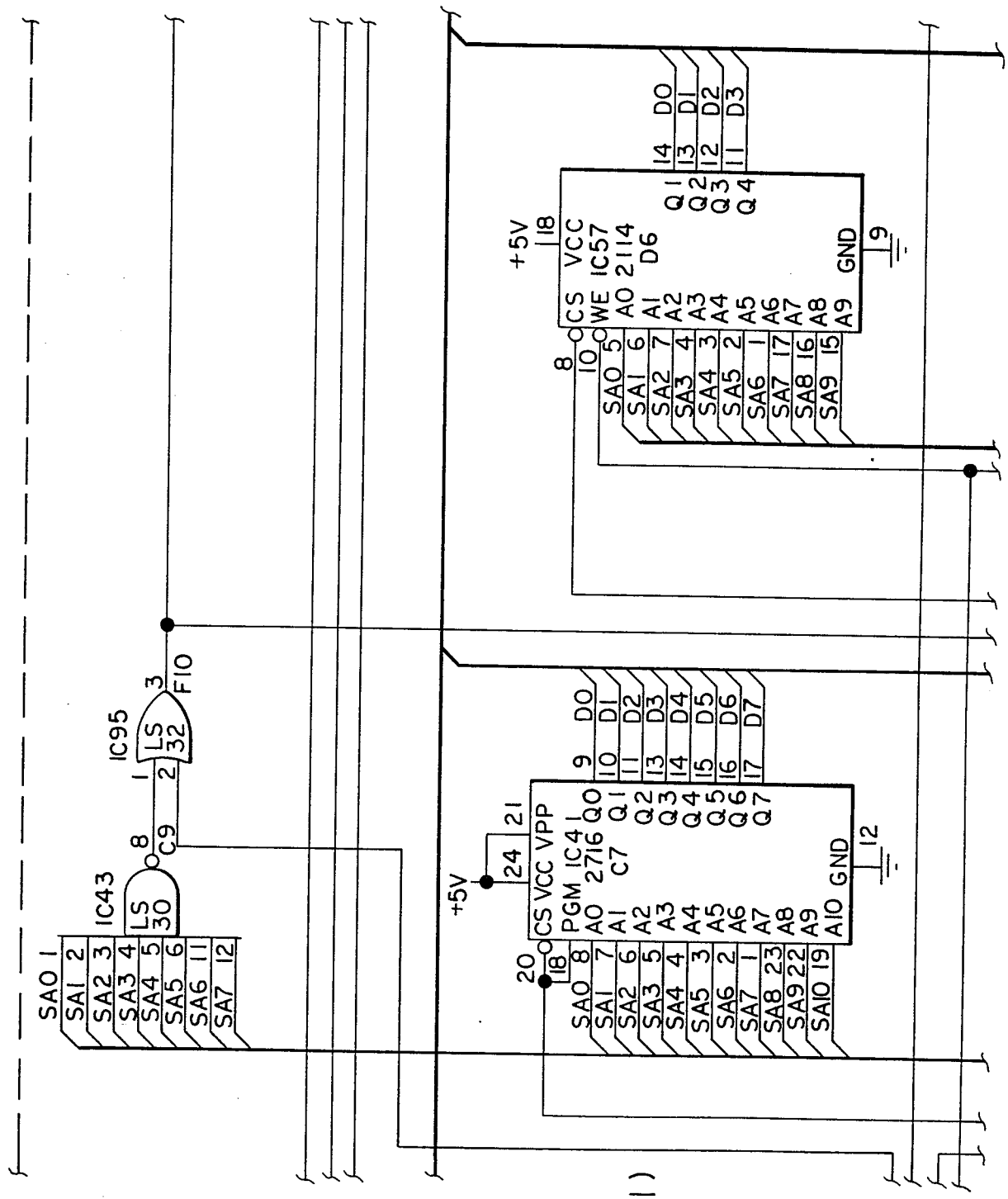
FIG. 9B(1)

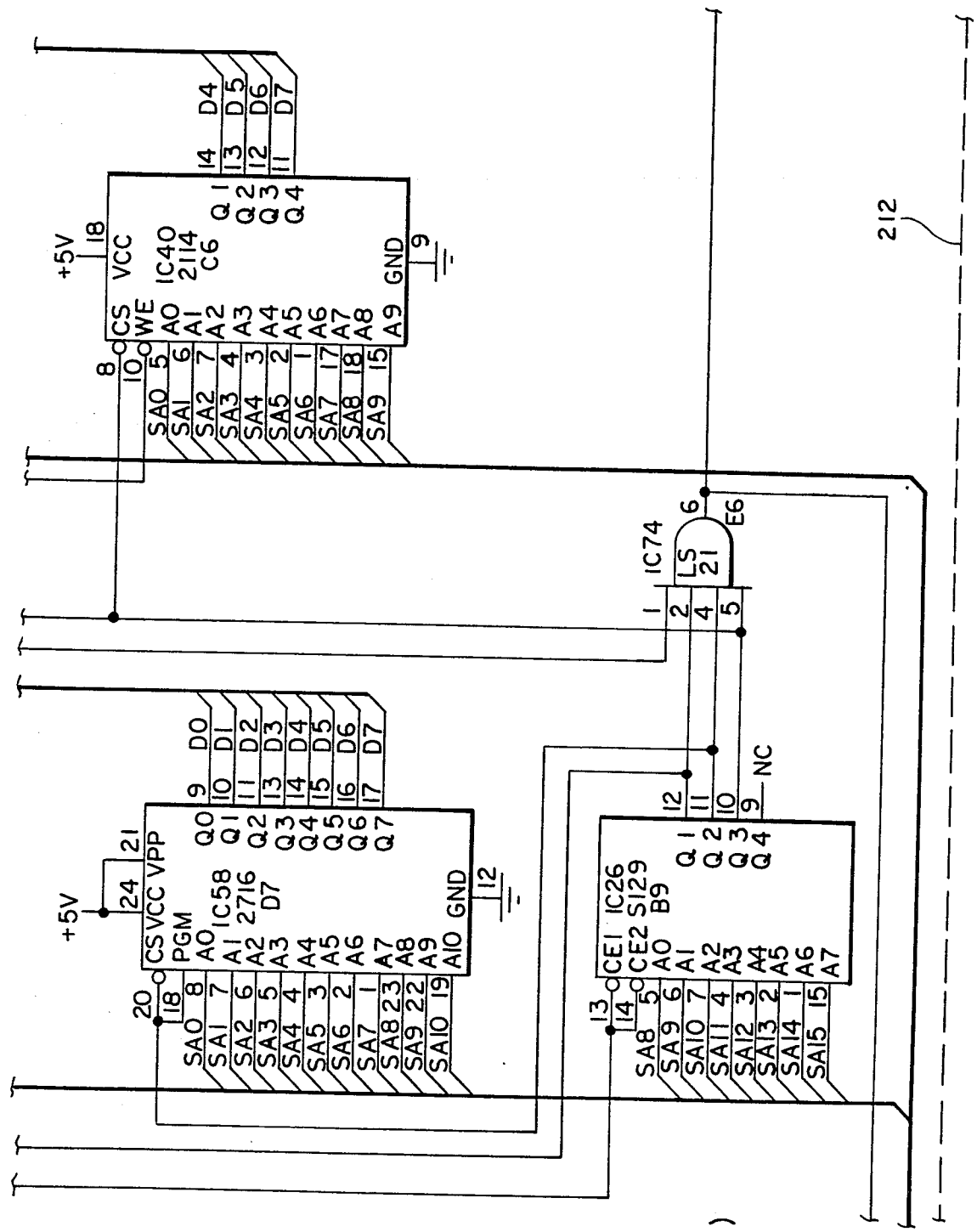
FIG. 9B(2)

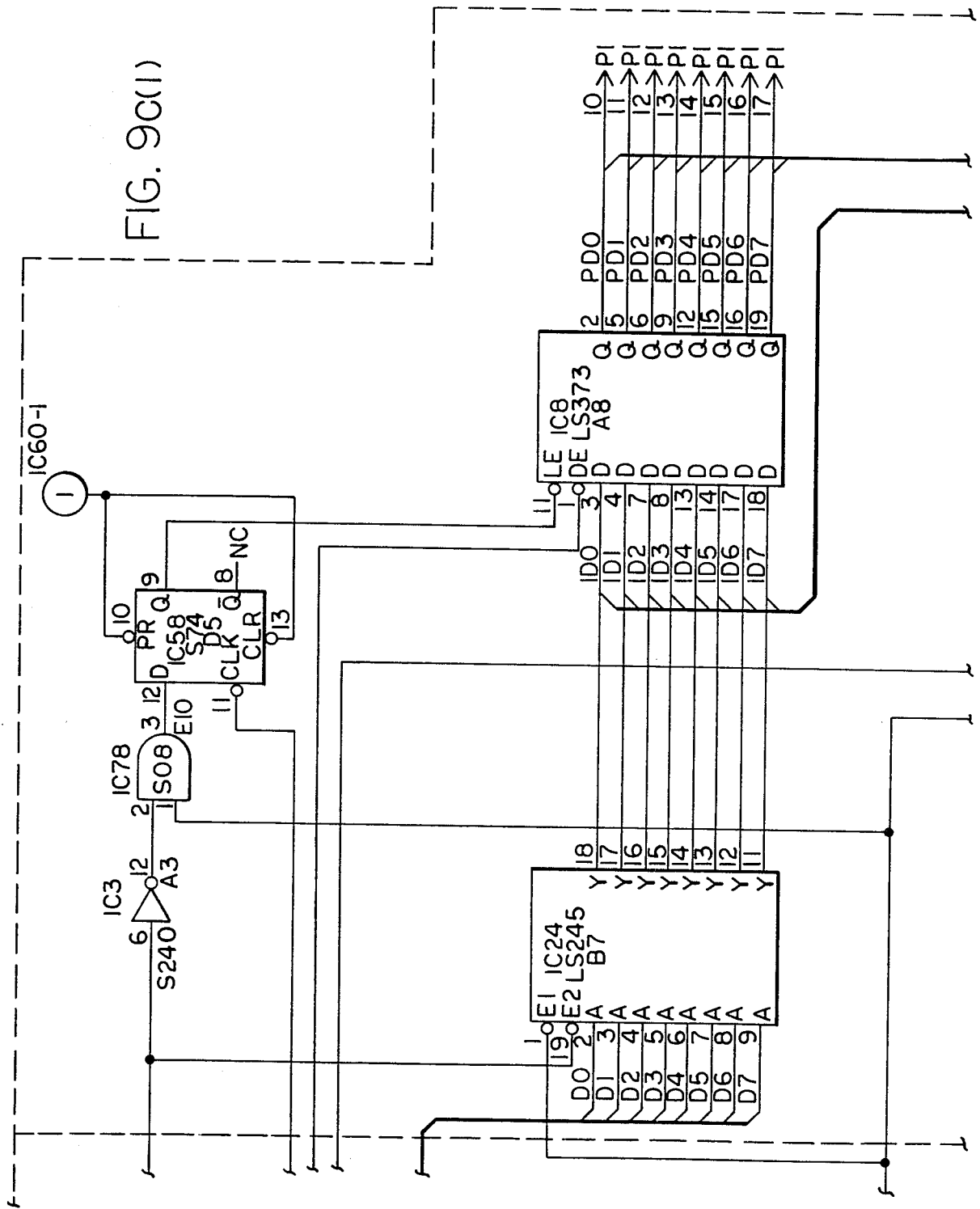
FIG. 9C(1)

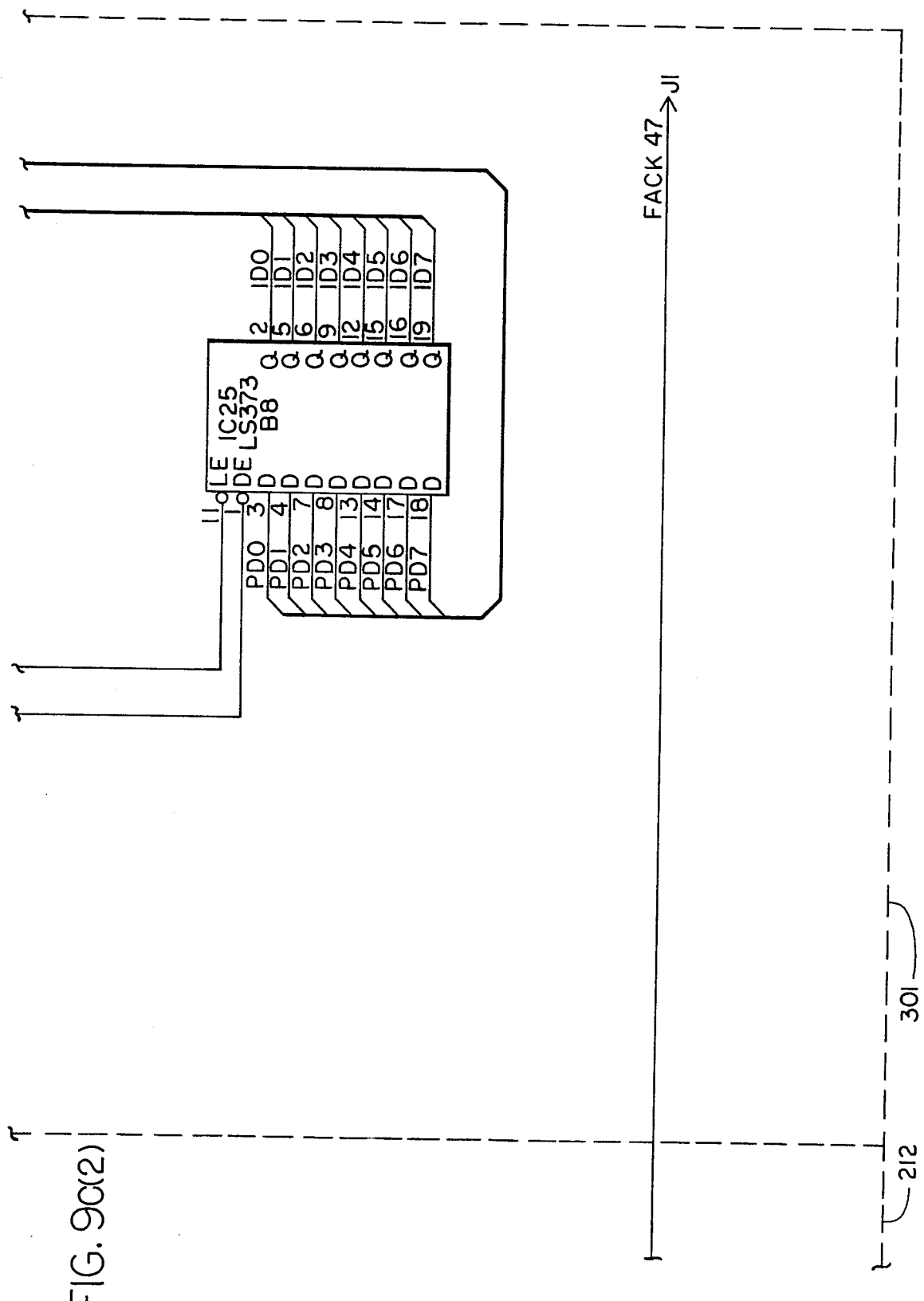
FIG. 9C(2)

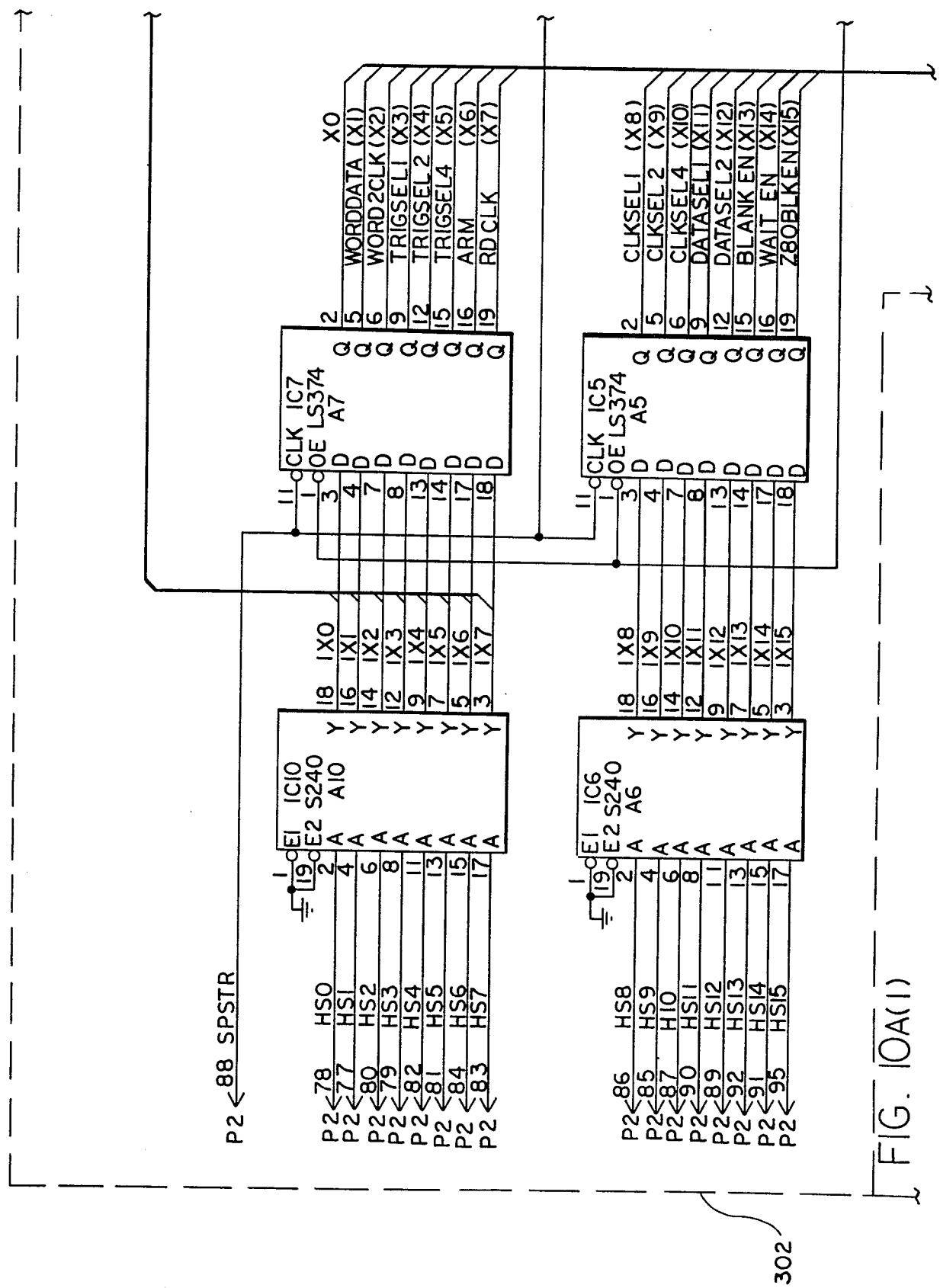
FIG. 10A(1)

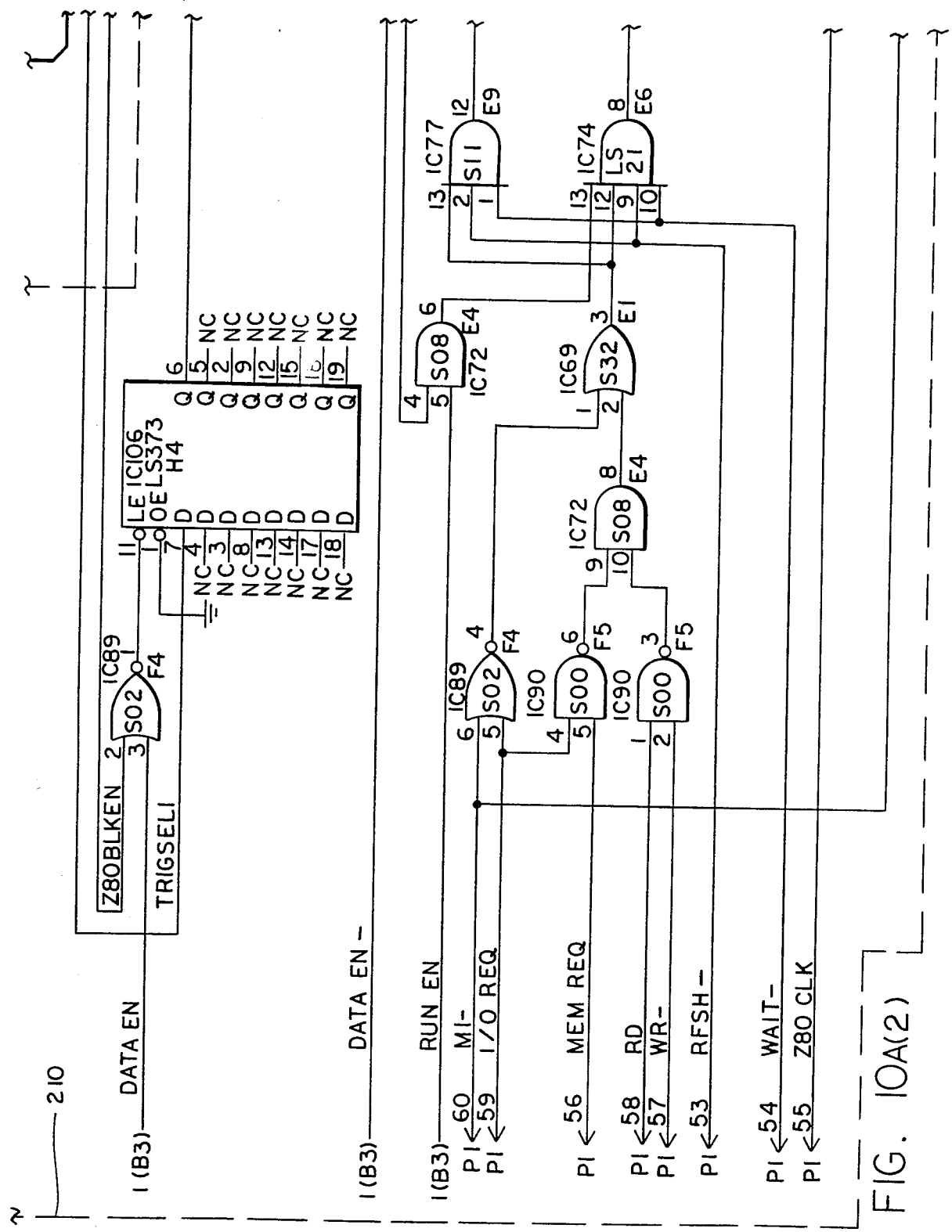
FIG. IOA(2)

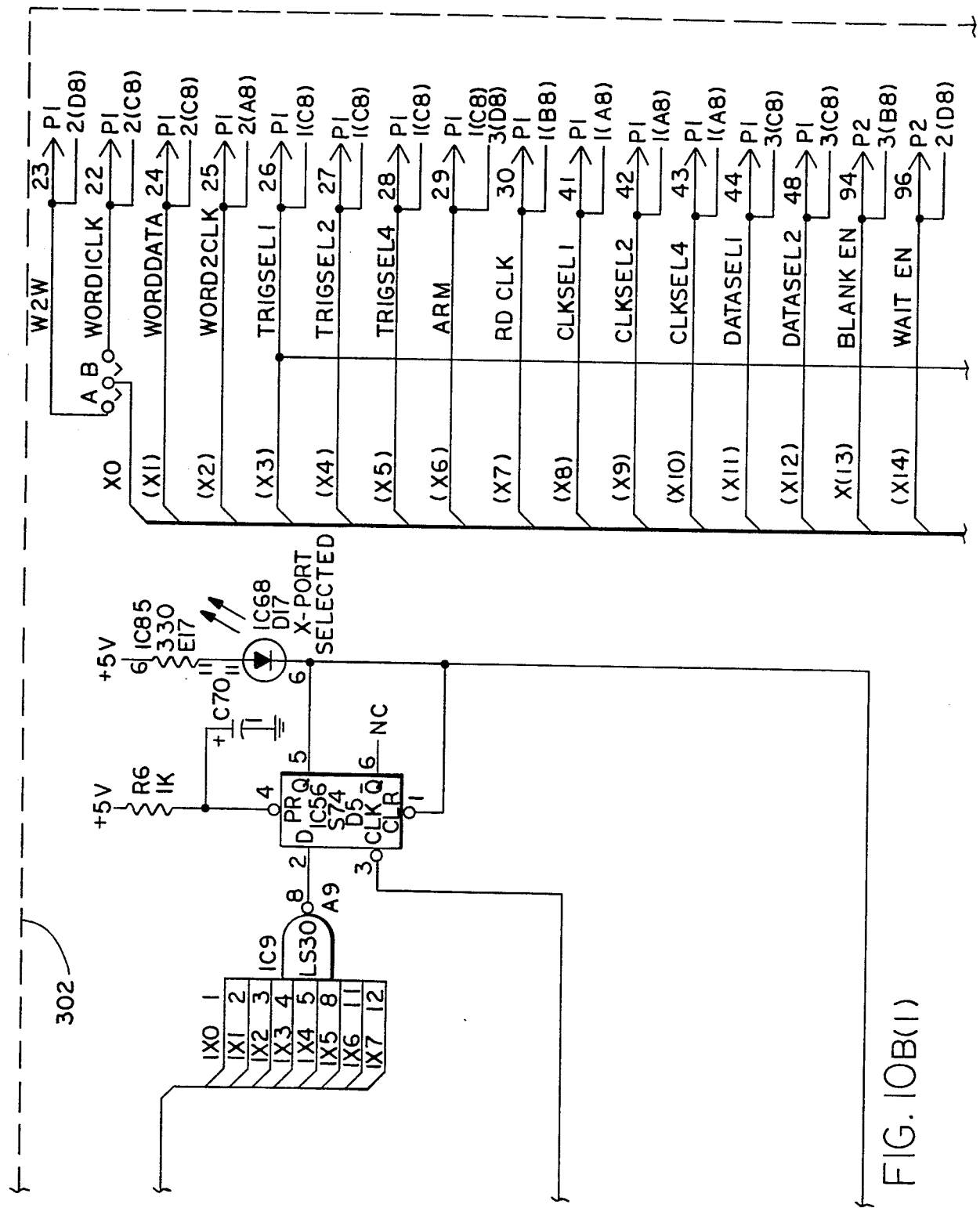
FIG. 10B(1)

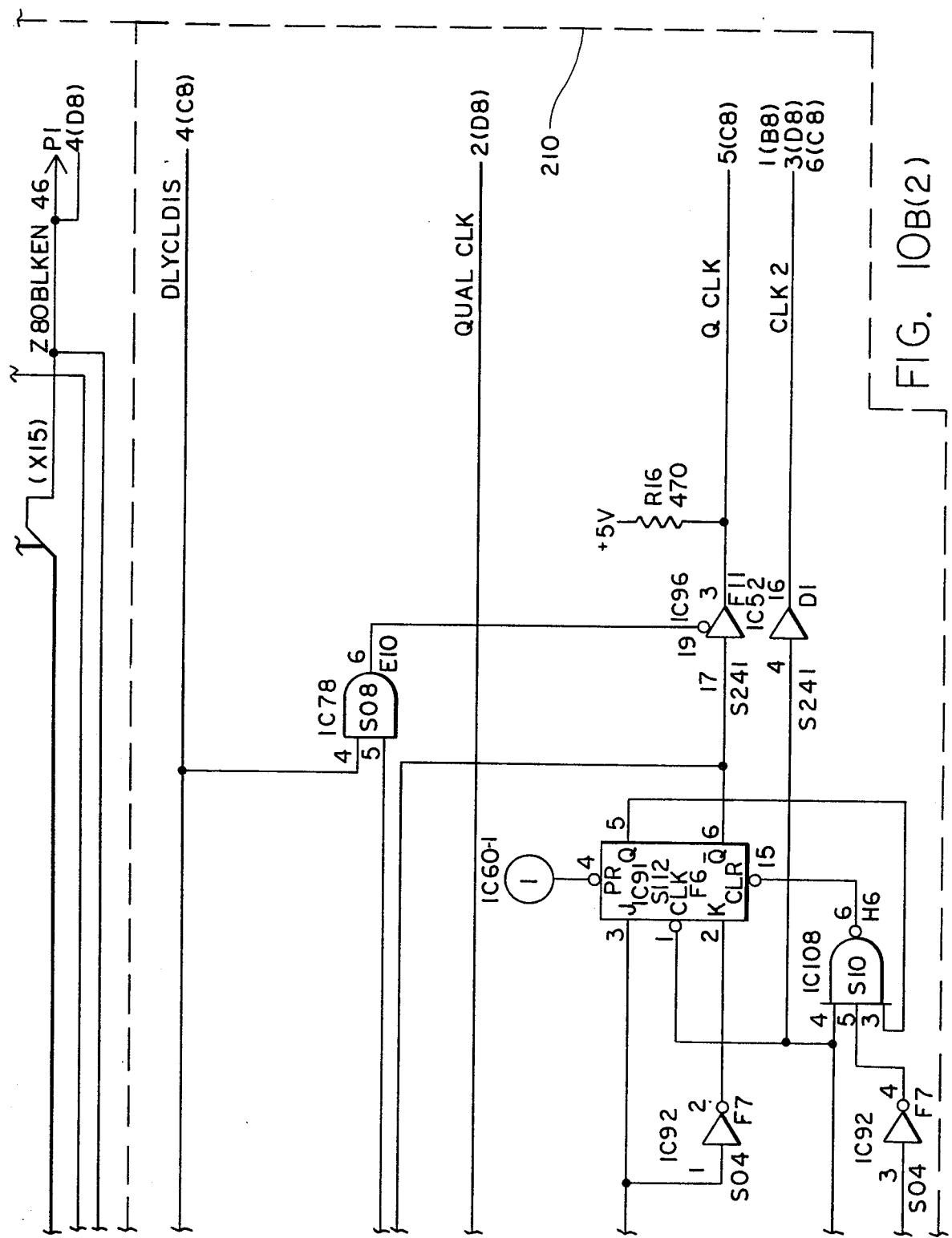
FIG. 10B(2)

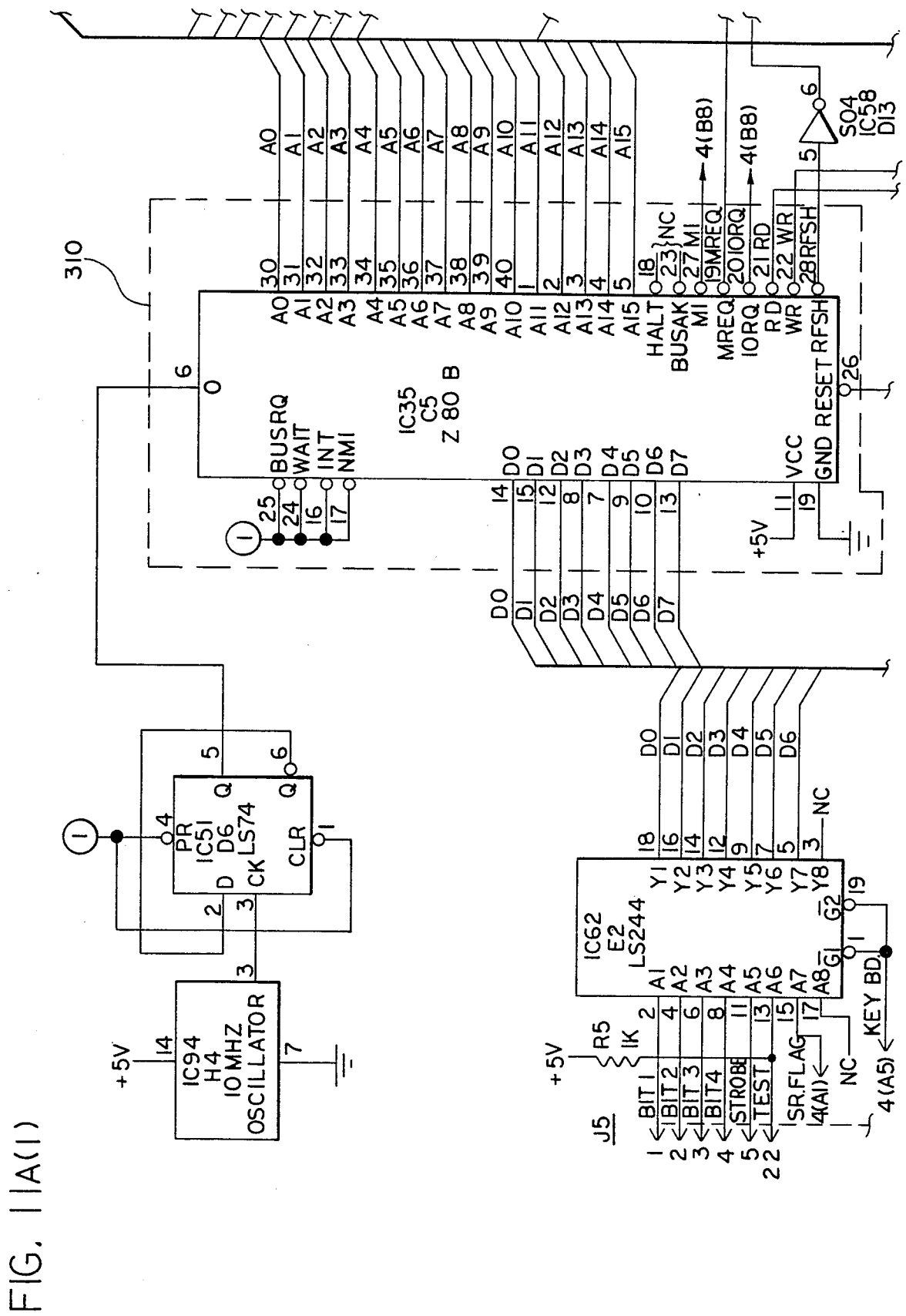
FIG. 11A(1)

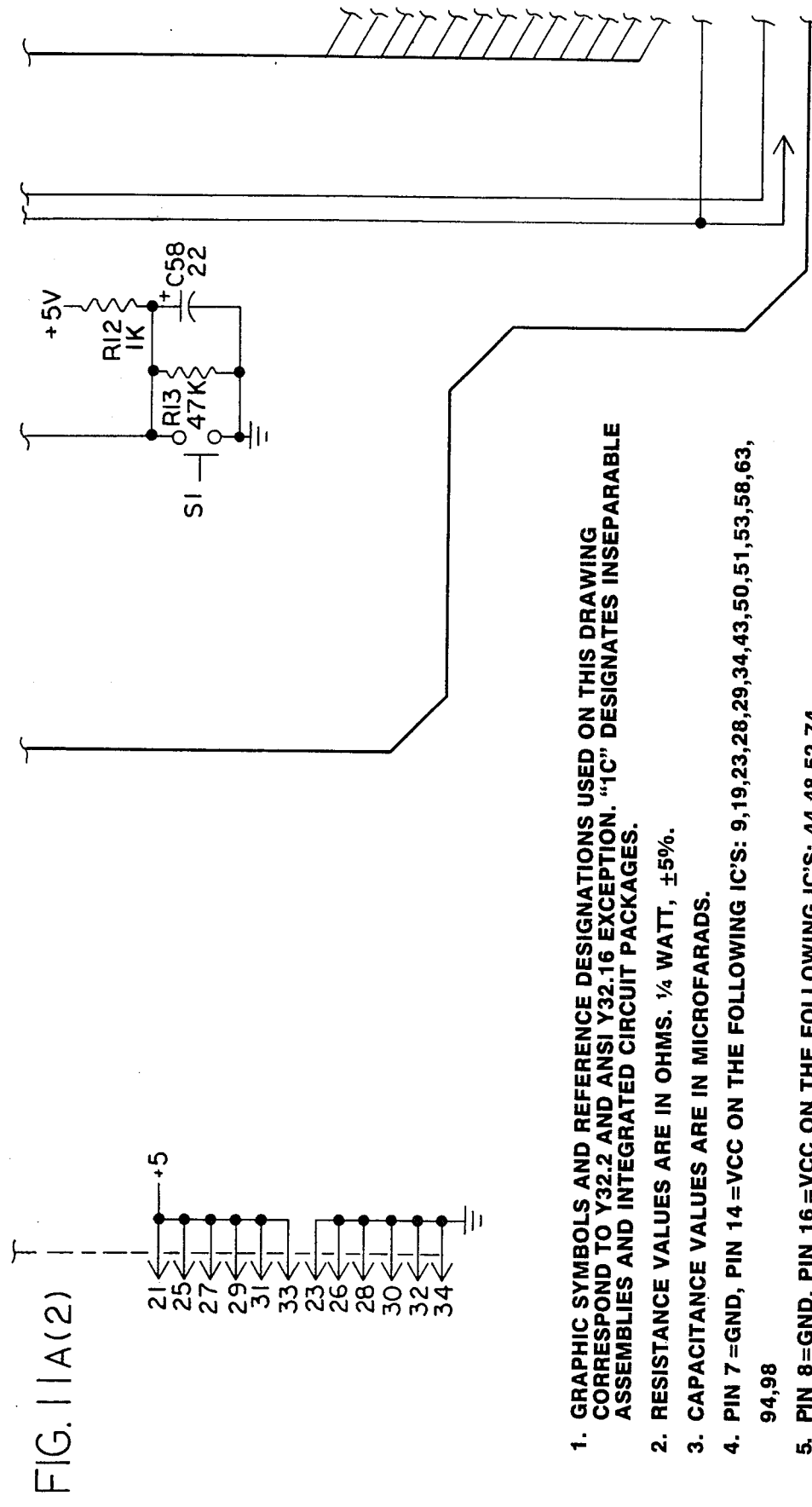

FIG. 11A(2)

1. GRAPHIC SYMBOLS AND REFERENCE DESIGNATIONS USED ON THIS DRAWING CORRESPOND TO Y32.2 AND ANSI Y32.16 EXCEPTION. "IC" DESIGNATES INSEPARABLE ASSEMBLIES AND INTEGRATED CIRCUIT PACKAGES.
2. RESISTANCE VALUES ARE IN OHMS. ¼ WATT, ±5%.
3. CAPACITANCE VALUES ARE IN MICROFARADS.
4. PIN 7=GND, PIN 14=VCC ON THE FOLLOWING IC'S: 9,19,23,28,29,34,43,50,51,53,58,63, 94,98
5. PIN 8=GND, PIN 16=VCC ON THE FOLLOWING IC'S: 44,48,52,74
6. PIN 9=GND, PIN 18=VCC ON THE FOLLOWING IC'S: 96,97
7. PIN 10=GND, PIN 20=VCC ON THE FOLLOWING IC'S: 3-8,10-15,17,18,20,32,33,47,49,62, 65-68,73,78-83,95
8. # INDICATES A COMMON PULL UP POINT.

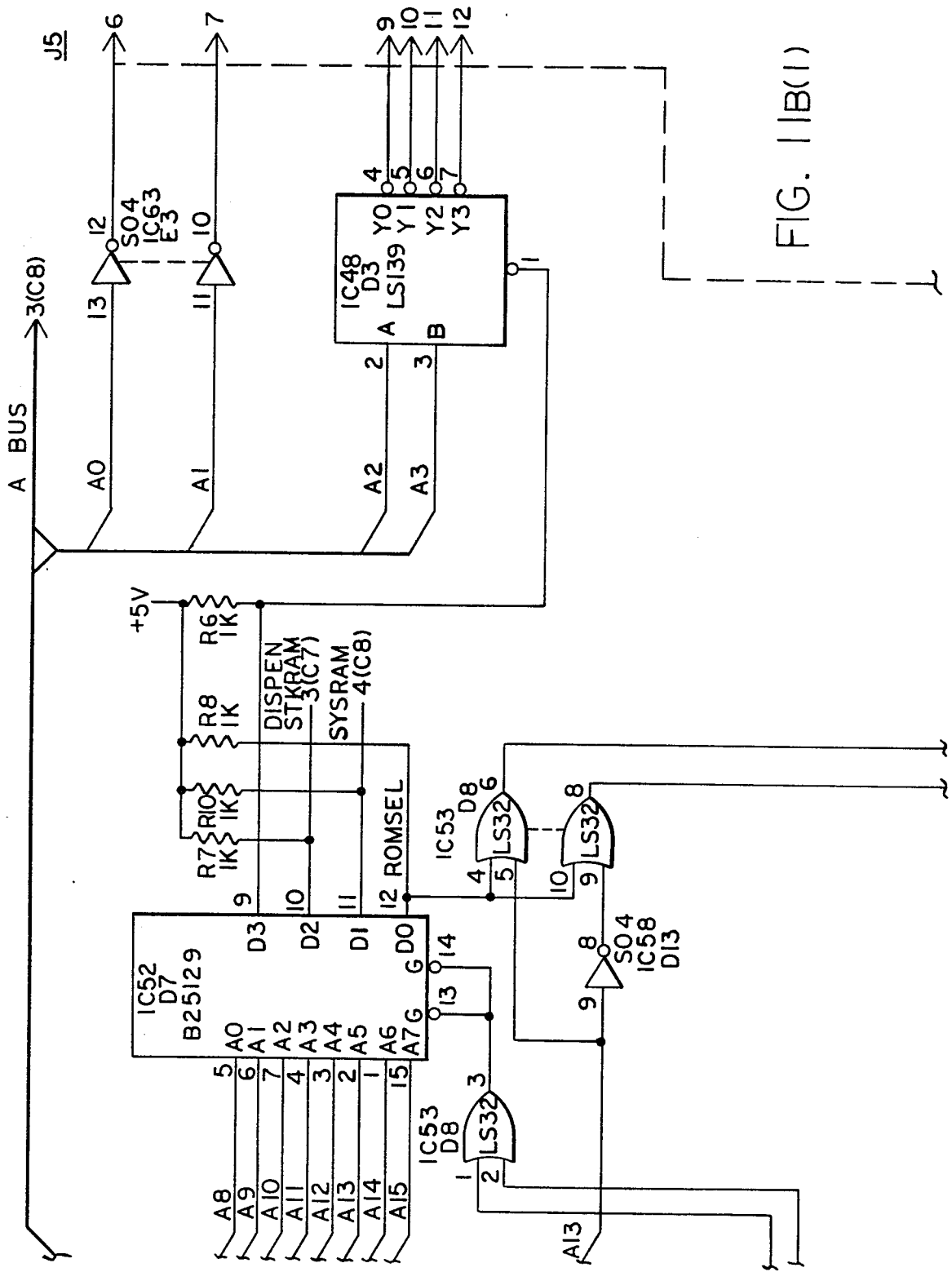
FIG. 11B(1)

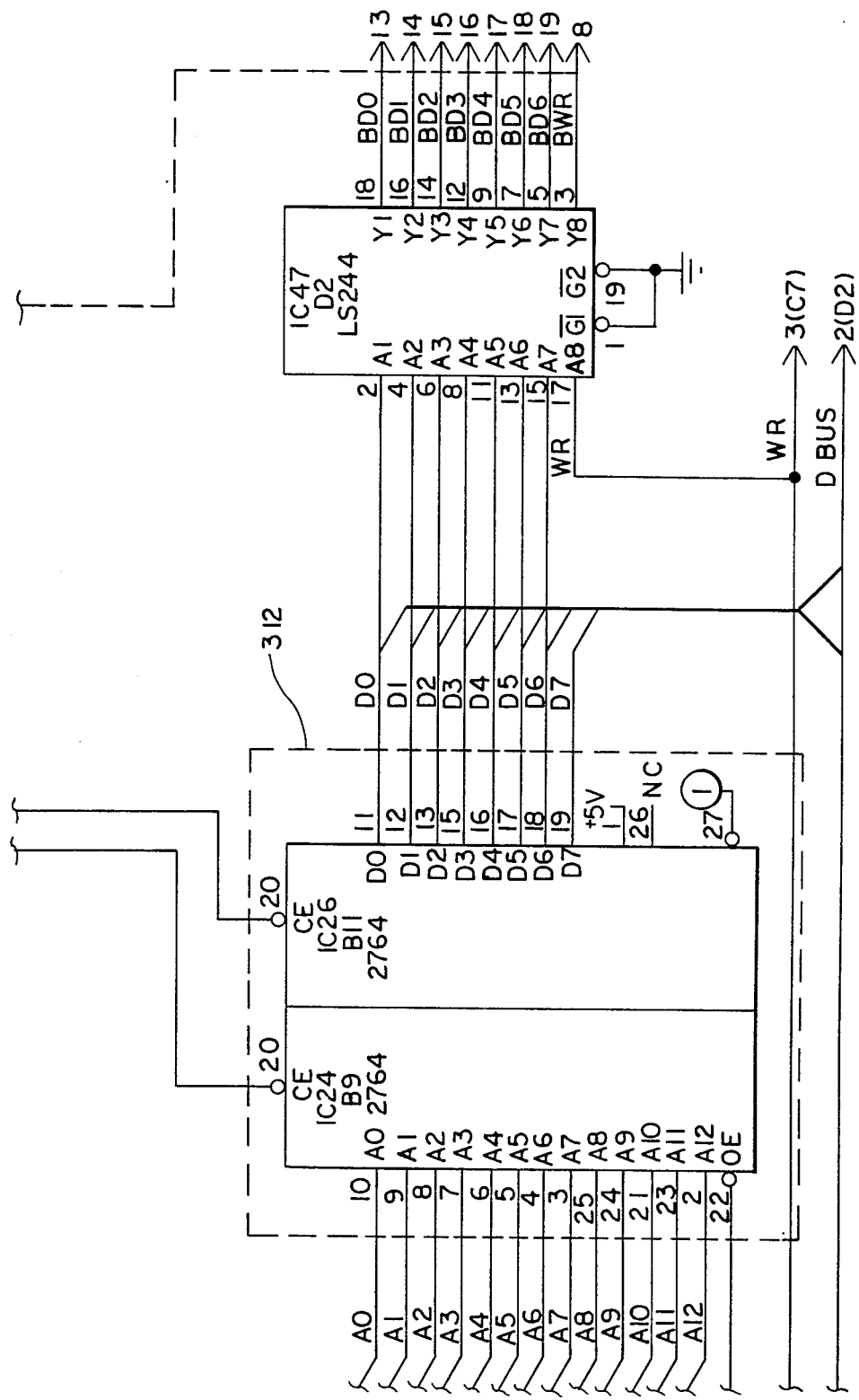
FIG. 11B(2)

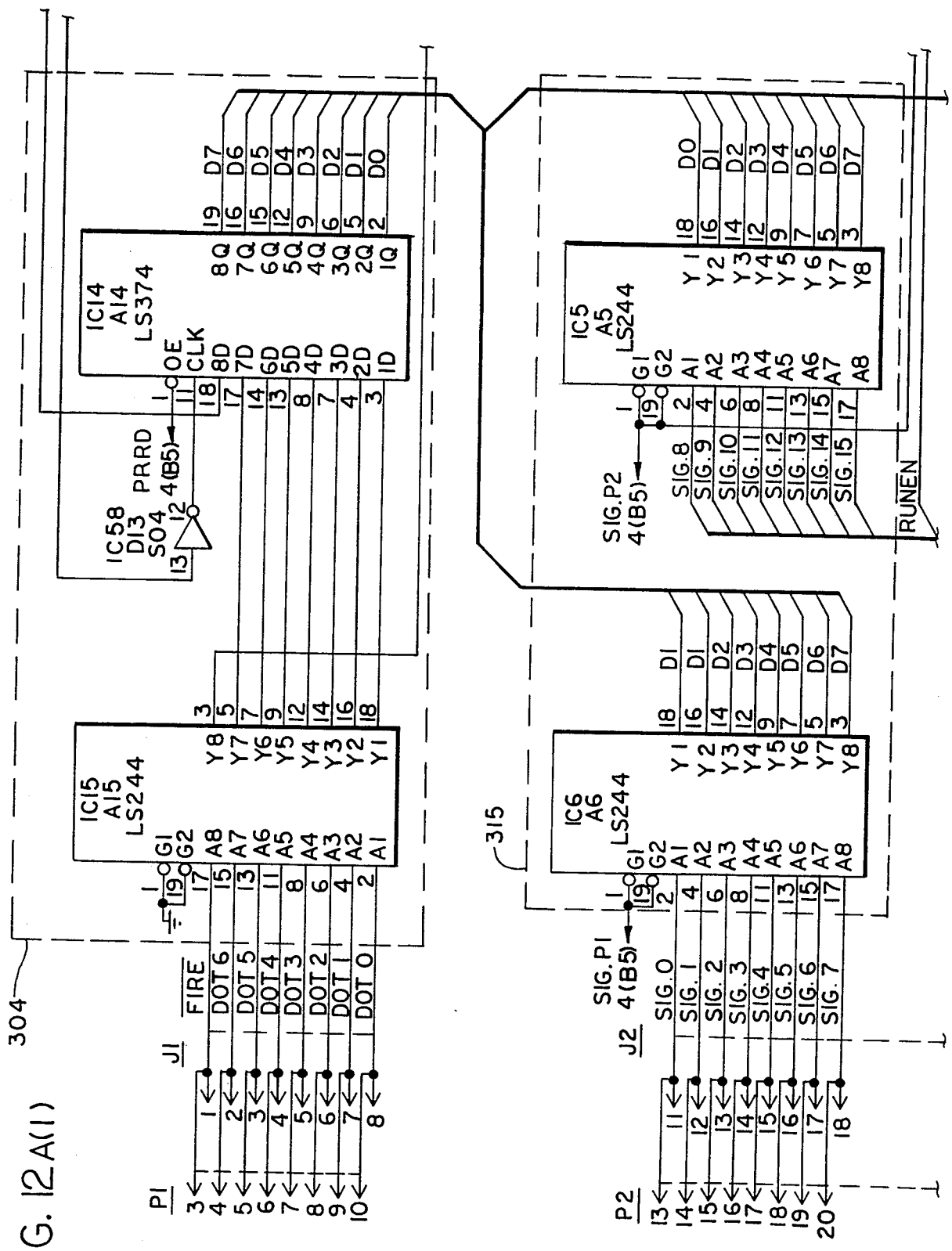
FIG. 12A(1)

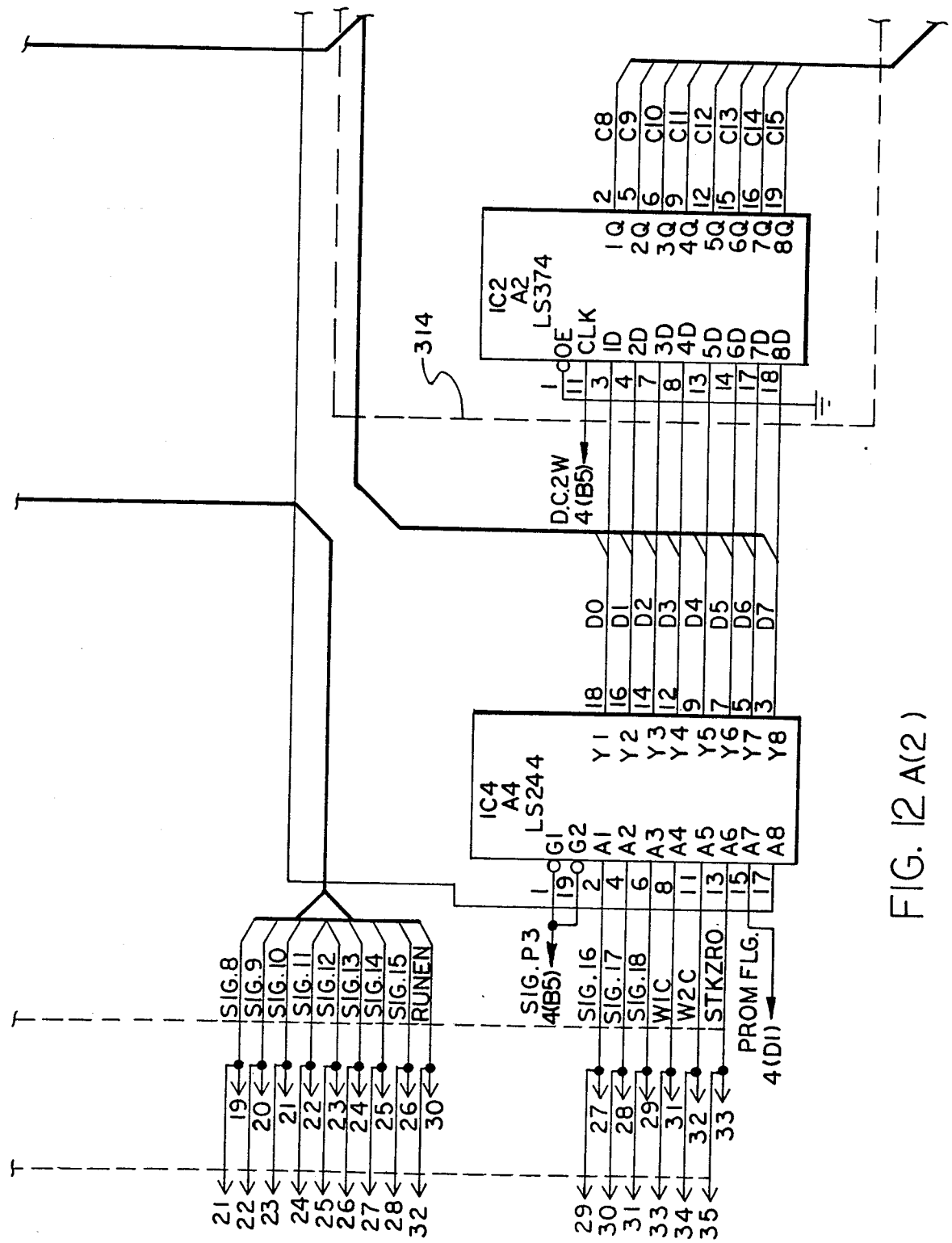
FIG. 12 A(2)

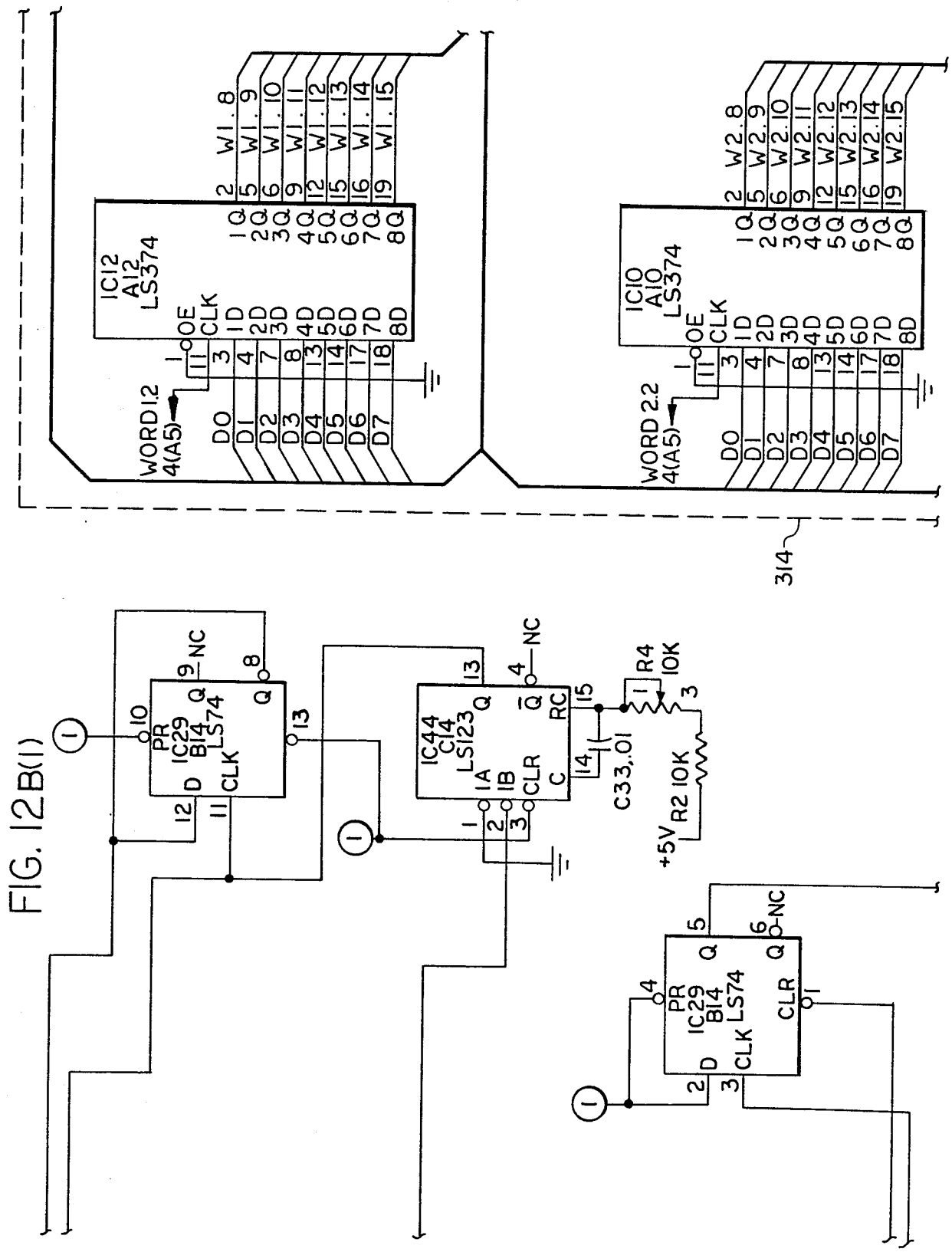

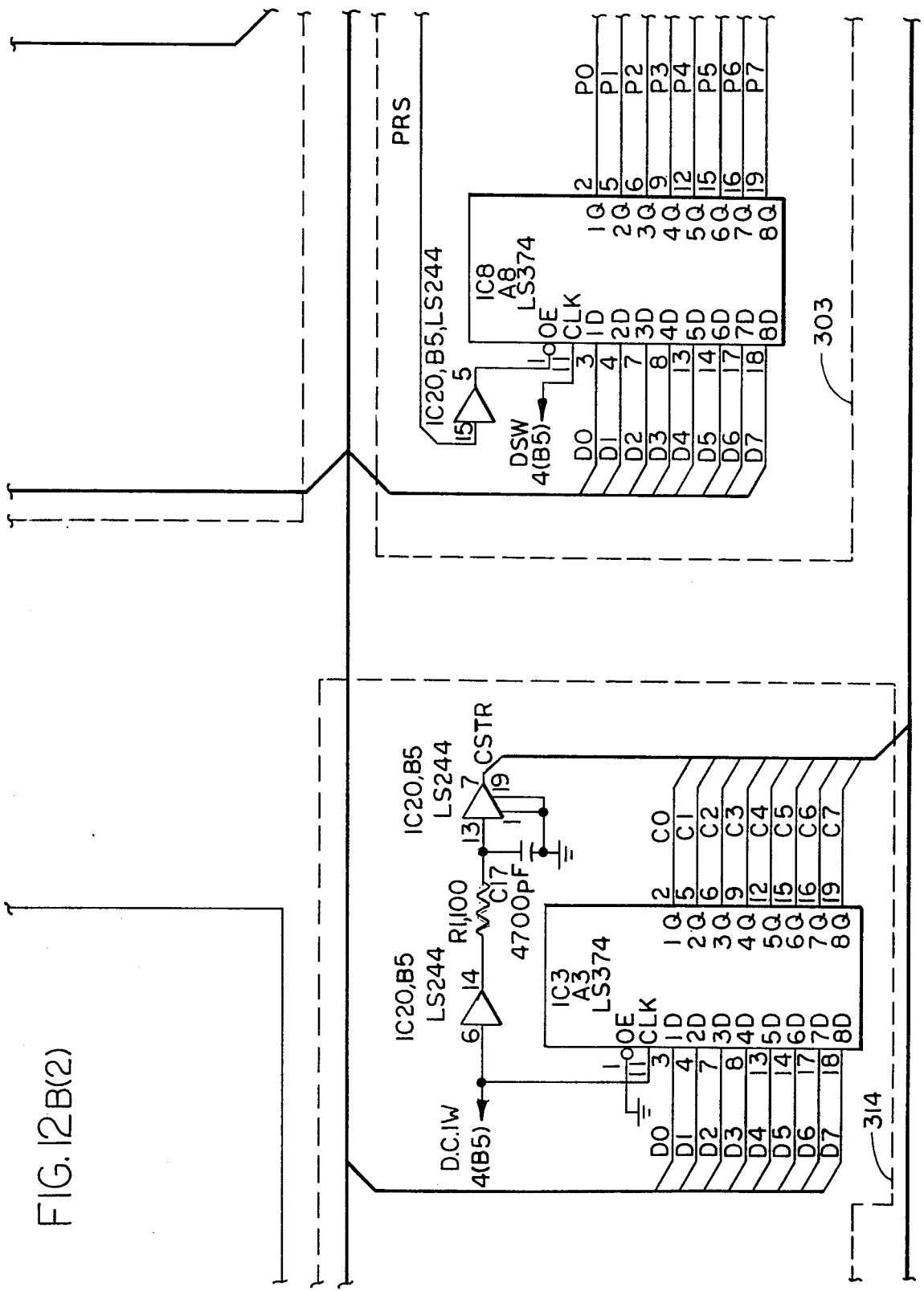
FIG. 12B(2)

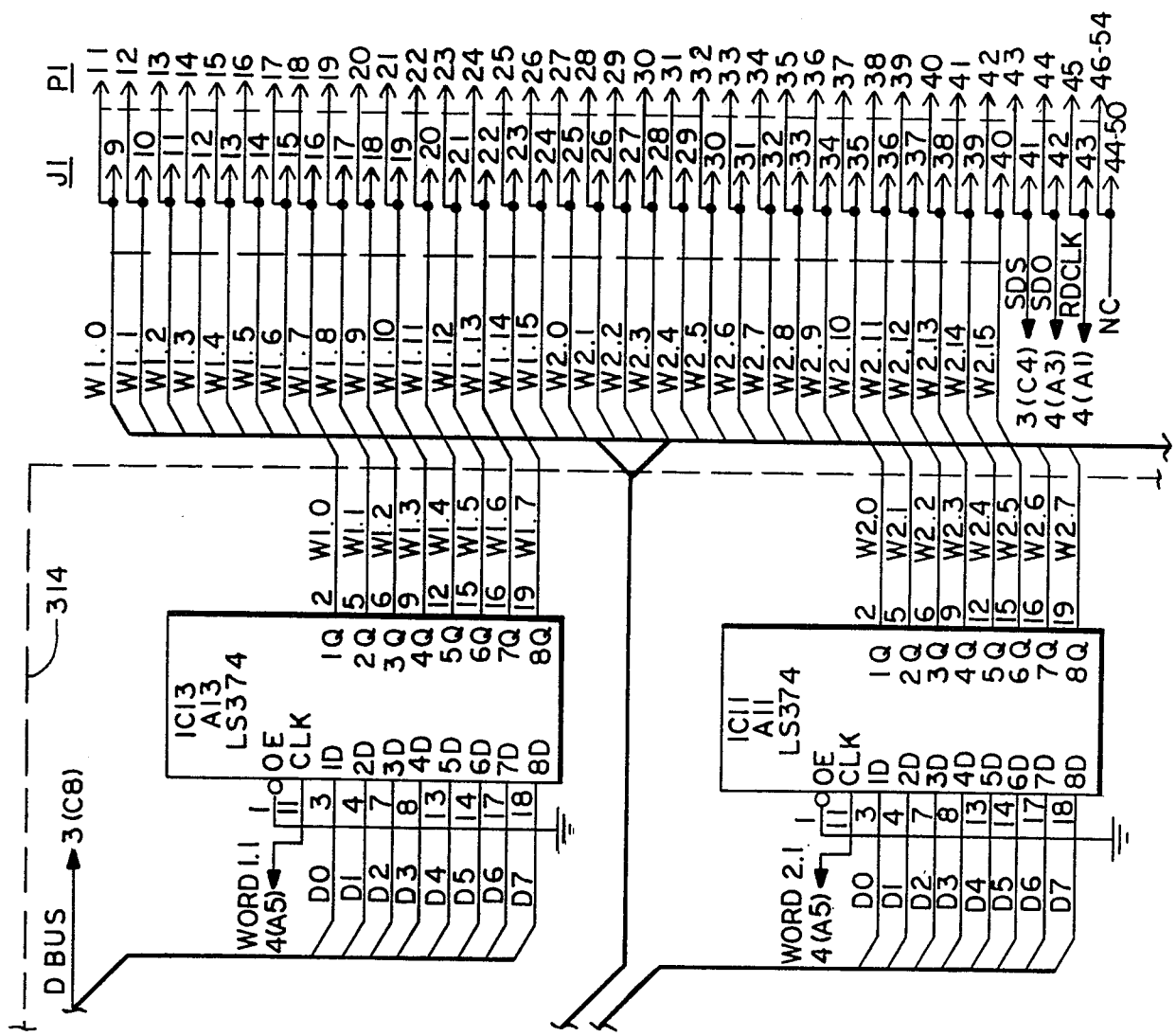
FIG. 12C(1)

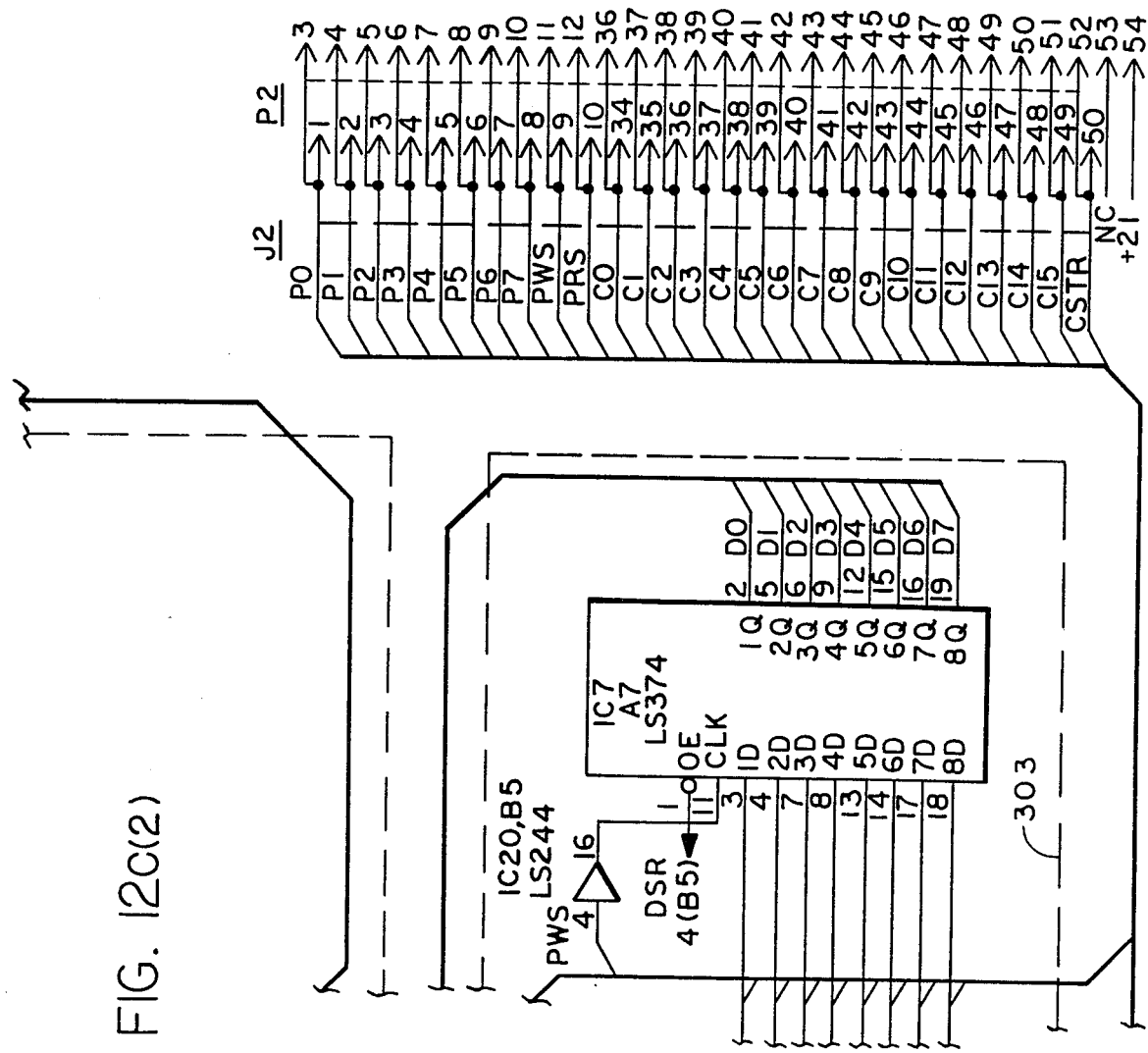
FIG. 12C(2)

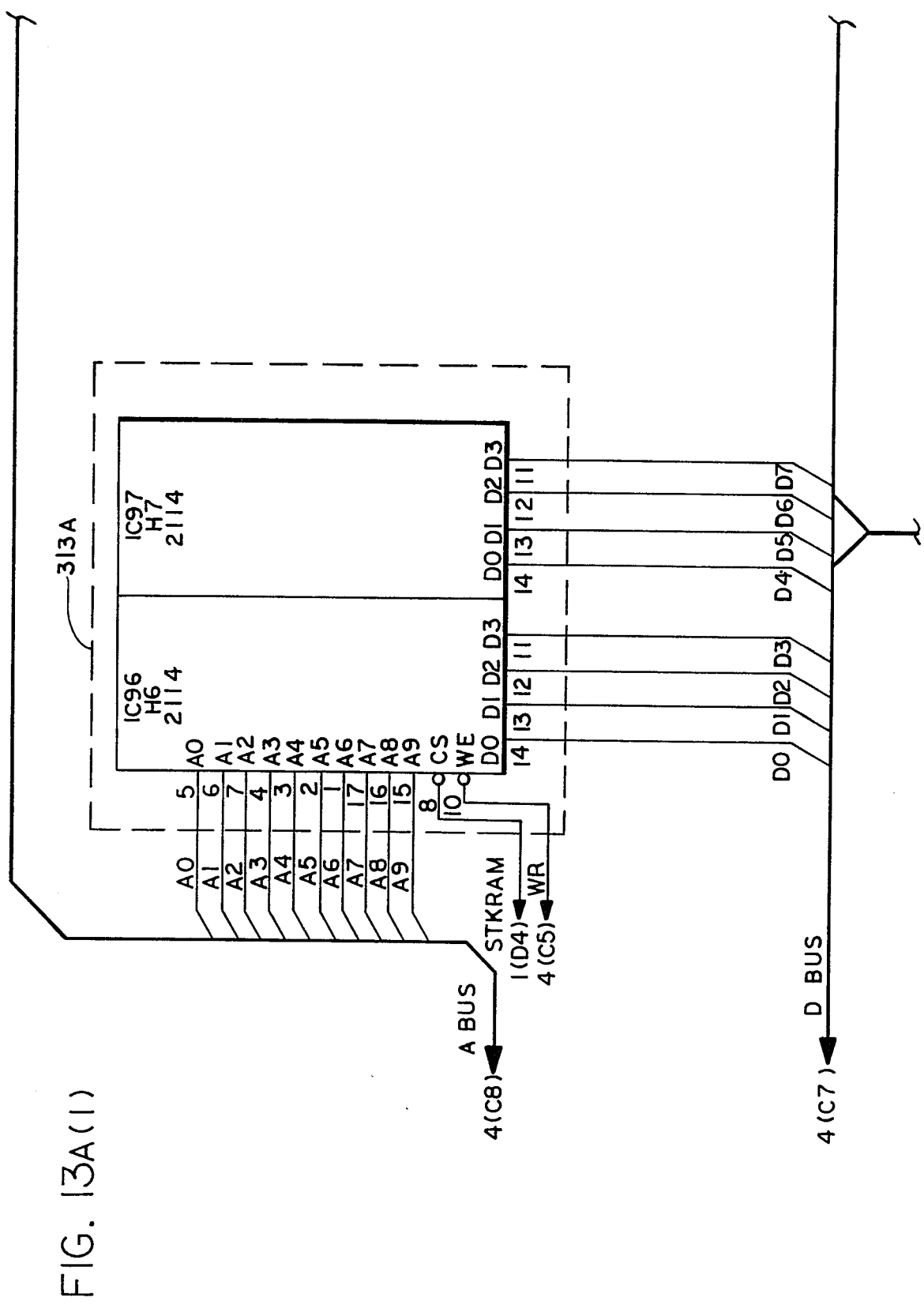
FIG. 13A(1)

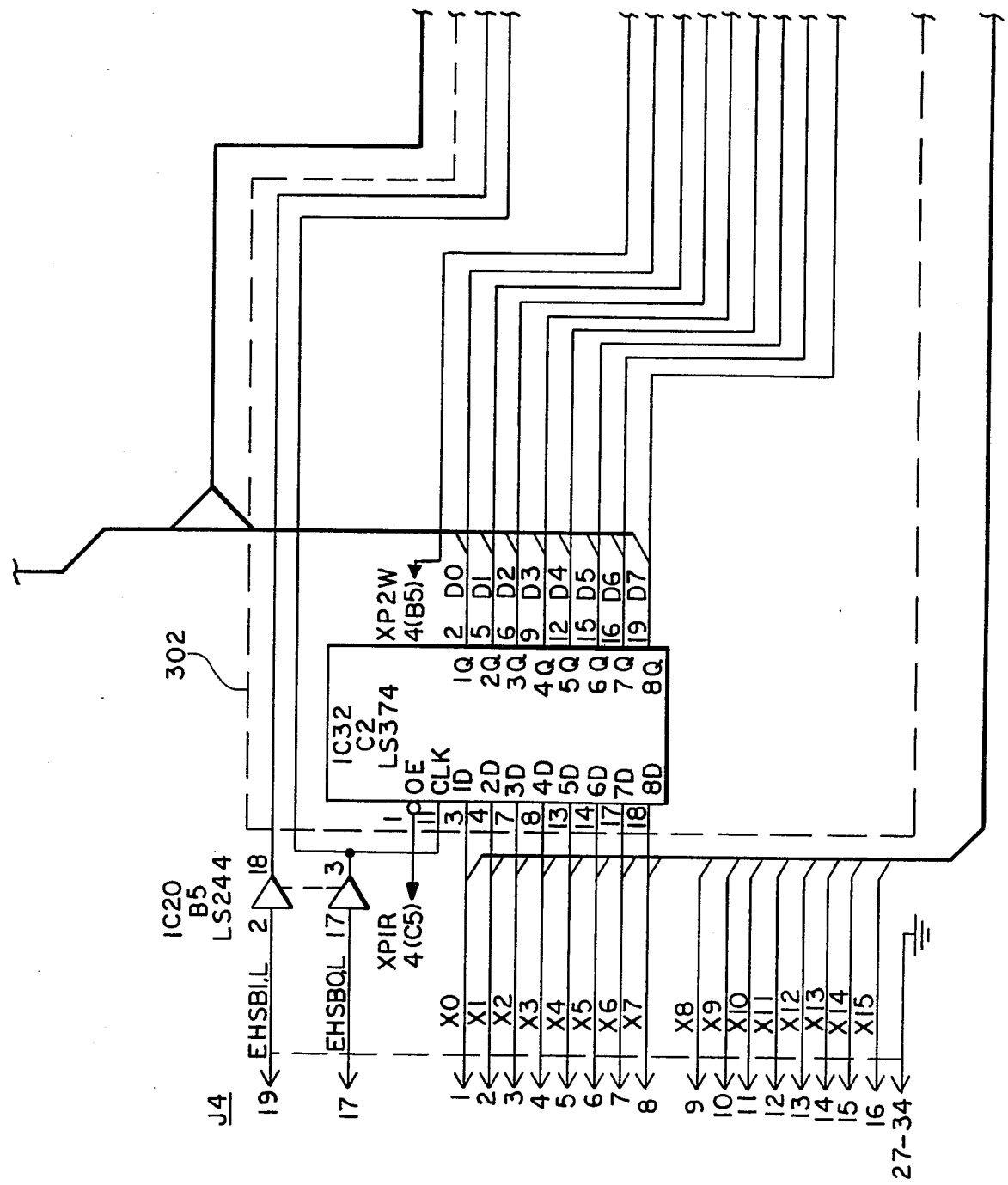
FIG. 13A(2)

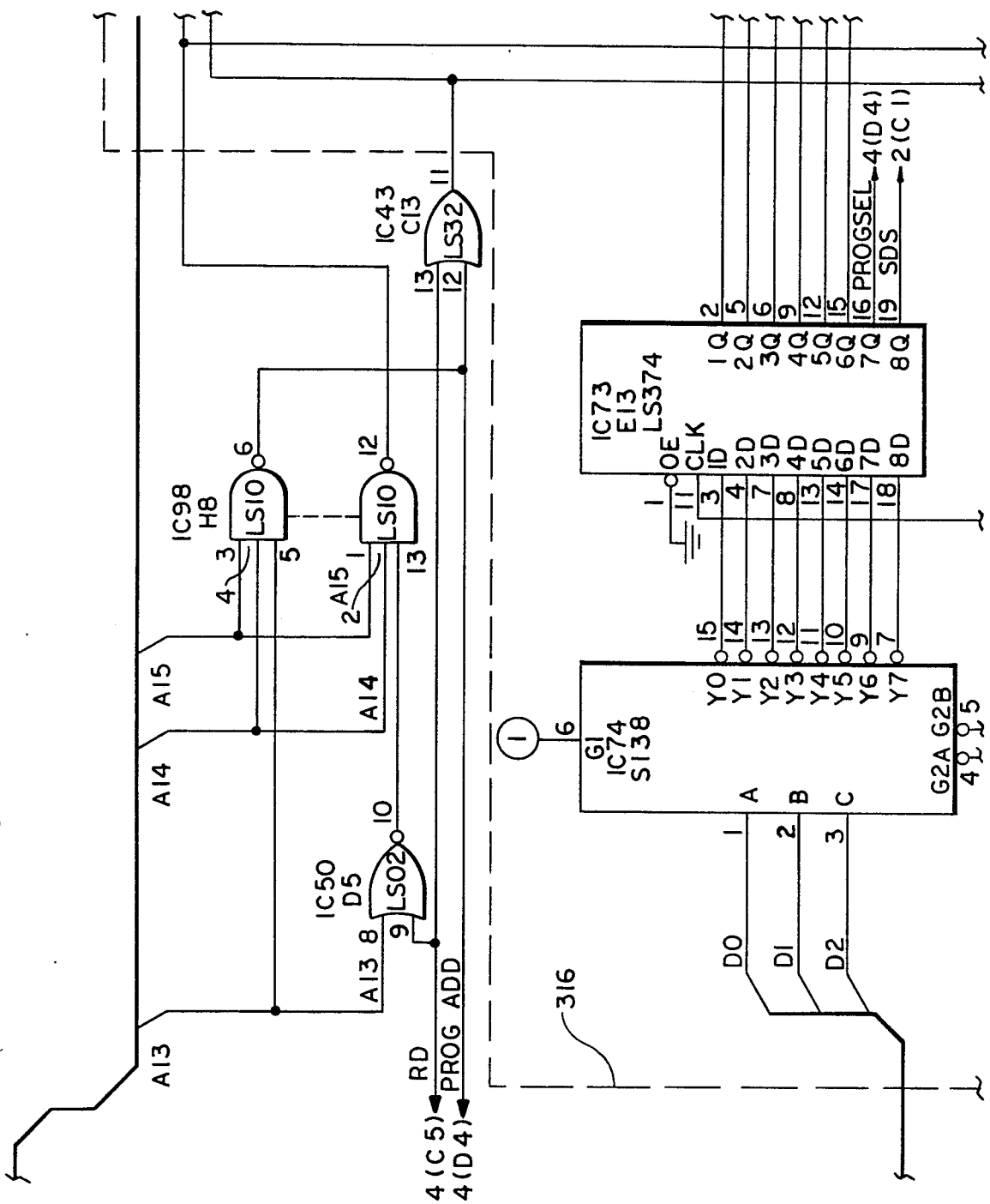
FIG. 13B(1)

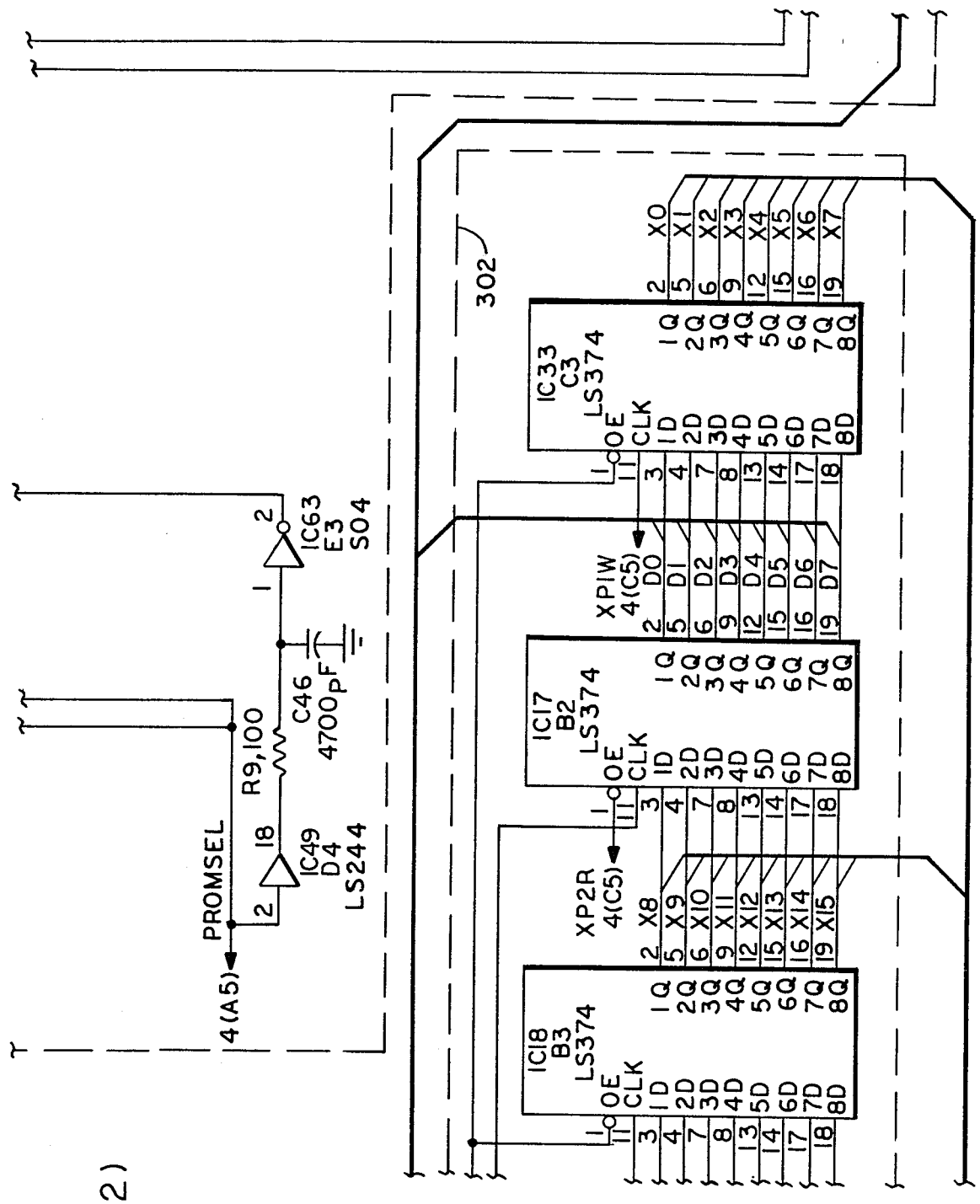
FIG. 13B(2)

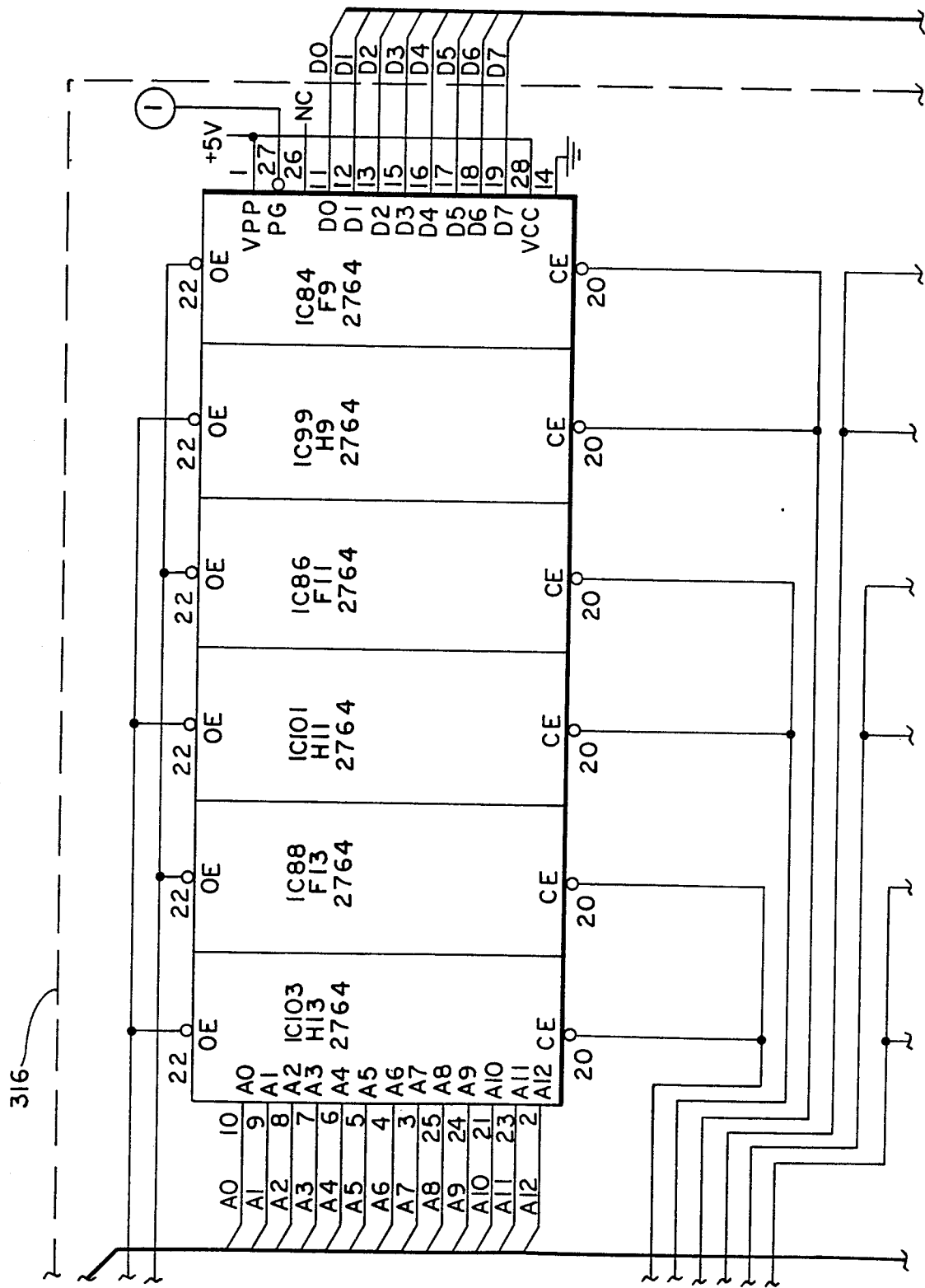
FIG. 13C(1)

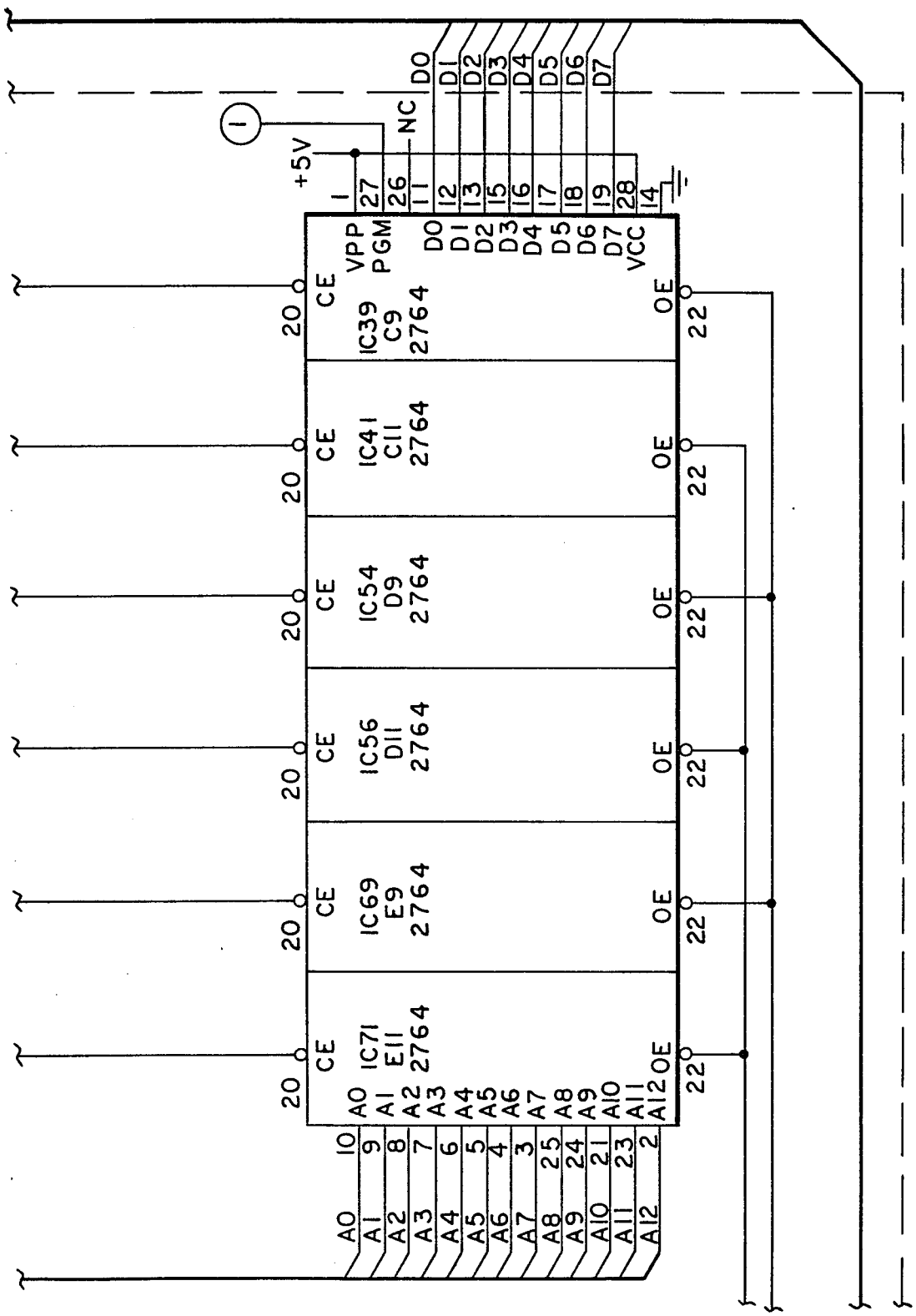
FIG. 13c(2)

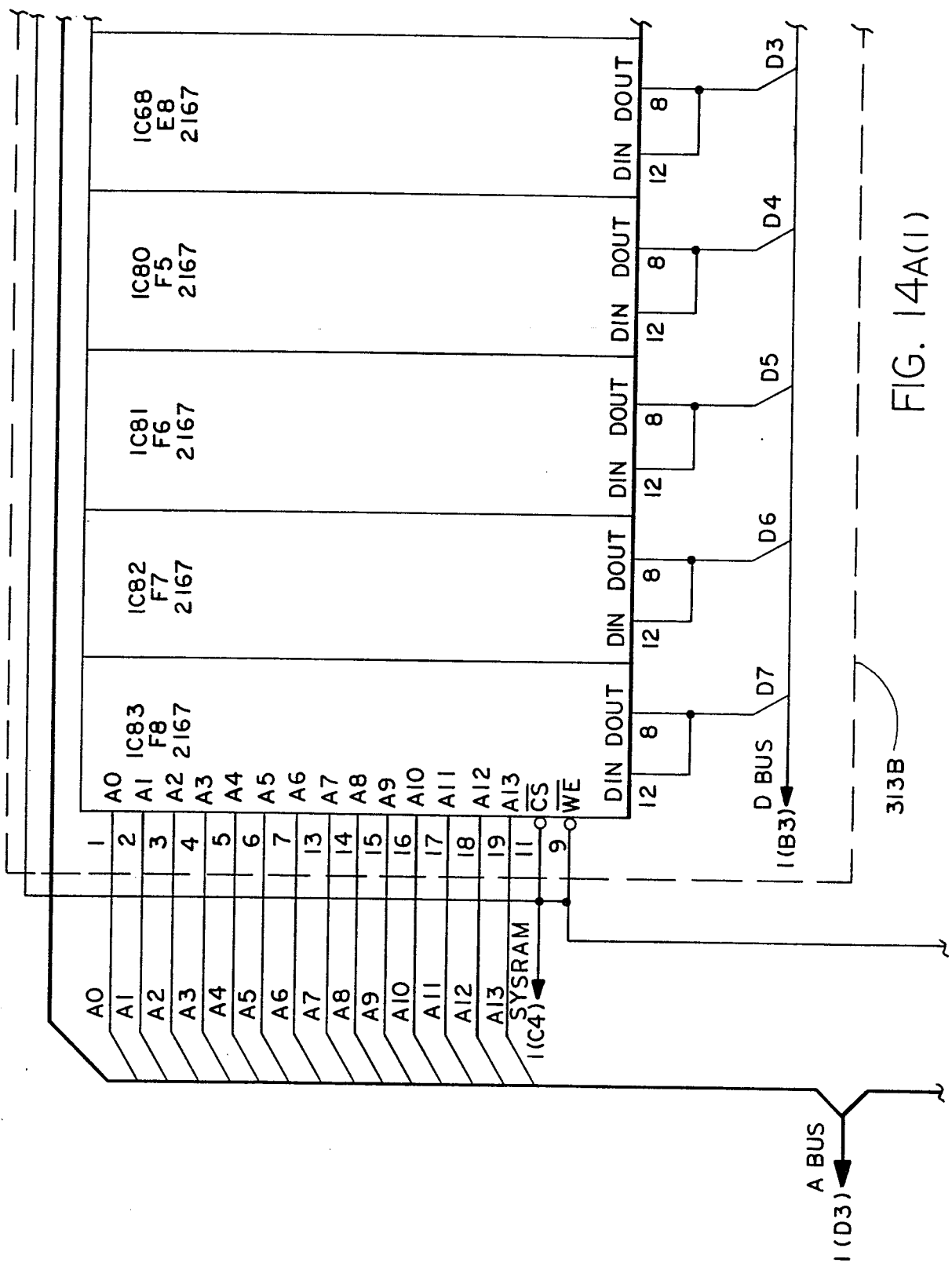
FIG. 14A(1)

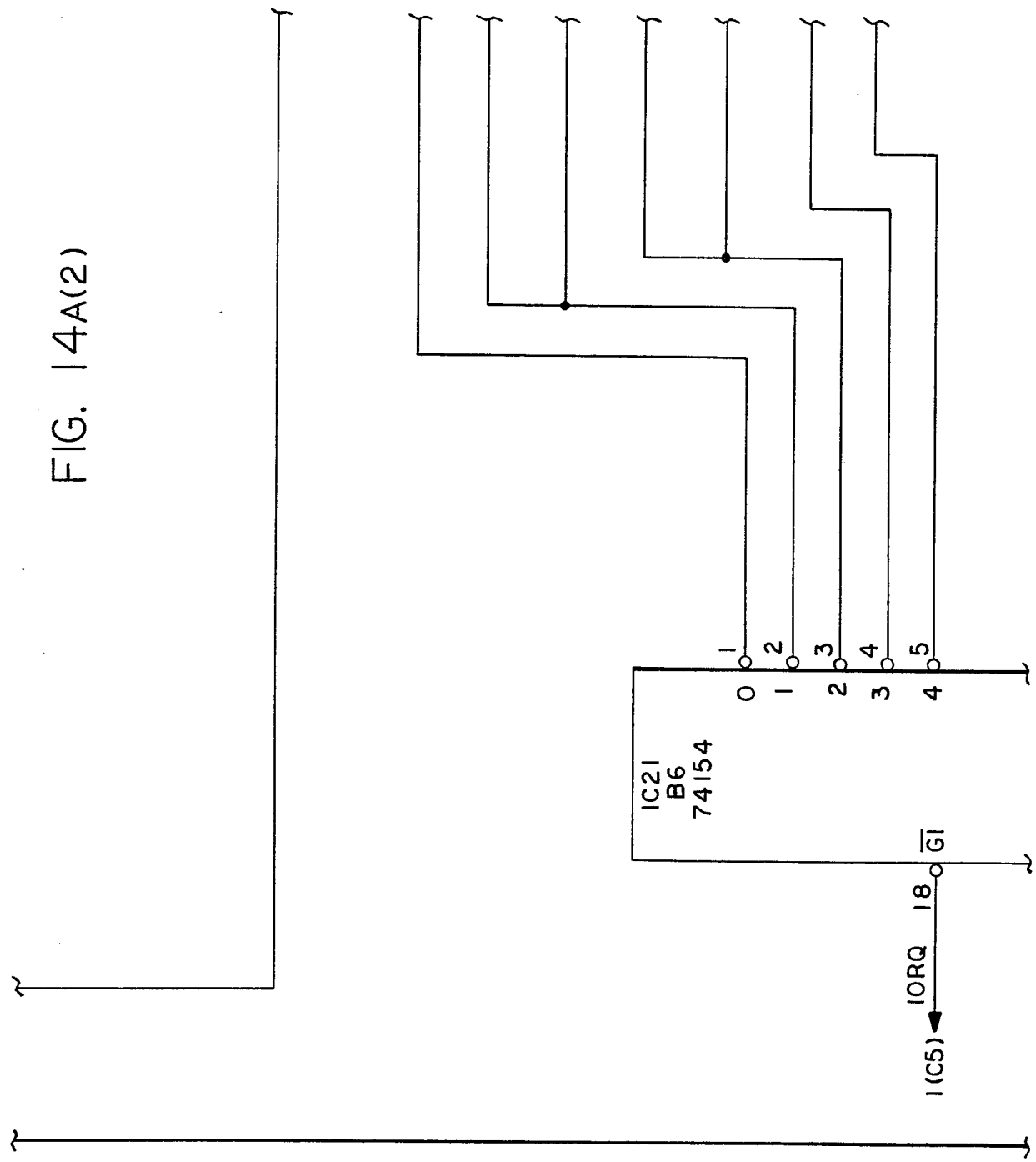
FIG. 14A(2)

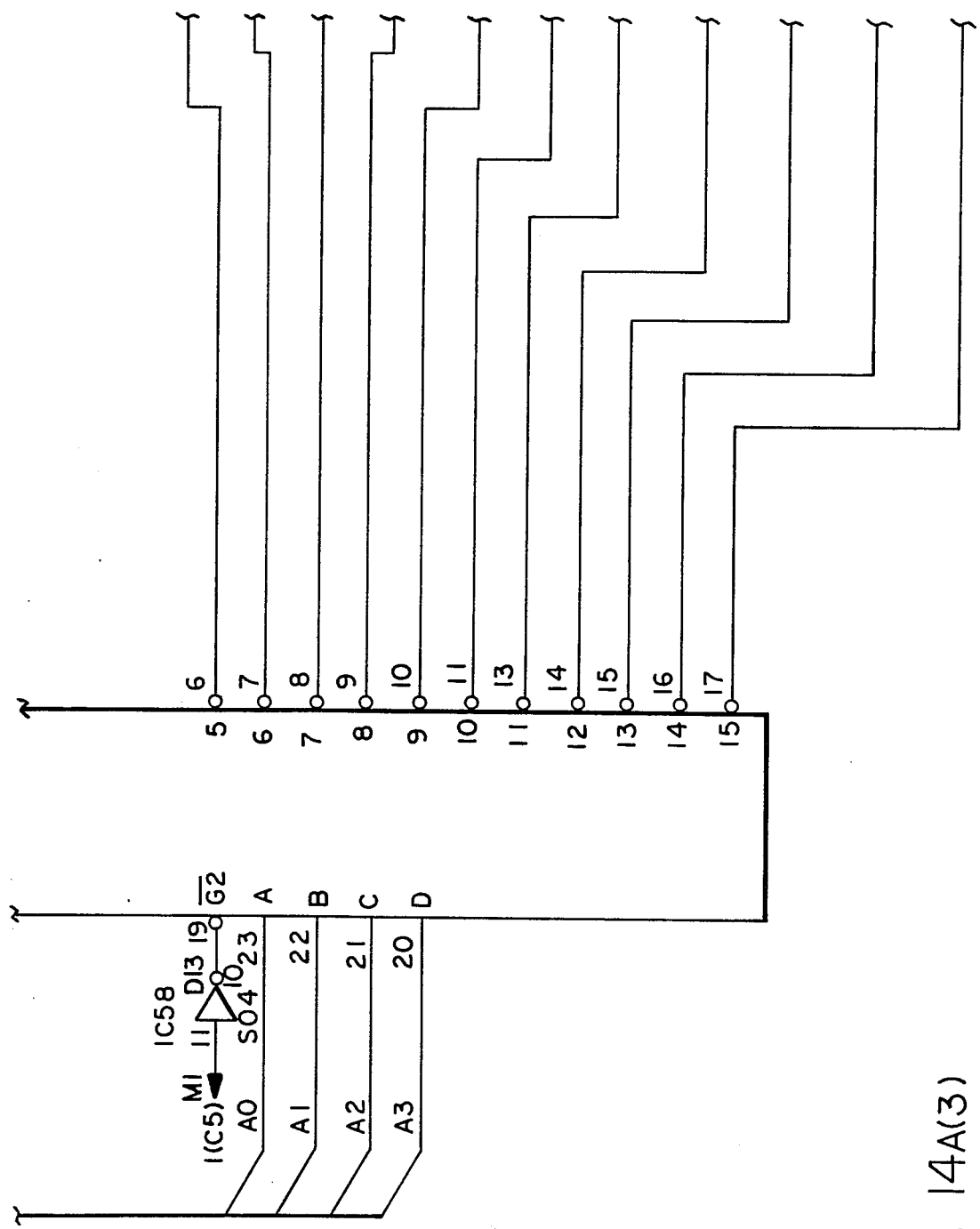
FIG. 14A(3)

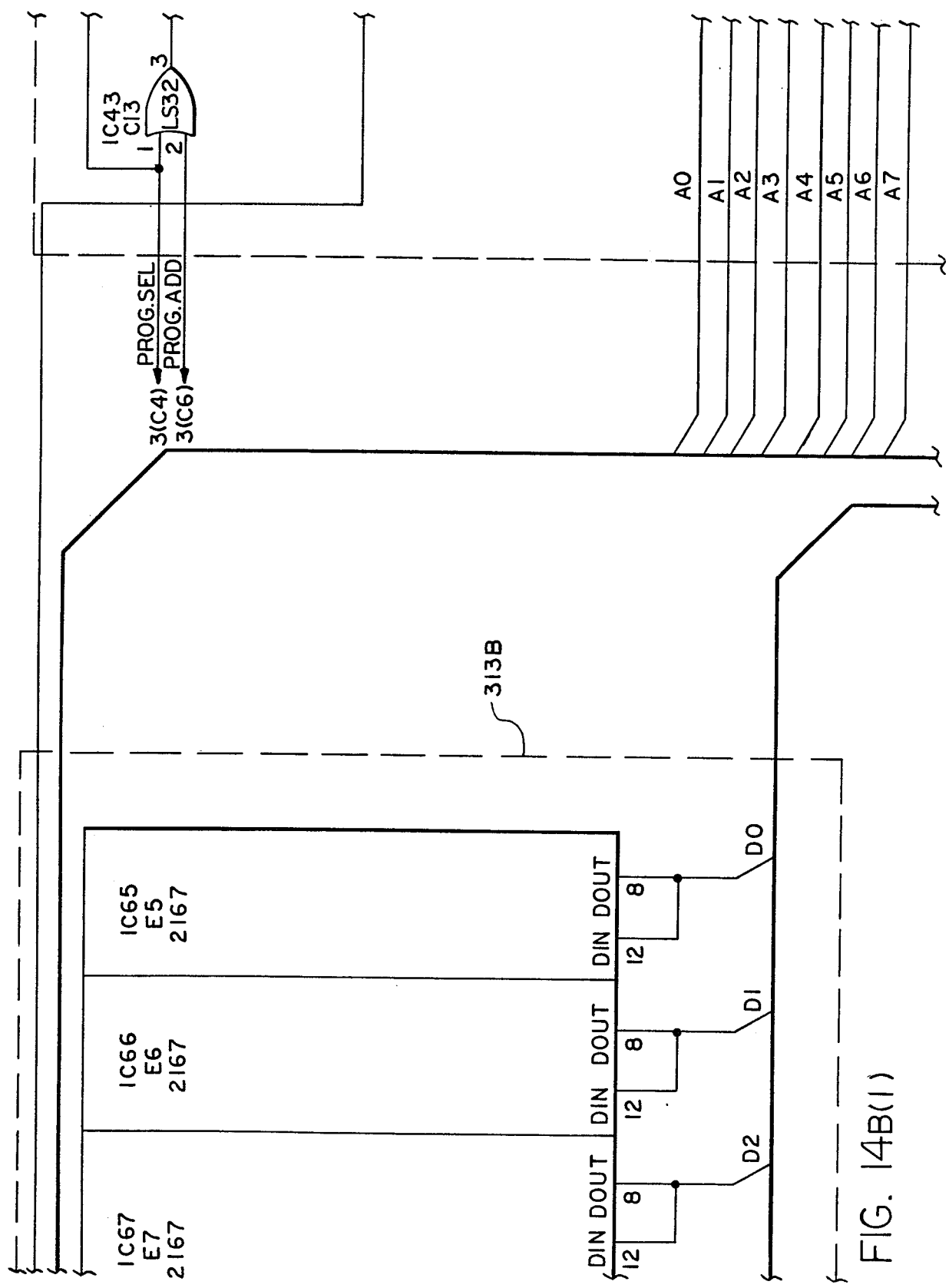
FIG. 14B(1)

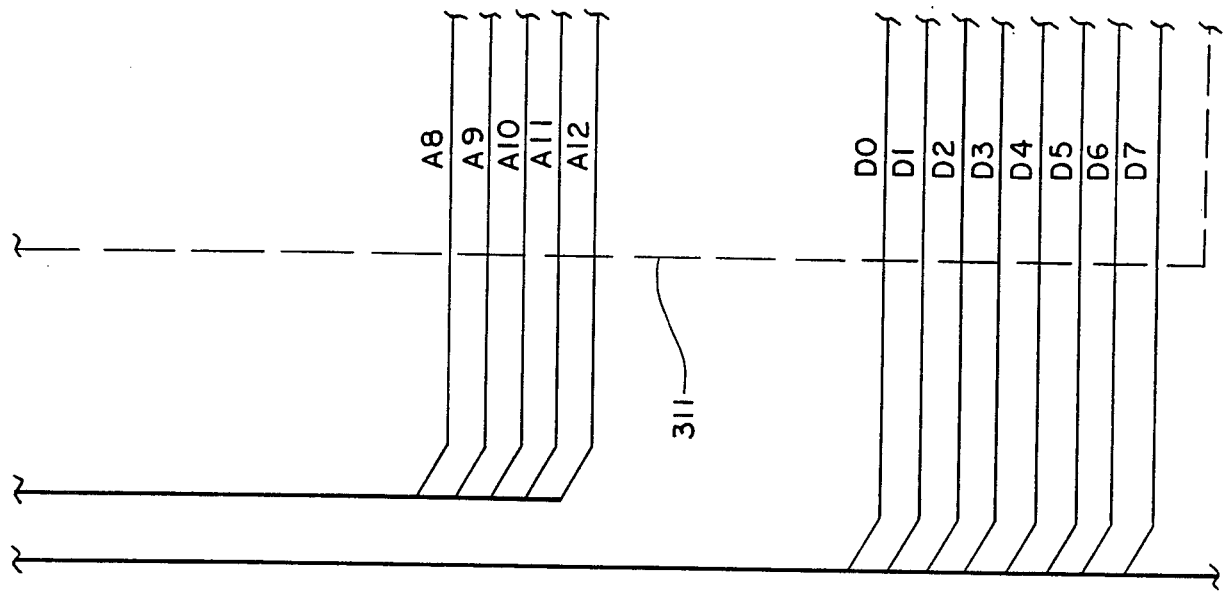
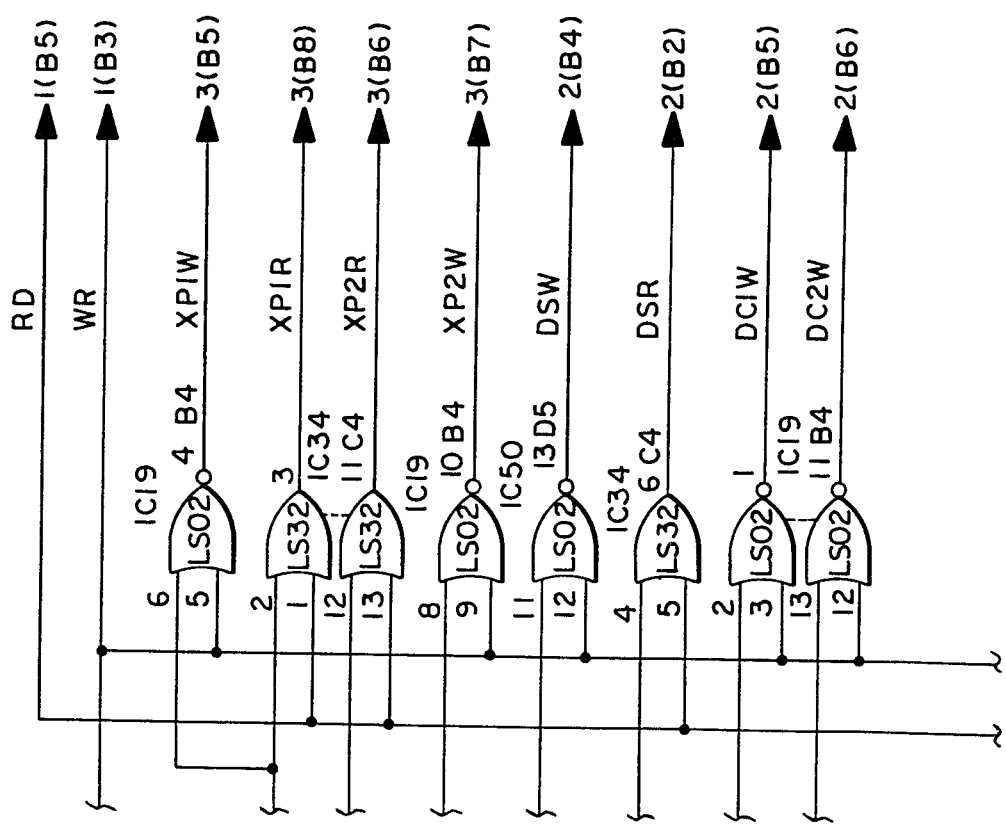
FIG. 14B(2)

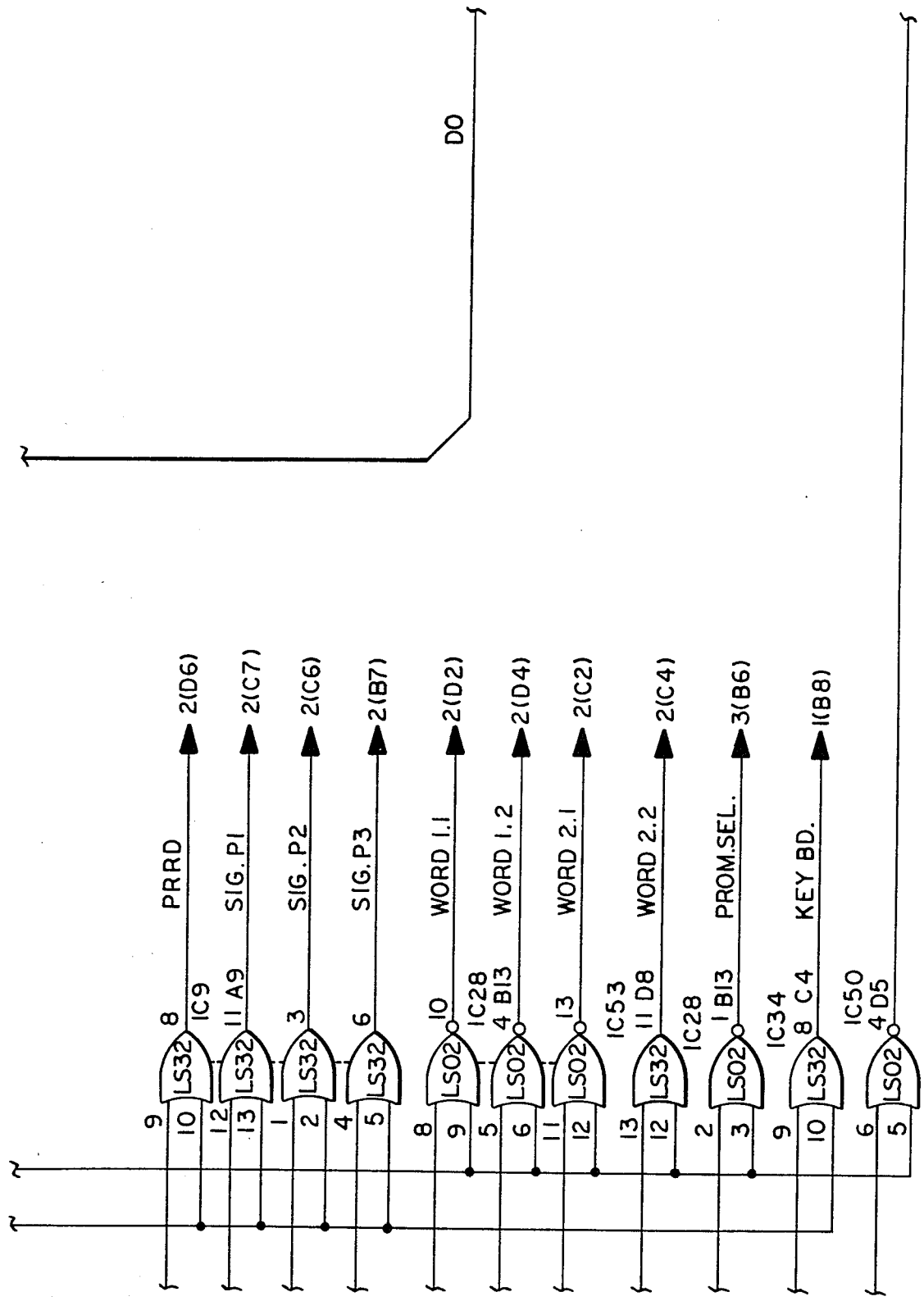
FIG. 14B(3)

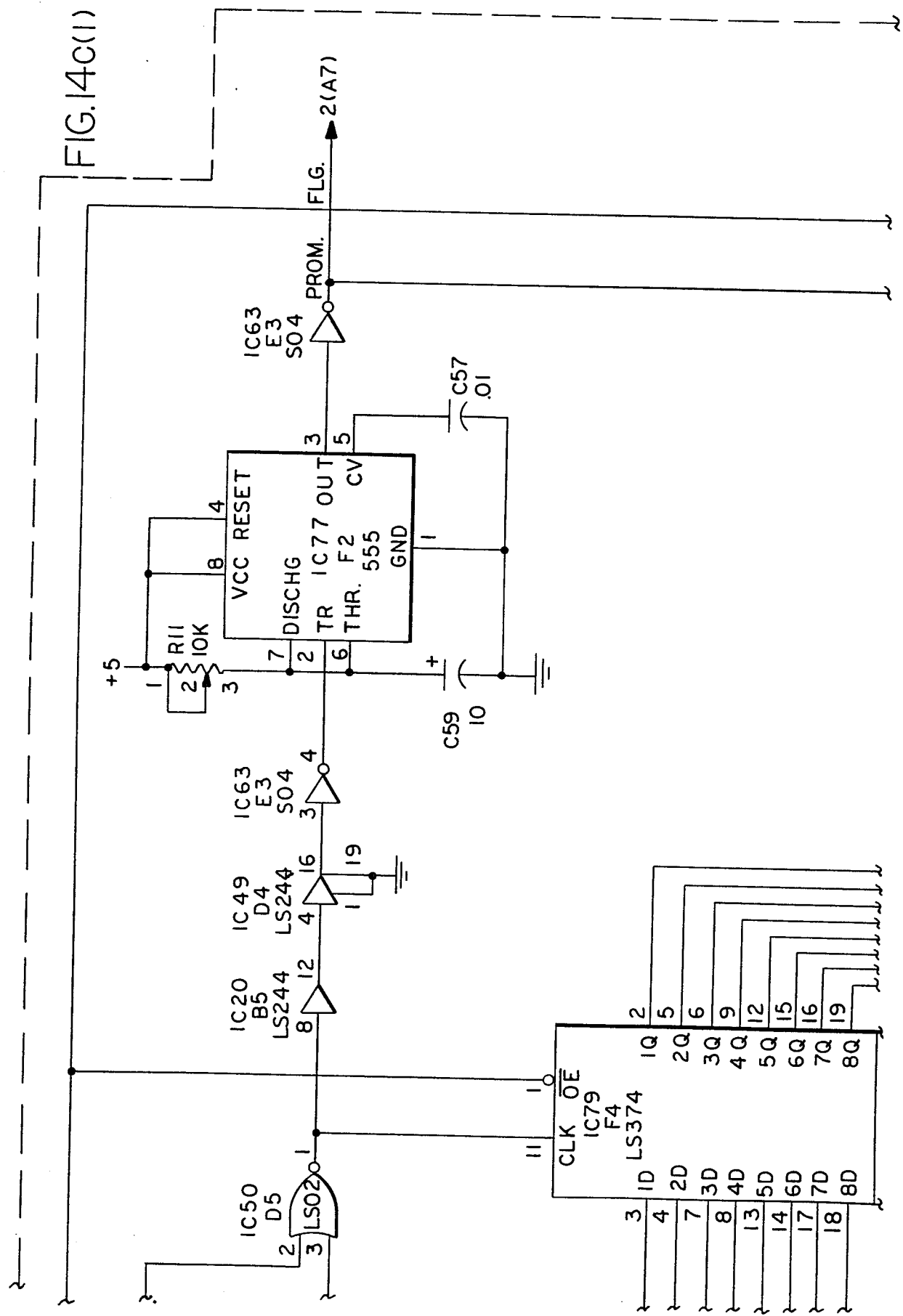

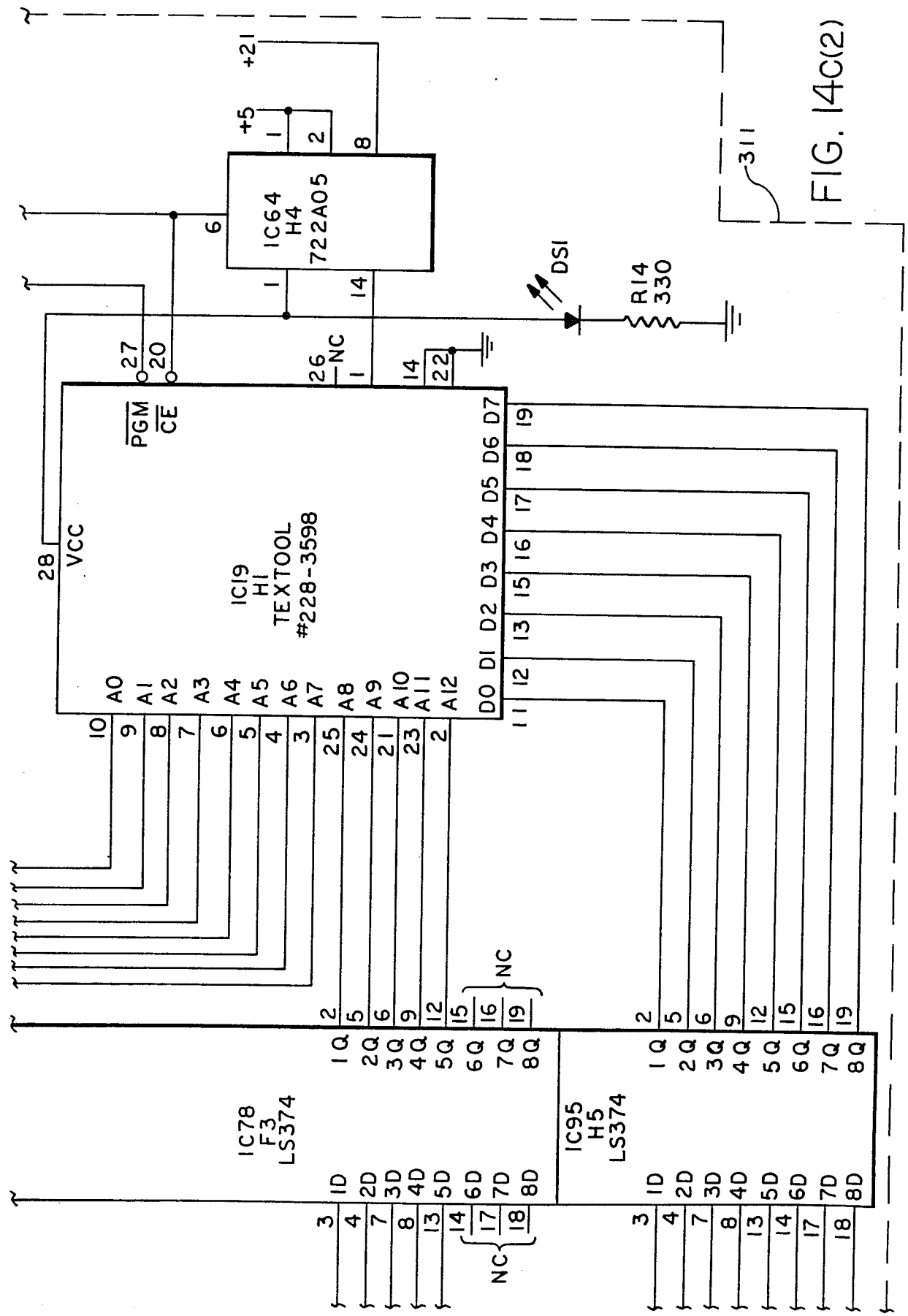
FIG. 14C(2)

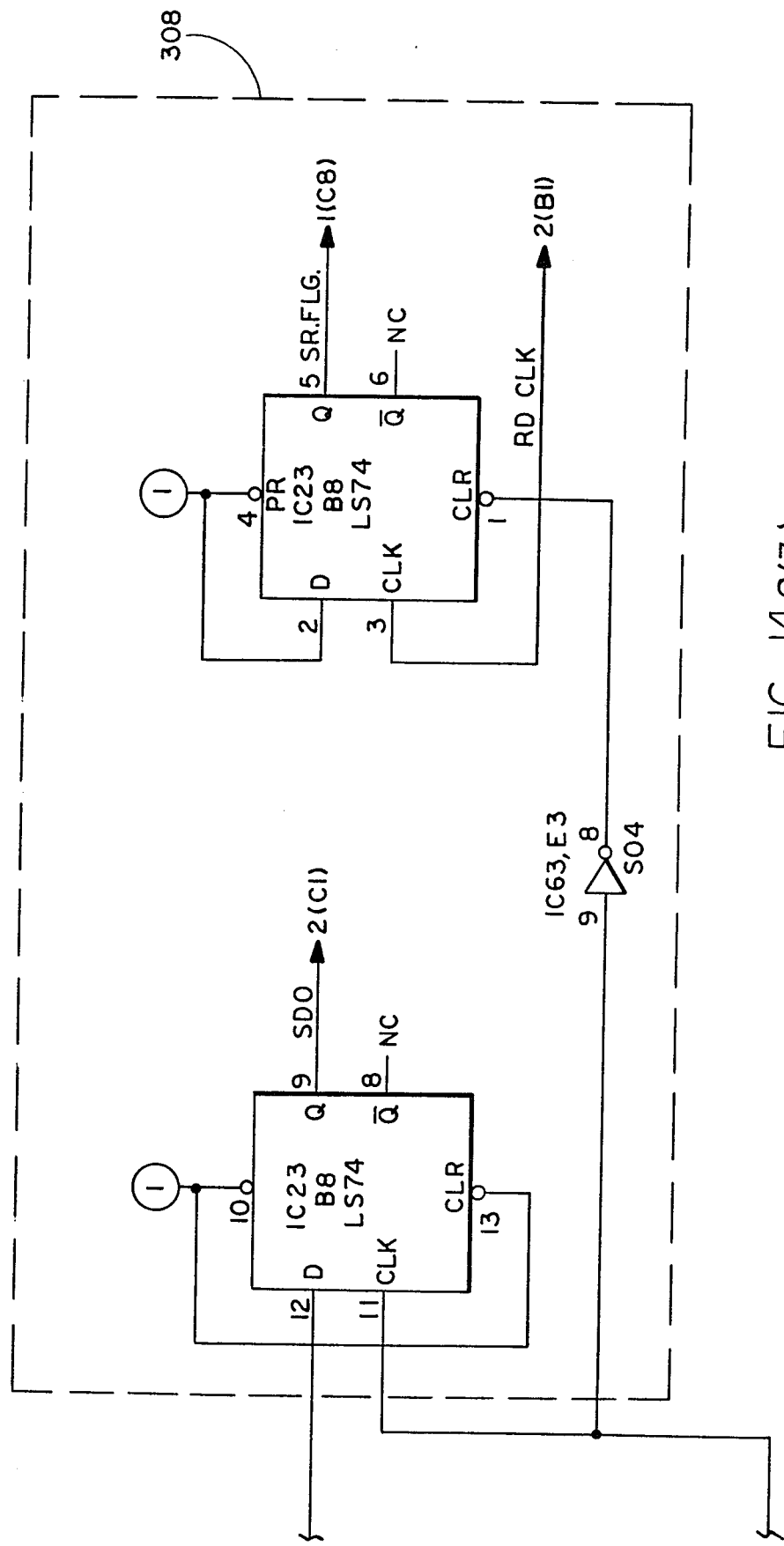
FIG. 14C(3)

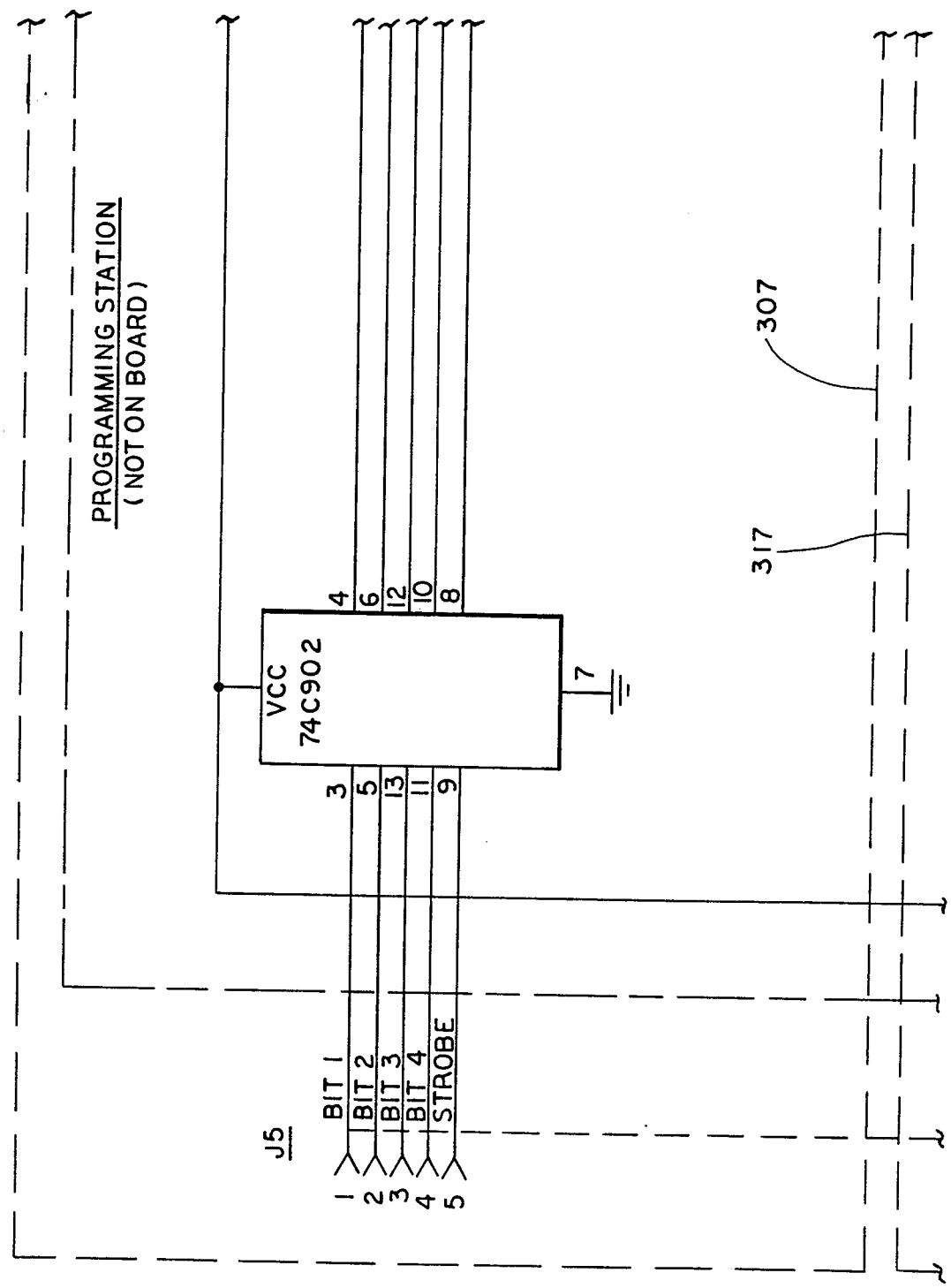
FIG. 15A(1)

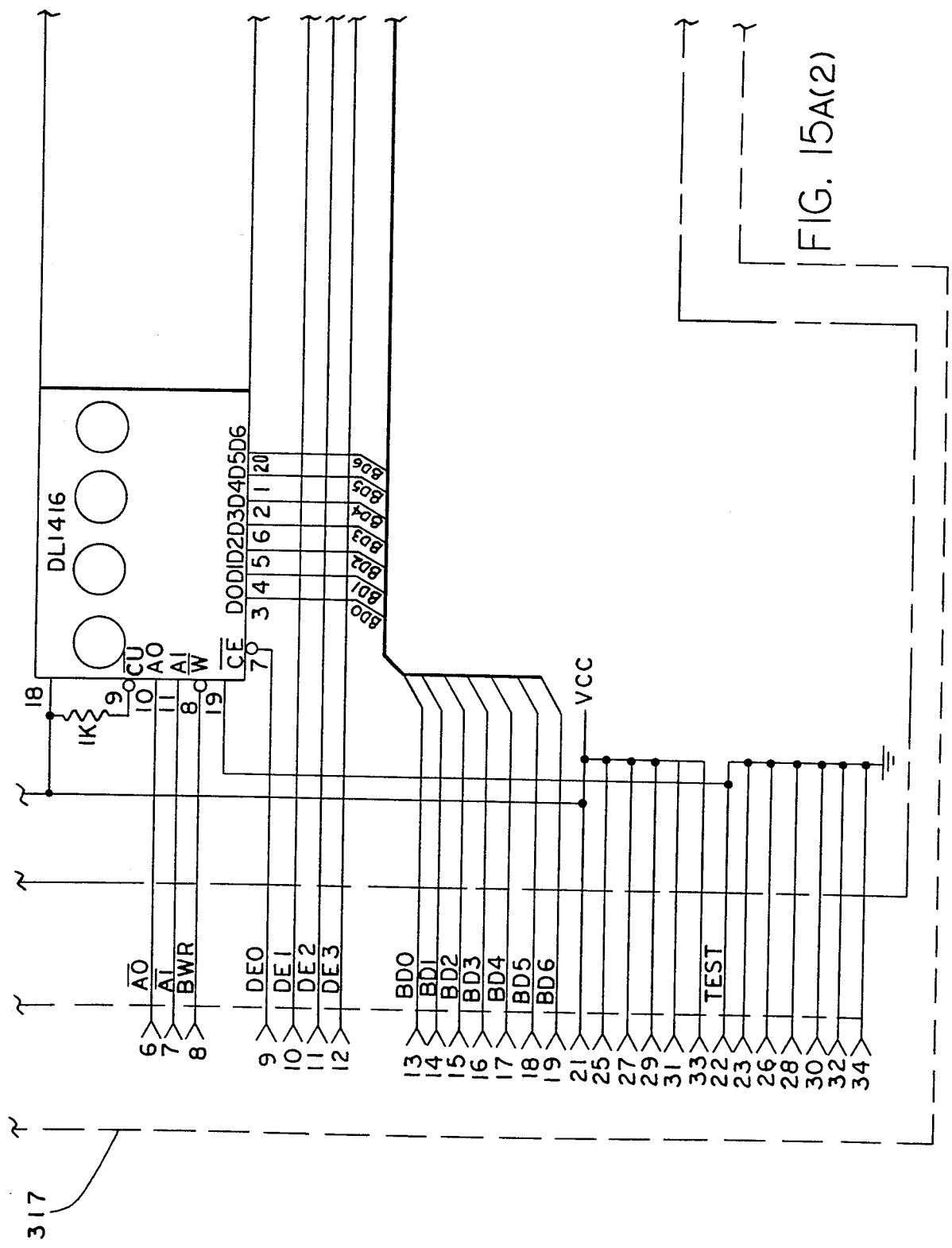

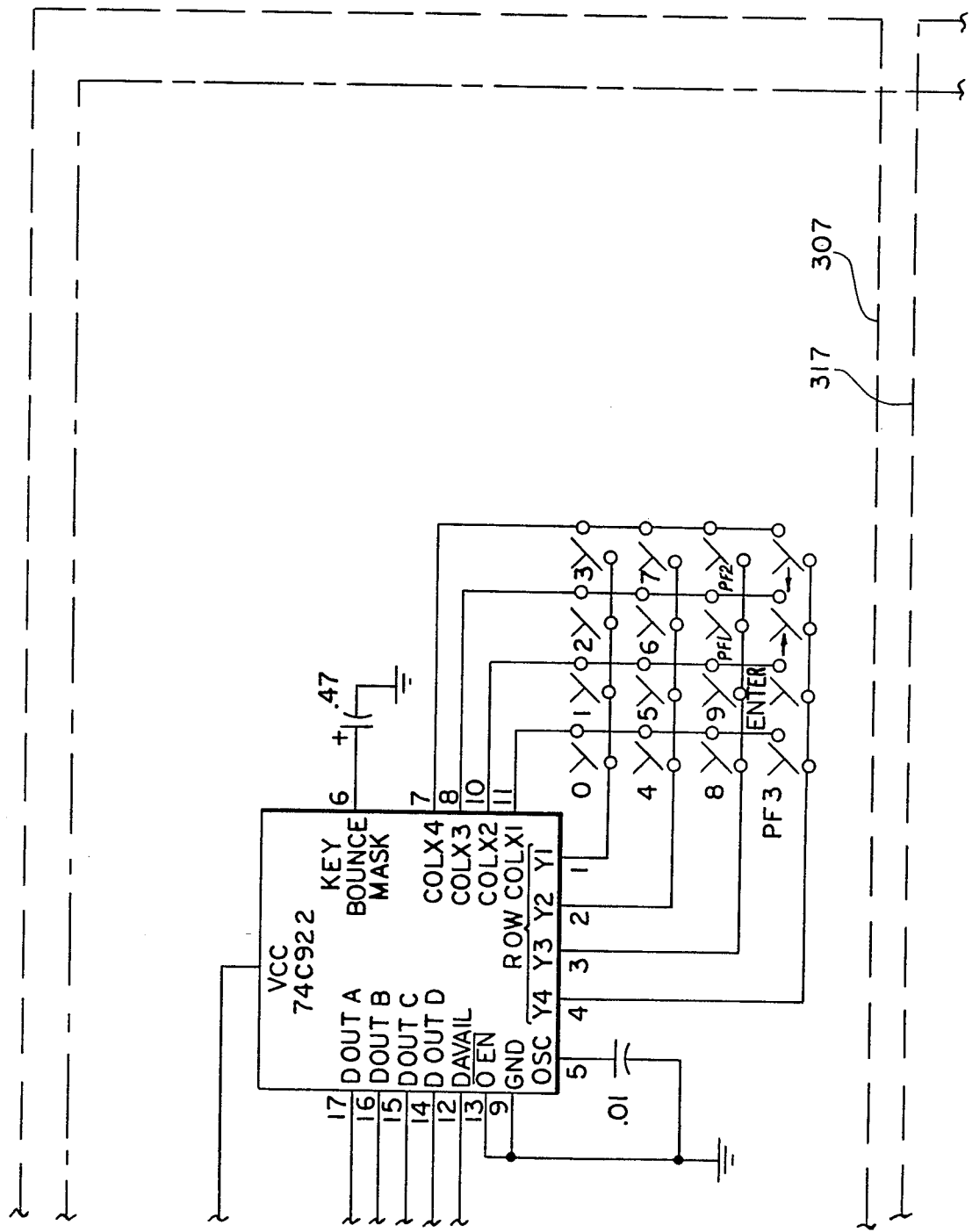
FIG. 15B(1)

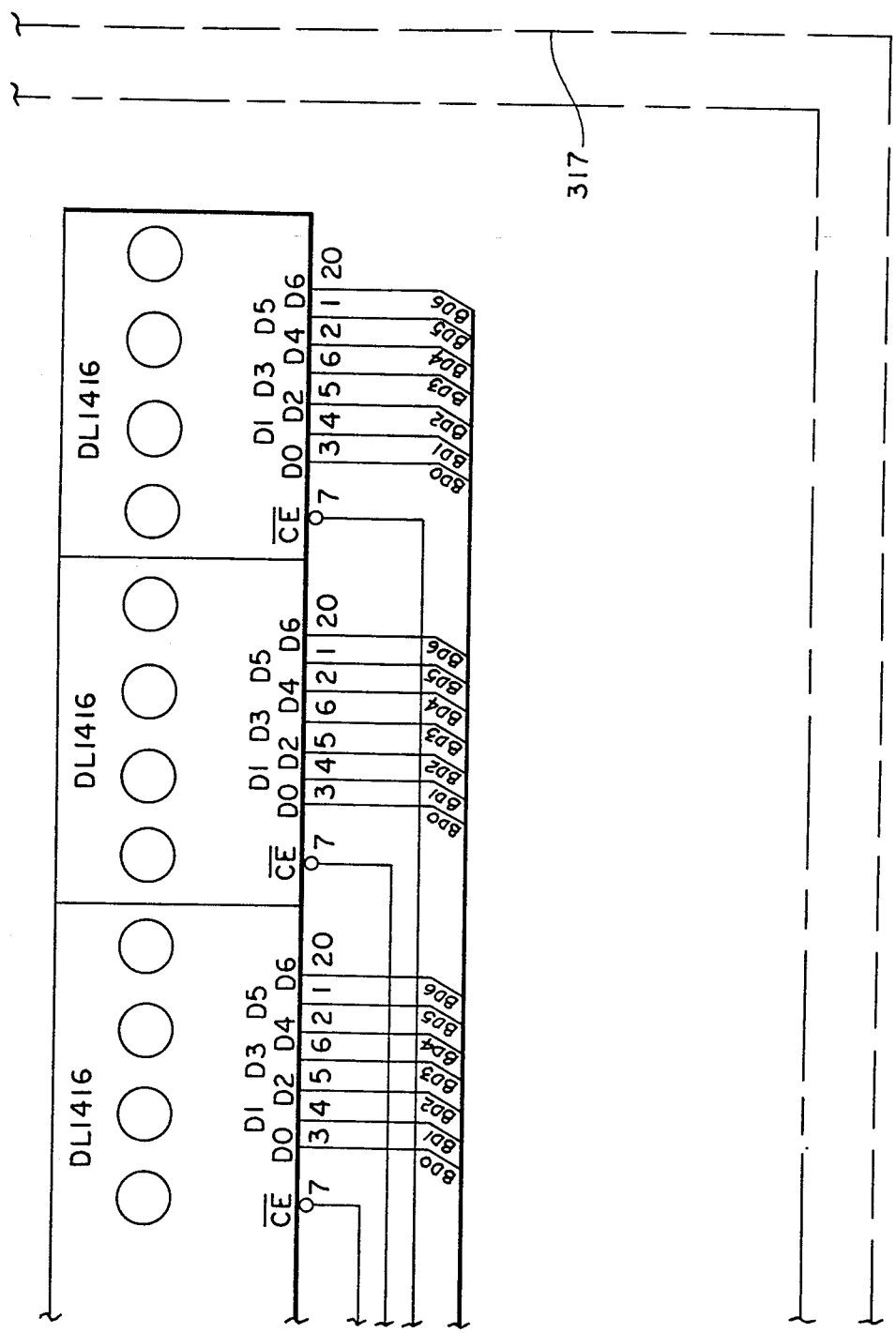
FIG. 15B(2)

HIGH SPEED OPERATIONAL RECURRING SIGNATURE EVALUATOR FOR DIGITAL EQUIPMENT TESTER

BACKGROUND OF THE INVENTION

The invention relates generally to digital computer systems and, more specifically, to improved apparatus for testing such systems or components thereof at their full operational speed.

DESCRIPTION OF THE PRIOR ART

To manufacturers of electronic equipment, the support of that equipment in the field has become costly and complex.

Although more powerful chips have been designed into more sophisticated boards making hardware cheaper to buy and easier to use, board faults have become more difficult to diagnose and more expensive to repair.

One solution to the above problem is to replace the old boards with new boards until the electronic equipment functions properly. With this technique, boards that may be functioning properly are still sent for repairs. Although this will satisfy the customer, a large spare board inventory must be maintained for service engineers at local, district and regional repair facilities with the attendant costs associated therewith.

Another solution to the above problem is to provide a portable automatic field testing device. This allows board testing to be faster, more accurate and more reliable and enables properly functioning boards to be saved from the repair cycle earlier, this also reducing spare board inventory requirements.

A device which performs this function is the 2225 Portable Service Processor (hereinafter identified as a PSP) manufactured by the GenRad Corporation, Concord, Massachusetts. Although that device performs well, there are specific limitations in its utilization. In particular, testing and diagnosing microprocessor based systems has presented a problem to the manufacturers of such systems. The fact that microprocessors are bus oriented systems; that is, the RAM, ROM and I/O circuit modules are all connected to a set of busses driven by the microprocessor makes it more difficult to isolate faults to one particular module. Examining the bus with a device similar to the GenRad 2225 may not help since the data on the bus may be coming from a variety of sources. Also, as more of the logic is incorporated into LSI semiconductor chips, the test points found in digital systems are being minimized. Further, many of the systems should be tested while they operate in a real time environment, a process that most prior art board testers, including the aforementioned PSP, are not capable of performing.

A recent approach has used the concept of signature analysis based on use of a data compression technique to provide a unique fingerprint of each interconnection or test node in the device being tested. Signature analysis converts a serial bit stream into a unique multi-bit stream for a particular test node, the bit stream being started and stopped in a carefully controlled time window. When the signatures are recorded at each node of a correctly operating system, they can be compared to those from a unit under test. A difference in signatures indicates that the node is not operating as expected. If the test windows have been correctly defined, the signatures are totally characteristic of their respective test nodes.

The Gen Rad 2225, as set forth hereinabove, performs satisfactorily for most purposes but is limited to speeds in the range between 2-3 MHz. However, in many test situations wherein a microprocessor is a component of the board under test, it is desired to test the board in real time, i.e. at rates up to 17 MHz. Thus, what is desired, is to enable the range of test devices currently available, including the GenRad 2225, for use at rates which are greater than their normal operating range, thus allowing the testing power of these devices to be applied to a board under test which runs many times faster than the normal operational speed of the test device.

The manner in which the invention advances the art and apparatus for testing such systems, and especially for the testing of individual circuit boards, will be understood as this description proceeds.

SUMMARY OF THE INVENTION

The invention provides unique apparatus for extending the operating capabilities of a test device. The apparatus takes control of a logic (circuit) board under test and executes test routines written for the purpose. A unique serial data pattern from a node under test is generated in real time at a relatively high speed and is presented to the test device (i.e., the aforementioned PSP) in a static state to make it usable to the PSP.

The test device itself includes a data compressor subassembly and an intelligent controller subassembly. The PSP or the controller can be used to configure the apparatus differently for each node being probed in order to provide accurate test results. The data compressor is, actually, a signature generator which operates at the full speed of the board under test, thus the capability of taking real time signatures of either board edge pins or from the standard handheld scopeprobe normally used for the same purpose by the host logic tester (PSP).

It may be said to have been the general objective of the present invention to provide apparatus for extending the operating capabilities of existing logic board testers.

The details of a typical instrumentation according to the invention will be set forth as this description proceeds.

BRIEF DESCRIPTION OF THE DRAWINGS

The invention is described with reference to drawings wherein:

FIGS. 4A and 4B, 5A through 5C, 6A and 6B, 7A and 7B, 8A through 8C, 9A through 9C, and 10A and 10B together comprise detailed schematics for the data compressor of FIG. 2; and FIGS. 11A AND 11B, 12A through 12C, 13A through 13C, 14A through 14C and 15A and 15B together comprise detailed schematics for the controller unit depicted in FIG. 3.

DESCRIPTION OF THE PREFERRED EMBODIMENT

Figure 1:
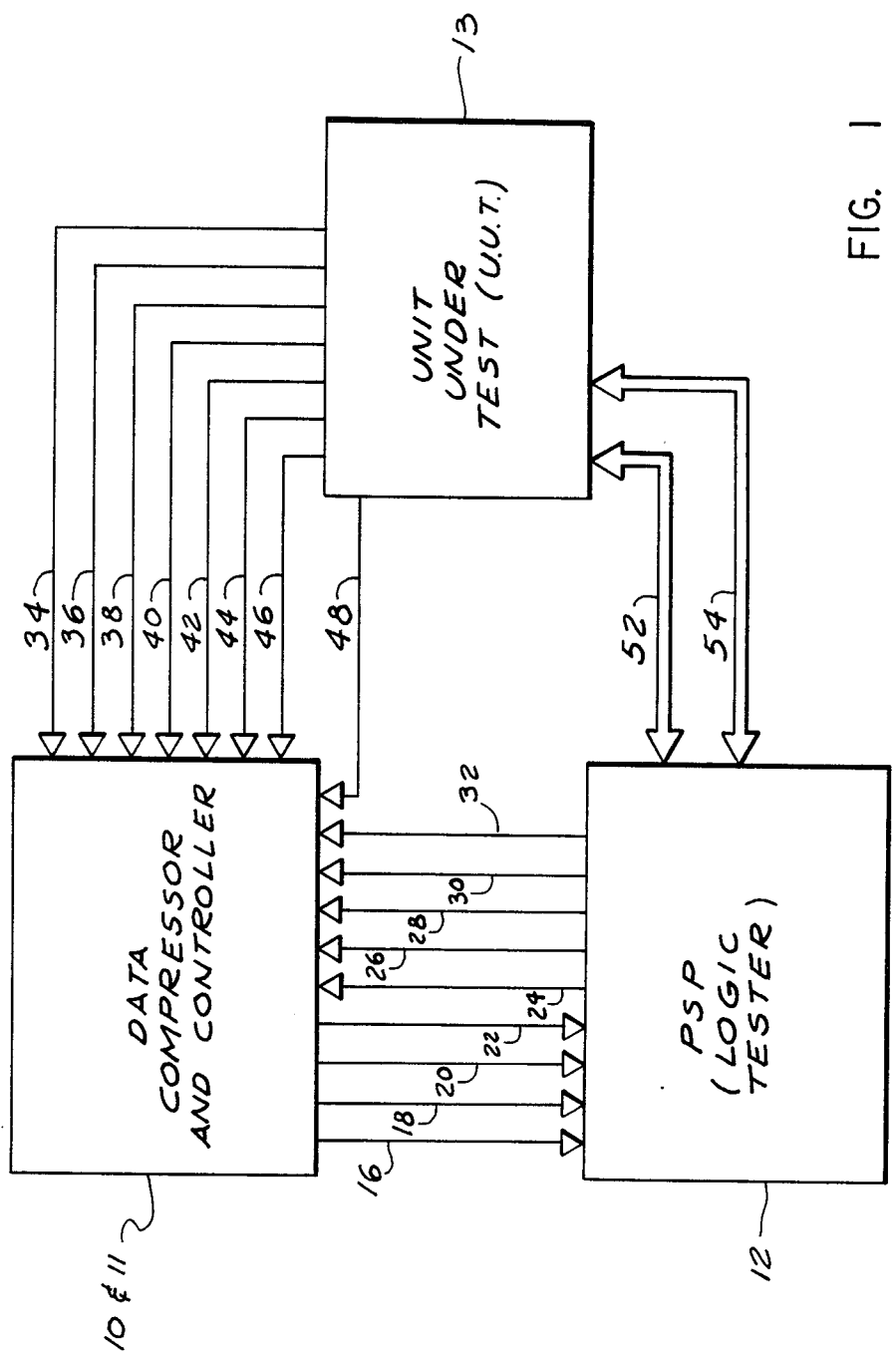
FIG. 1 is a simplified block diagram illustrating the utilization of the apparatus of the invention.

Referring to FIG. 1, a simplified block diagram illustrating the utilization of the present invention is shown. It should be noted that the apparatus of the present invention is shown used with a currently available board tester (PSP), such as the Gen Rad 2225 Portable Service Processor (PSP), manufactured by the Gen Rad Corporation, Concord, Massachusetts, to extend the capabilities thereof or as a "stand alone" device relying on the controller to provide a new test device.

The apparatus of the present invention includes the data compressor 10 and closely associated controller 11. Data compressor 10 and controller 11 are coupled to the test device (PSP) 12, which as set forth hereinabove, can be the Gen Rad 2225 PSP for the purposes of illustration. Data compressor 10 and controller 11, it should be noted, can be adapted for use with other commercial automatic test equipment. The unit under test (UUT), indicated by reference numeral 13, may be a circuit board having a microprocessor incorporated therein although boards not having microprocessors thereon can be similarly tested. The outputs of data compressor 10 are coupled to test device 12 via leads 16, 18, 20 and 22 and the outputs of test device 12 are connected to the inputs of compressor/controller 10 and 11 via leads 24, 26, 28, 30 and 32. Selected outputs from the board unit under test (UUT) 13 on leads 34, 36, 38, 40, 42 and 44 are coupled to data compressor 10 and the output 46 from a handheld probe is coupled to data compressor 10 via lead 48. Direct interconnection between UUT 13 and test device 12 is accomplished via command bus 52 and status bus 54.

At the outset in discussing FIGS. 2 and 3, the inputs and outputs to these units are tabulated as follows:

220—Parallel Cyclic redundancy code (19 bit) at PSP consistent rate.
221—Three clock inputs from the UUT - selectable as required for signature clock.
223—Three start/stop inputs from UUT to be selected.
224—Address bus from UUT.
225—Clock and control from UUT.
226—Start/stop input selectively applied under programmer control.
227—Hand held probe input to data compressor in lieu of direct connection to PSP.
228—Serial bit requests from PSP.
229—Signature generation demand from PSP.
230—For passing instructions between diagnostic ROM 212 and PSP.
318—Serial signature data to PSP probe input.
320—Communication between controller and PSP.
321—Alternate for 320.
322—Data permitting controller to monitor PSP printer.
323—Reserved for measurement instrumentation.
324—Reserved for controller to printer messages/listings on external printer.
325—External keyboard connections to controller for developing test program ROM files.
326—Control lines to drive high-speed data to the board under test.

In essence, data compressor 10 generates a "signature," a unique pattern of bits, for a particular node under test in the UUT 13. The pattern generated is determined by the activity of the selected node on the board under test while test patterns are being executed to stimulate the circuits of interest.

The test device 12 provides information to the test operator as to where the probe 46 is to be placed to obtain a test signature corresponding to the stored signature for the particular node probed.

The data compressor 10 is, in fact, a signature generator which operates externally to the PSP 12 and at the full speed of the board (unit or UUT) under test. Operation of the UUT at its full speed is not only desirable for realistic evaluation, but is usually a necessity in that the microprocessor units of the UUT will not operate at another rate.

The data compressor provides for the taking of real time signatures of either board edge pins or through the standard handheld scopeprobe normally used for the same purpose by the prior art host logic tester (PSP).

Because of the close inter-relationship of the data compressor 10 and the controller 11, these subassemblies will be described together with reference to FIGS. 2 and 3, and these figures are now referred to for a more detailed explanation.

The so-called PSP or logic tester 12 is a relatively static device, in that it is only capable of handling data at a rate far below the typical microprocessor operating rate, the latter being as much as 17 MHz. As indicated above, an important part of the testing of a subassembly (UUT) which may include microprocessors is the ability to operate the unit under test at its design data rate. The so-called PSP in unaided operation is notably a device which presents a programmed code redundently at a relatively low data rate and looked for signatures in various parts of the unit under test in response thereto, where this can be done at the relatively low PSP rate.

With the combination of the present invention, the high speed signatures are generated in the CRC (Cylical Redundency Code) register 215 from which they are available upon the request of the PSP at any rate consistent with and controlled by the PSP. Coming from this CRC register 215, through buffer 216, the data compressor output is presented to the host logic tester (PSP) either as a parallel word at 220 or serially into the tester's "probe" BNC connector at 318. The parallel data is applied to the tester's I/O (input/output) pins from 220 and then tested as pin state data from a board under test. This particular capability allows program flow decisions in the PSP to be made based on test results. Such decisions may include branching to a diagnostic test module for guided probe failure analysis.

The parallel data thus available to the PSP passes from register 215 via a buffer 216. This buffer has the same bit capability as register 215, namely, 19 bits in a typical instrumentation. The serial data supplied to the tester's probe input 318 from register 215 is taken from the parallel data output of buffer 216 at 220 through signal data port 315, onto a controller Z80 bus 319, and from this bus to serial port 308.

The aforementioned serial data supplied to the tester's probe input allows the PSP normal use of its guided probe technique by providing a data stream which the PSP then takes a signature of, just as it normally would if the hand probe were connected directly to it.

A subroutine must be used in the tester's program to facilitate serially shifting the signature word out of the data compressor under control of the PSP. That subroutine includes a test for each serial bit to drive the signature taking internally in the tester.

Several selectable inputs are available to control the beginning and ending of signature taking. These signals are selected by the controller 11 addressing the start/stop MUX (start/stop multiplexer) 202 via its control bus 219.

By using different signals of those available at input 221 (from the UUT), the signature window can be synchronized to various parts of the board under test.

The divide-by-sixteen 204 functions to provide a window of expanded duration so that signature taking is spread over a number of start/stop cycles as seen at 226.

Two data paths are provided for signature taking, this allowing a look at a single board edge pin or the hand-held probe. Again, the data path is selected by the controller 11 applying the appropriate address to the CRC (Cyclic Redundancy Code) data MUX (multiplexer) 203 via the controller output bus 219 and 219a. An additional input to this multiplexer 203 at 219a provides both data and address and is used to mask or blank some of the CRC data. A signature may be taken of this blanking to verify it before using it as a control input simply by instructing the controller to select the blanking data as data input via the CRC data MUX 203.

Three clock inputs plus their complements present at input 221 and are selected by the CRC clock MUX 207 to provide the appropriate clock for the CRC register 215. The controller 11 selects one of these six clock signals available from the UUT at input 221 by controlling the address presented to CRC clock MUX 207 via the controller bus 219. The purpose of the complement clock signals is to allow taking signatures not only on a first clock signal phase but also on the opposite phase, thereby precluding the omission of events which occur strictly during a particular phase or transition of the clock.

The controller can direct the data compressor to begin a signature at a specified address and either stop at the second occurrence of the same address or stop at a different address. To do this, a 16 bit word is stored in registers 213 and 214 which is connected to the control bus 219. Addresses identified in these blocks 213 and 214 are supplied to comparator 201 where comparison with corresponding addresses extant on the 16 bit system bus 224 is effected. An output from the comparator 201 is then supplied to the start/stop MUX 202, which can select this data to start and/or stop signature taking. From the start/stop MUX 202 both the processor data clock generator 210 and the start/stop/clock synchronization circuit 208 receive the selected clock which is then passed on to the CRC register 215 via a clock-data phase correction circuit 209. The circuit 209 compensates for phase changes relative to the clock signal as different nodes are probed on the board under test. This circuit 209 also prevents data transitions from occurring at the same time as the selected clock transitions which otherwise would give unstable or inconsistent signatures. The occurrence of an output from the comparator 201 can be read by controller 11 and communicated to the PSP via port 302 or 303. This gives the tester the ability to follow key points in the program execution of the board under test to aid in diagnosing faults around the processor.

Figure 3:
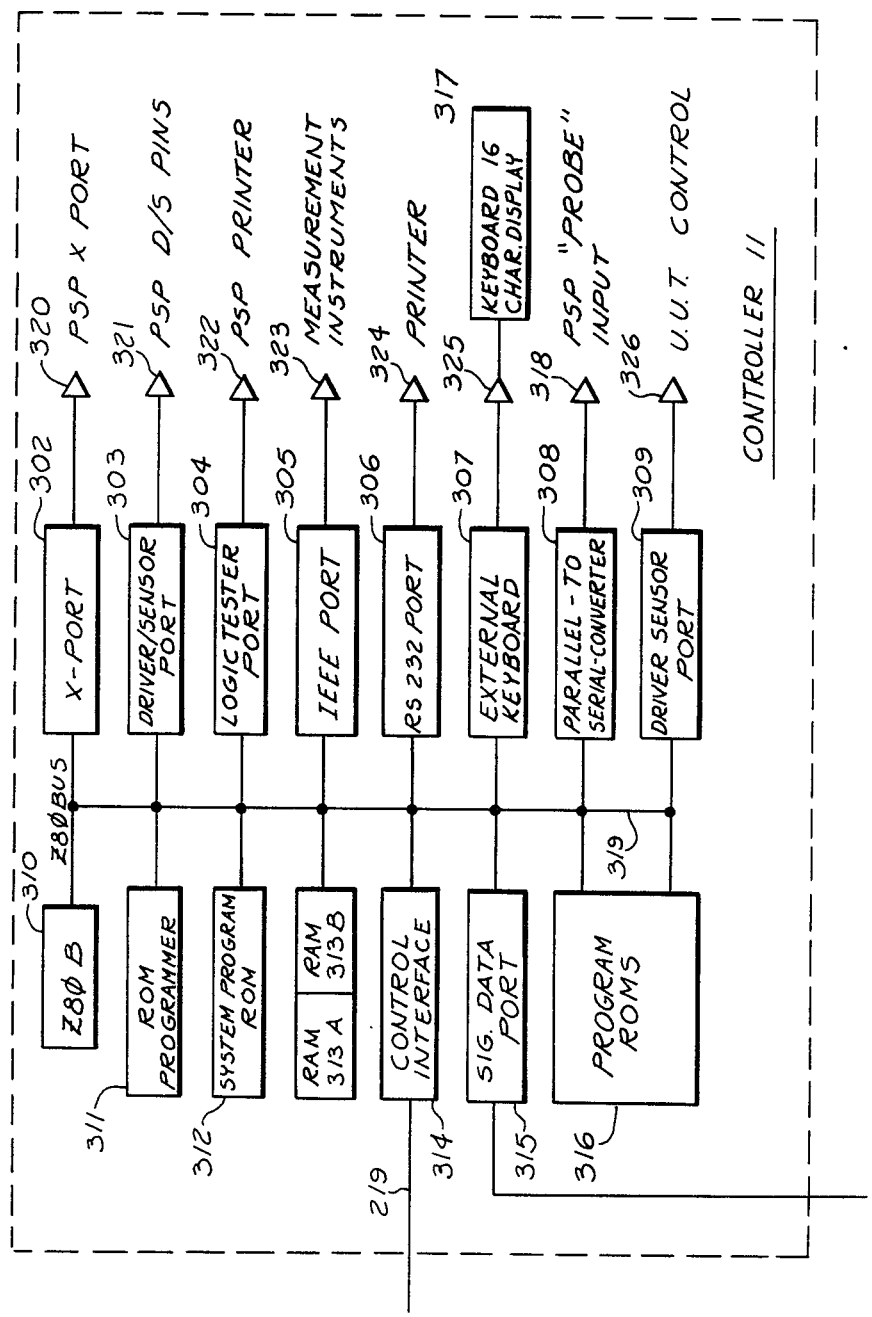
FIG. 3 is a structural and functional block diagram for the controller associated with the data compressor in the combination of the invention.

The intelligent controller 11 which is depicted in FIG. 3 as an integral part of the system according to the invention is a Z80 based microprocessor system. A read only memory 312 serves to provide the desired operating program and has a mapped capacity of 16K bytes. A random access memory 313B contains 16K bytes of test development memory, and 1K of scratch pad RAM, 313A, is provided for use by the processor under test. Six selectable and predeterminable test programs are provided by ROM socket pairs providing 16K of memory for each test program. This portion of the circuitry is represented at 316. The data stored in these ROMs supplies setup instructions which direct the controller 11 to properly configure the data compressor 10 during guided probe fault isolation.

Various ports for communication and control are provided, these having been identified by numeral hereinabove.

The major functions of the intelligent controller includes configuring the data compressor by node, interpreting instruction codes provided by the PSP, the monitoring of ports for data inputs (as from the PSP printer, the PSP D/S pins and the so-called X-port 302). The intelligent controller 11 can execute special tasks such as discarding inconsistent signatures, evaluating signatures taken against expected results and communicating interactively with the PSP during guided probe operation. Programming capability for test program ROM generation is provided, this programming being effected manually through the keyboard and display 317 through the external keyboard port 307 connected at 325. An auto-learn mode is provided to assist the test programmer in developing test program ROMs.

Provision for expansion and future extension of the capabilities include support of an IEEE/RS-232 represented at 305, connectable to measuring instruments at 323. The intelligent controller 11 along with the data compressor 10 will be understood to be capable of stand alone signature generation and testing without the PSP connection. LED's which are part of the 19 bit buffer 216 provide signature data to be read by the test operator. In stand alone operation the keyboard-display 317 would be connected to controller 11 and display signature data plus providing operator control inputs to direct testing. Stimulus to the board under test is provided both by the diagnostic ROM 212 and by driver/sensor port 309.

The intelligent controller 11 is a Z80 based microprocessor system as aforementioned and is designed to control the operation of the data compressor. With the intelligent control provided, the data compressor 10 becomes easier to use by the test programmer in that it handles repetitious detail and complex control requirements.

The controller employs a system program in ROM 312 to interpret operating instructions passed to it through various I/O ports. This ROM also contains the port scan routines and the auto-learn routine.

In a practical arrangement according to the invention, multiple test program ROM sockets are provided to allow having the capability of testing a number of different boards on the host logic tester (PSP) without physically replacing the ROMs. Accordingly, ROM 316 may be thought of as any of six pairs of ROM selected as required. These ROMs contain the information specific to each test program in "look-up" table form. The controller is capable of reading the 19 bit signature generated by the data compressor for the purpose of checking several signatures for agreement, thereby preventing the sending of inconsistent data to the logic tester (PSP). Comparison to a list of acceptable signatures may also be done when required. (Three ports between the logic tester and the controller will handle the communication between the two. These are the X-port 302 [terminal 320], the PSP I/O pin port [D/S port 303, terminal 321], and the printer port 304 [terminal 322]. Ports 302 and 303 are bi-directional, the PSP printer port 304 is not.

Figure 2:
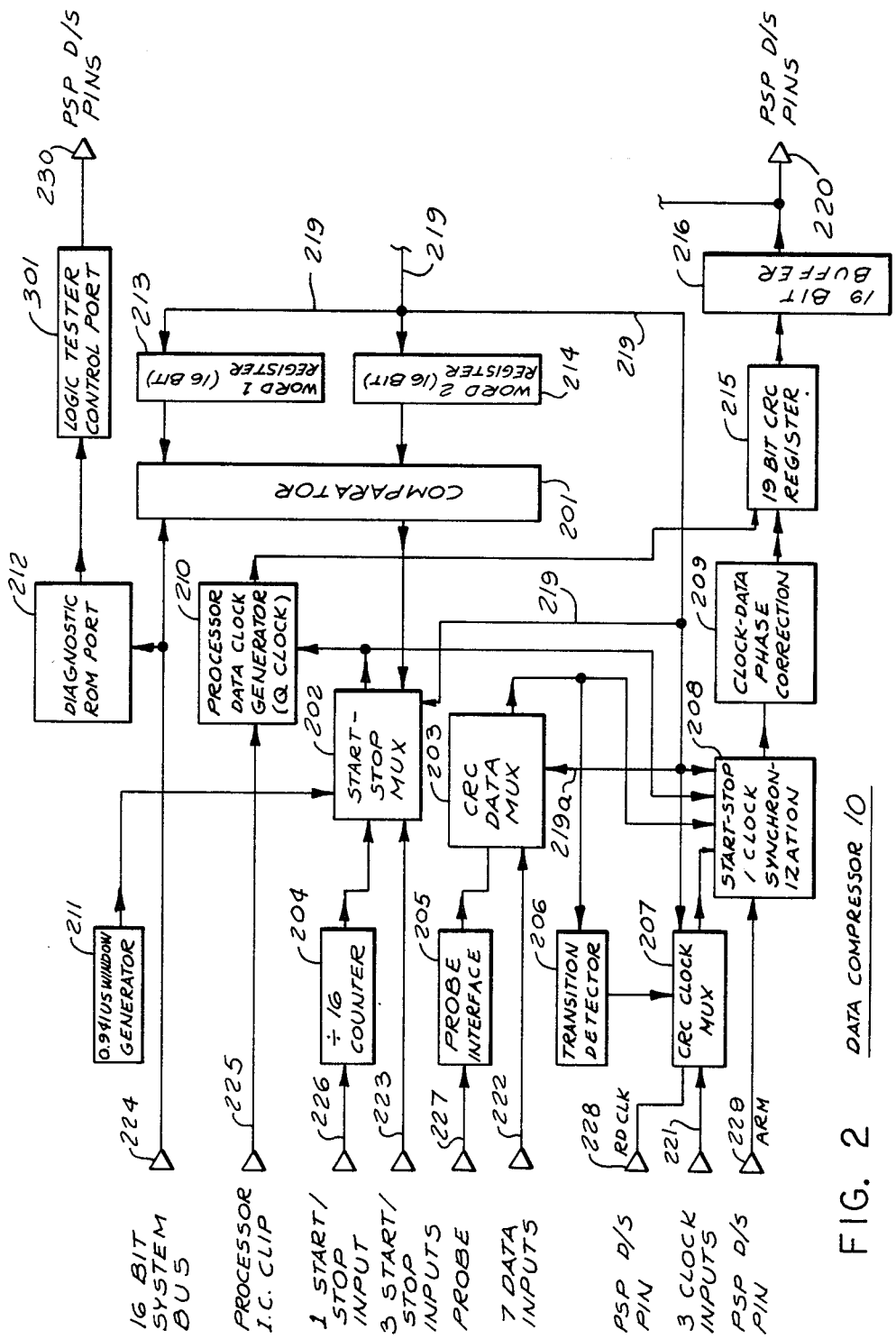
FIG. 2 is a detailed structural and functional block diagram for the data compressor according to the invention.

Three basic ports to the data compressor from the intelligent controller are provided and are identifiable between FIGS. 2 and 3. These are a port through line 219 through control interface block 314, the feedback from terminal 220 at the output of 19 bit buffer 216 to the signal data port 315, and the third is represented by the connections to registers 213 and 214, also through control interface block 314, to set up these address registers for the address comparator 201.

A part of the controller/data compressor combination is a driver/sensor port which may be referred to as a C-bus port 212 used to control the UUT microprocessor from terminal 224. This port provides test program routines from the diagnostic ROM 212, a scratch pad RAM and a bi-directional port 301 permitting the tester control of what diagnostic routine will be executed. In this way diagnostic routines for the processor of the board under test may be executed under control of the test program resident in the PSP. The scratch pad RAM is provided for use as a stack register in case the one on the board under test is defective.

As a planned future capability, a standard IEEE port 305 (terminal 323) permits the controller to communicate with other test equipment similarly equipped. Such test instruments include oscilloscopes, digitizers, logic analyzers, etc., which are provided with an IEEE port. A commercially available logic tester known as the Hewlett-Packard 3060A can thus interface with the data compressor/controller circuits. The aforementioned Hewlett-Packard tester would employ the basic signature taking and real-time control capabilities of the data compressor/controller to accomplish high speed testing of digital circuits.

The remote keyboard and character display 317 provides access to the controller primarily for creating the test program ROM files in 316. These files which are temporarily stored in RAM 313 are programmed into an EPROM by the ROM programmer 311 when program development is complete. The remote keyboard 317 includes a numeric key pad (0-9) plus three function keys and two cursor control keys. A 16 character alphanumeric LED display above the keyboard provides the programmer a means to view data from the controller.

The aforementioned keyboard 317 is only plugged into the controller during entering or development of a test program ROM file. When the keyboard is not connected, the controller expects to receive operating instructions only from the logic tester (PSP), a different major subroutine in the system program ROM 312 being executed when the keyboard is not used. Operation with the host logic tester (PSP) in a developed program does not involve use of the remote keyboard 317 when executing test routines on the UUT. The keyboard 317 is properly called a "computer access remote terminal."

The only other display associated with the equipment according to the invention, in addition to the 16 characters displayed on the keyboard and character display 317, is provided by LED's located on the data compressor section. These are provided and will be noted on FIGS. 4, 5, 7, and 8 following. These LED's are not for the information of the user but rather they are useful for visually noting circuit conditions when developing a new test program.

A ROM programming socket is provided to allow storage of test program data without the need of any additional equipment. ROMs are programmed from the data file resident in the controller RAM. An LED adjacent to the programming socket is used to indicate that power is applied when programming is underway. This LED is also indicative of failure to locate the correct test program ROM when logic board testing is being done. For example, a test program is loaded into the host logic tester (PSP), the controller reads the program name and searches the ROMs it has available for a match; if a match is not found, the LED lights to flag the test operator that testing cannot proceed. See FIG. 14 in that connection.

Following is an operational discussion of the controller (FIG. 3) major functions.

The primary function of the Z80 based controller (FIG. 3) is to handle the task of configuring the data compressor for each node which will be probed when the host logic tester (PSP) is in guided probe mode. Data to the logic tester printer is the source for letting the controller know what node the tester will probe next. When a node name is printed, the controller looks in the test program ROM 316 for instructions stored under that name. The instructions tell the controller how to set up the data compressor and how to handle the signature data after it is taken. The signature may be transferred to the host logic tester serially from port 308 (terminal 318) or as a parallel 19 bit word from 220. The signature may be altered or replaced, depending on instructions to evaluate the signature originally taken, to tailor it to be what the host logic tester expects to receive. Special operations such as repeatedly retaking a signature a certain number of times and then checking for the occurrence of one or more predicted signatures can be done. In this case the number of occurrences of one of the predicted signatures may be specified by the data under the node name in the test program ROM 316.

The controller reads the program name when a program is loaded into the host logic tester (PSP) allowing it to search the test program ROMs to locate the right one. If the matching ROM is not present, the test operator is informed of this. If it is located, it is selected. When the logic tester loads an image file, the controller reads the name and selects the proper data table within the selected ROM. The selected data tables contain the setup information for each node to be probed on the board to be tested.

The controller can receive instruction codes from any one of the three ports 302, 303 or 304 to the host logic tester. These codes direct it to perform data compressor setups which require multiple operations. In normal testing guided probe operation, the controller 11 reads data sent to the host tester's printer, goes to the look-up table in the test program ROM 316 and sets up the data compressor properly. By providing this capability, the test programmer is relieved of the task of manually providing the command bit sequences to the data compressor and thereby also consuming a considerable amount of user memory in the host logic tester. An important feature is the ability for the controller to configure the data compressor differently for each node being probed by the host tester as well as to make evaluations of nodal signature data before the tester sees it. This capability makes this invention largely transparent to the tester which need not do anything special at this point to use it. This type of operation is required when a test programmer is developing a new test program and the test program ROM files, as well as during normal testing of logic boards.

The instruction code interpreter will reside in the system program ROM 312 which is universal for all applications and does not change from one test program to another.

Another of the functions of the controller is to scan the I/O ports for data communications. Interpreting the data from the logic tester (PSP) informing the controller of a specific node being probed will be the most important task when this unit is in diagnostic use. Other data ports will be supported as need arises for their use. The monitor routines will reside in the system program ROM 312 and be universal for various test programs.

For the basic operation, a number of subroutines are provided to handle as much of the repetitive operations as is practical. Tasks such as controlling serial shifting of a signature out to the host logic tester (PSP) are implemented to make this as simple as possible for the test programmer. Another basic routine is to take a number of signatures, check for a certain number of compares and then make this signature available to the logic tester. Control parameters for the max. number taken and the required min. number of compares are provided from the logic tester to make this a flexible subroutine.

For instances where there is more than one acceptable signature, a list is stored in the test program ROM 316. The cdntroller checks the signature list for each node. If the signature developed from probing a node matches one in the signature list, the first signature of the list is sent to the logic tester. If no match is found, the last signature developed from a node is sent to the logic tester (PSP).

Other standard subroutines based on requirements discovered during use may be installed in the system program ROM and maybe universal to all test programs.

The controller plays a major role aiding the test programmer when he is developing test program ROM (316) files. By using the external keyboard and display 317, the programmer accesses one of several routines which provide him with the capability to build temporary program files in RAM memory (313). The program files may be executed and edited until satisfactory. Completed files are programmed into ROM by the ROM programmer 311 for permanent storage.

The first routine to be used by the test programmer is to determine the data compressor operating modes which do not produce inconsistent, "stuck high" or "stuck low" signatures. This would be used when a signature is to be taken and checked by a logic tester pinstate test. The routine aids the programmer by reporting back to him the results of trial setup codes which could be used for a certain node. The programmer can then choose from the usable codes for inclusion in his program.

The second routine would be used when the logic tester is learning a new image. The word "IMAGE" used herein means the logic element interconnection description of the board under test. The controller detects the name of the image when it is chained in and uses the code as the header for the data file being built. Next (when the PSP is a GR 2225 logic tester) the ASIG, L to the 2225 printer notifies the controller to begin the learn routine unless it has received an abort code first. This routine builds the look-up tables with data compressor setup instructions and expected results for each node which will be in the image.

The host logic tester program would have two conditional branch statements just ahead of the ESIG statement at the end of the test module, testing two I/O pins connected to the controller, one can execute a "GOTO" back to the start of the test module, the other can execute a halt, or allow the logic tester program to continue. This givas the controller the capability to control the execution of the test program. Now the controller under the direction of the test programmer can use the first routine, or a modified version of it, to run through all of the data compressor configuration codes to determine the best usable ones. In the case of some signatures being occasionally inconsistent, the controller will prioritize the signatures with the least inconsistent first. Signature results are displayed on the remote keyboard 317.

After repeatedly executing the test program, the test programmer selects the best configuration code and directs the controller to store it in the data file with the node name. The controller then allows the test program to continue using the selected configuration code.

The foregoing process is repeated until the image is completed, then the controller marks the end of file on the just generated data stored in RAM 313. At this point the programmer can program a ROM in the ROM programmer 311 with the contents of the file to create a test program ROM for the board under test. After completion the ROM can be moved to one of the test program ROM sockets and executed to verify correct operation or to test boards when all program development is complete.

For future use and inherent flexibility, two ports, IEEE 305 and RS-232 306, will be available for future use. A possible use for the IEEE port is with another host tester, the Hewlett—Packard 3060A, for example, to provide the capabilities of the apparatus of the invention to that tester. Supporting software must be generated at such time as this port is actually used.

The so-called RS232 port 306 has two foreseeable uses—to drive a printer when this invention is used as a stand alone signature generator and to communicate with other computer systems for the purpose of developing controller software. Again, supporting software must be developed when the need for this use arises.

As a stand alone test device (without the PSP), the controller provides the capability for the data compressor to be used independently from a host logic tester. In this mode, the controller would accept input from the external keyboard, or possibly a standard terminal connected to the RS-232 port, to operate the data compressor. With this capability, signatures could be taken on a complete running UUT and manually compared with signatures written on a schematic which were taken on a known good board. Fault diagnostics could be done in a test bed environment with a minimum of test equipment and no special test program being written.

A program for stand alone operation would reside in a special system program ROM and not the standard ROM currently used with logic tester operation.

FIGS. 4A AND 4B, 5A through 5C, 6A and 6B, 7A and 7B, 8A through 8C, 9A through 9C, and 10A and 10B together depict typical circuitry for the data compressor in substantially complete detail. These figures are largely self-explanatory to a person of skill in this art.

FIG. 4A and 4B depict elements 202, 207, 204, 208 and 211 as depicted in block form on FIG. 2.

Figure 5A:
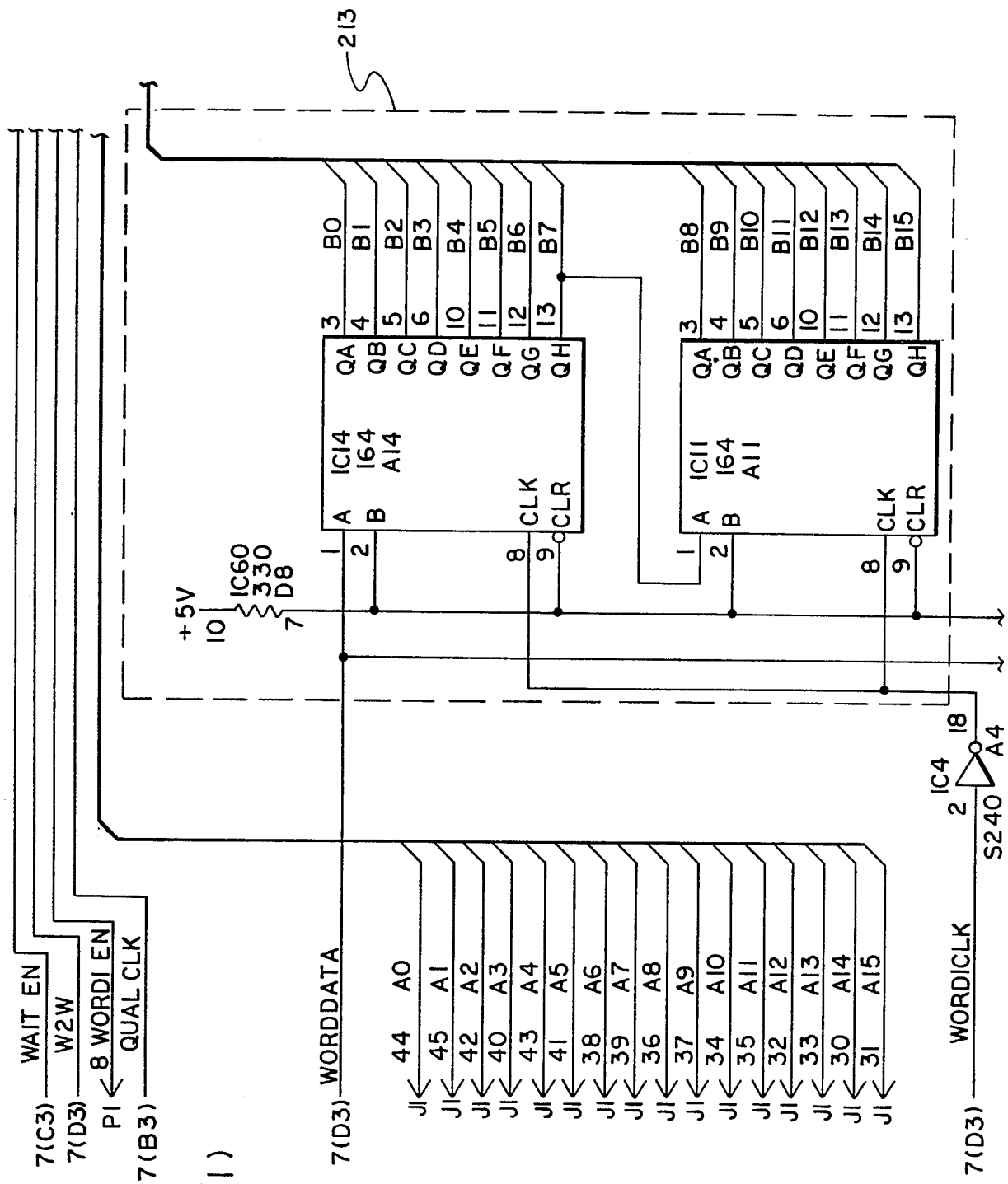

FIG. 5A through 5C depict those portions of FIG. 2 including blocks 201, 213, 214 and the bus connections 219.

Figure 6B:
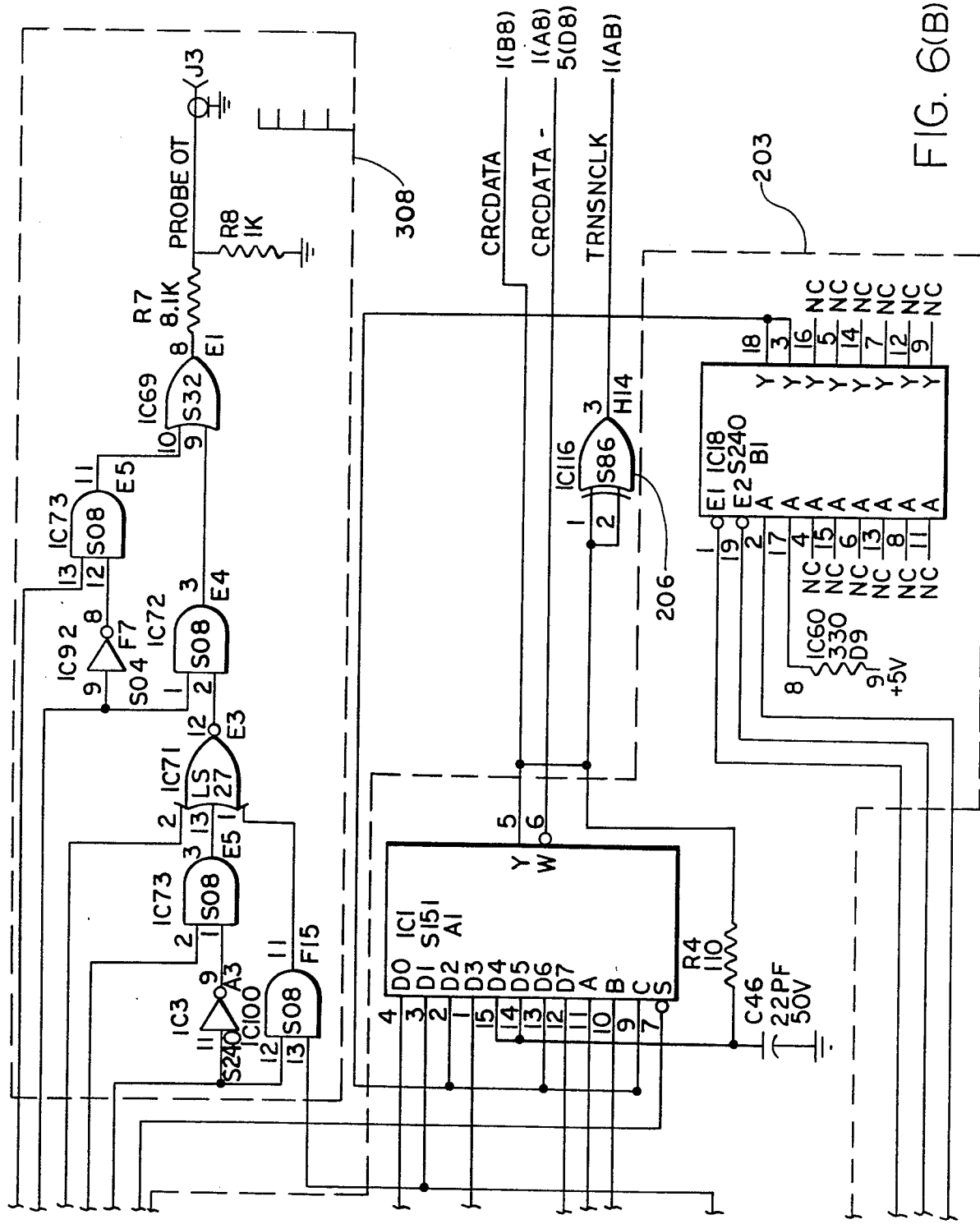

FIGS. 6A and 6B show typical digital circuitry for box 203, 205 and 206 of FIG. 2 and portions of the intelligent controller of FIG. 3 represented by block 308.

FIGS. 7A and 7B together depict block 209 of FIG. 2.

FIGS. 8A through 8C depict detailed circuits for blocks 215 and 216 of FIG. 2.

FIGS. 9A through 9C show typical digital circuits for blocks 212 of FIG. 2 and 301 of FIG. 3.

FIGS. 10A and 10B show circuitry suitable for block 210 of FIG. 2 and block 302 of FIG. 3

FIGS. 11A and 11B depict circuits of FIG. 3 for blocks 307, 310 and 312 along with associated circuitry.

FIGS. 12A through 12C show typical detailed circuitry for blocks 303, 304, 314 and 315.

In FIGS. 13A through 13C, blocks 302, 313A and 316 are depicted in detailed circuit form.

In FIGS. 14A through 14C, blocks 308, 311 and 313B of FIG. 3 are depicted from the corresponding blocks on FIG. 3.

In FIGS. 15A and 15B, the programming station comprising 317 from FIG. 3 is shown in detailed circuit form.

The detailed circuits presented herewith are in a form readily understandable to those of skill in the digital circuit arts.

Certain modifications and variations within the spirit of the invention will suggest themselves to those of skill in this art and, accordingly, it is not intended that the scope of the invention should be limited to the drawings of this description, these being intended to be typical and illustrative only.

What is claimed is:

1. A test apparatus for enabling a relatively low speed test device to test the operation of a relatively high speed digital circuit at the full operating clock rate thereof, said test apparatus comprising:
(a) signature generating means for generating an actual digital signature from data received from a predetermined point within the digital circuit,
(b) clock control means connected to the digital circuit for clocking the signature generating means at rate consistent with said full operating clock rate,
(c) memory means for storing expected digital signature for a plurality of points within the digital circuit,
(d) control means for receiving digital data indicative of the identity of said predetermined point from the test device, for evaluating the actual digital signature for that point in relation to the expected digital signature for that point, and for communicating the result of that evaluation to the test device,
(e) means for connecting the signature generating means and clock control means to the digital circuit, and
(f) means for connecting the control means to the test device.

2. The apparatus of claim 1 in which the clock control means comprises a clock multiplexer responsive to the control means for selecting a clock signal having a frequency and phase that is compatible with the detection of fault conditions at said predetermined point.

3. The apparatus of claim 1 further including start/stop synchronizing means responsive to the control means for assuring that the signal generating means starts and stops its signature generating activity at times that are compatible with the detection of fault conditions at said predetermined point.

4. Tht apparatus of claim 3 including at least one address register responsive to the control means for storing the digital circuit addresses which define the desired beginning and ending of the signature taking process, and comparing means connected to said register for signalling the occurrence of said digital circuit addresses to the synchronizing means.

5. The apparatus of claim 3 further including clock data phase correction means for compensating for those changes in the phase angle between the clocking and data signals applied to the signature generating means which result from changes in said predetermined point during the performance of a sequence of tests.

6. The apparatus of claim 5 in which the phase correction means comprises phase delay means responsive to the control means for introducing a selected one of a plurality of predetermined phase delays.

7. The apparatus of claim 1 further including clock-data phase correction means for compensating for those changes in the phase angle between the clocking and data signals applied to the signature generating means which result from changes in said predetermined point during the performance of a sequence of tests.

8. The apparatus of claim 7 in which the phase correction means comprises phase delay means responsive to the control means for introducing a selected one of a plurality of phase delays.

9. The apparatus of claim 1 in which the digital circuit includes a program ROM and a microcomputer for executing a program stored therein, and in which the test apparatus includes a diagnostic ROM, containing diagnostic programs, for substitution for said program ROM under the control of the control means, to cause said microcomputer to excute said diagnostic programs.

10. A test apparatus for enabling a relatively low speed test device to test the operation of a relatively high speed digital circuit at the full operating clock rate thereof, said test apparatus comprising:
(a) signature generating means for generating an actual digital signature from data received from a predetermined point within the digital circuit,
(b) clock control means connected to the digital circuit for clocking the signature generating means at a rate consistent with said full operating clock rate,
(c) control means for receiving digital data indicative of the identity of said predetermined point from the test device, and for communicating the actual digital signature for said point to the test device at rate consistent with the operating rate of the test device,
(d) means for connecting the signature generating means and the clock control means to the digital circuit, and
(e) means for connecting the control means to the test device.

11. The apparatus of claim 10 in which the clock control means comprises a clock multiplexer responsive to the control means for selecting a clock signal having a frequency and phase that is compatible with the detection of fault conditions at said predetermined point.

12. The apparatus of claim 10 further including start/stop synchronizing means responsive to the control means for assuring that the signature generating means starts and stops its signature generating activity at times that are compatible with the detection of fault conditions at said predetermined point.

13. The apparatus of claim 12 including at least one address register responsive to the control means for storing the digital circuit addresses which define the desired beginning and ending of the signature taking process, and comparing means connected to said register for signalling the occurrence of said addresses to said synchronizing means.

14. The apparatus of claim 12 further including clock-data phase correction means for compensating for those changes in the phase angle between the clocking and data signals applied to the signature generating means which result from changes in said predetermined point during the performance of a sequence of tests.

15. The apparatus of claim 14 in which the phase correction means comprises phase delay means responsive to the control means for introducing a selected one of a plurality of predetermined phase delays.

16. The apparatus of claim 10 further including clock-data phase correction means for compensating for those changes in the phase angle between the clocking and data signals applied to the signature generating means which result from changes in said predetermined point during the performance of a sequence of tests.

17. The apparatus of claim 16 in which the phase correction means comprises phase delay means responsive to the control means for introducing a selected one of a plurality of predetermined phase delays.

18. The appatus of claim 10 in which the digital circuit includes a program ROM and a microcomputer for executing a program stored therein, and in which the test apparatus includes a diagnostic ROM, containing diagnostic programs, for substitution for said program ROM under the control of the control means, to cause the microcomputer to execute said diagnostic programs.

19. A test apparatus for testing the operation of a digital circuit at the full operating clock rate thereof, said test apparatus comprising:

(a) signature generating means for generating actual digital signatures from data signals received from predetermined points within the digital circuit, (b) clock control means connected to the digital circuit for deriving therefrom and applying to the signature generating means a clock signal having a frequency compatible with the signature then being taken, (c) memory means for storing expected digital signatures for a plurality of points within the digital circuit, (d) programmable control means for causing the signature generating means to generate signatures for a series of predetermined points within the digital circuit and for evaluating the actual digital signatures for said points in relation to the expected digital signatures for said points, (e) a display for presenting the result of said evaluations to an operator, (f) start/stop synchronizing means responsive to the control means for causing the signature generating means to start and stop the taking of each signature under conditions which are compatible with that signature, and (g) clock-data phase correction means connected to the signature generating means for compensating for those changes in the phase angle between the clock signals and the data signals which occur as the programmable control means advances through said series.

20. The apparatus of claim 19 in which the phase correction means comprises phase delay means responsive to the control means for introducing a selected one of a plurality of predetermined phase delays.

21. The apparatus of claim 19 in which the clock control means comprises a clock multiplexer responsive to the programmable control means for selecting for use as said clock signal a signal produced by the digital circuit which has a frequency and phase compatible with the signature to be taken.

22. The apparatus of claim 19 in which the digital circuit includes a program ROM and a microcomputer for executing a program stored therein, and in which the test apparatus includes a diagnostic ROM, containing diagnostic programs, for substitution for the program ROM, under the control of the programmable control means to cause the microcomputer to execute said diagnostic programs.

* * * * *